(12) United States Patent
Ogata

(10) Patent No.: US 10,446,569 B2
(45) Date of Patent: Oct. 15, 2019

(54) SEMICONDUCTOR DEVICE AND MANUFACTURING METHOD THEREOF

(71) Applicant: Renesas Electronics Corporation, Tokyo (JP)

(72) Inventor: Tamotsu Ogata, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 15/582,923

(22) Filed: May 1, 2017

(65) Prior Publication Data

US 2017/0352676 A1 Dec. 7, 2017

(30) Foreign Application Priority Data

Jun. 6, 2016 (JP) ................. 2016-112601

(51) Int. Cl.
*H01L 21/28* (2006.01)
*H01L 27/115* (2017.01)
(Continued)

(52) U.S. Cl.
CPC ...... *H01L 27/11568* (2013.01); *H01L 21/265* (2013.01); *H01L 21/28282* (2013.01);
(Continued)

(58) Field of Classification Search
CPC .......... H01L 27/11568; H01L 29/7923; H01L 29/66833; H01L 29/42328;
(Continued)

(56) References Cited

U.S. PATENT DOCUMENTS 5,402,374 A * 3/1995 Tsuruta ................. G11C 16/16
257/316
6,323,086 B2 * 11/2001 Hsu ................... H01L 21/28273
257/E21.209
(Continued)

FOREIGN PATENT DOCUMENTS

JP 2007-281091 A 10/2007
JP 2009-124106 A 6/2009
JP 2014-75557 A 4/2014

*Primary Examiner* — Mary A Wilczewski
*Assistant Examiner* — Tsz K Chiu
(74) *Attorney, Agent, or Firm* — McDermott Will & Emery LLP

(57) ABSTRACT

An improvement is achieved in the performance of a semiconductor device having a nonvolatile memory. A first memory cell includes a first control gate electrode and a first memory gate electrode which are formed over a semiconductor substrate to be adjacent to each other. A second memory cell includes a second control gate electrode and a second memory gate electrode which are formed over the semiconductor substrate to be adjacent to each other. A width of a sidewall spacer formed on a side of the second memory gate electrode opposite to a side thereof where the second memory gate electrode is adjacent to the second control gate electrode is smaller than a width of another sidewall spacer formed on a side of the first memory gate electrode opposite to a side thereof where the first memory gate electrode is adjacent to the first control gate electrode. A threshold voltage of a first memory transistor including the first memory gate electrode in a neutral state is different a threshold voltage of a second memory transistor including the second memory gate electrode in the neutral state.

13 Claims, 43 Drawing Sheets

(51) Int. Cl.
  *H01L 27/11568* (2017.01)
  *H01L 21/265* (2006.01)
  *H01L 29/66* (2006.01)
  *H01L 29/78* (2006.01)
  *H01L 29/792* (2006.01)
  *H01L 29/423* (2006.01)
  *H01L 27/11517* (2017.01)
  *H01L 27/11524* (2017.01)
  *H01L 29/788* (2006.01)

(52) U.S. Cl.
  CPC .. *H01L 29/42344* (2013.01); *H01L 29/66545* (2013.01); *H01L 29/66833* (2013.01); *H01L 29/7831* (2013.01); *H01L 29/792* (2013.01); *H01L 29/7923* (2013.01); *H01L 27/11517* (2013.01); *H01L 27/11524* (2013.01); *H01L 29/42324* (2013.01); *H01L 29/42328* (2013.01); *H01L 29/788* (2013.01)

(58) Field of Classification Search
  CPC ............. H01L 29/42324; H01L 29/788; H01L 27/11524; H01L 27/11517
  See application file for complete search history.

(56) References Cited

U.S. PATENT DOCUMENTS

| | | | |
|---|---|---|---|
| 6,724,029 B2* | 4/2004 | Hsu | H01L 27/115 257/239 |
| 7,745,288 B2 | 6/2010 | Toba et al. | |
| 8,906,769 B2 | 12/2014 | Maekawa et al. | |
| 9,171,727 B2* | 10/2015 | Nishikizawa | H01L 21/28008 |
| 9,349,743 B2* | 5/2016 | Nakanishi | H01L 27/11573 |
| 2011/0272753 A1* | 11/2011 | Funayama | H01L 27/11565 257/299 |
| 2014/0242767 A1* | 8/2014 | Nishikizawa | H01L 21/28008 438/275 |

* cited by examiner

FIG. 8

| | OPERATION METHOD WRITE/ERASE | WRITE OPERATION VOLTAGE (V) Vmg/Vs/Vcg/Vd/Vb | ERASE OPERATION VOLTAGE (V) Vmg/Vs/Vcg/Vd/Vb | READ OPERATION VOLTAGE (V) Vmg/Vs/Vcg/Vd/Vb |
|---|---|---|---|---|
| A | SSI (WRITE)/BTBT (ERASE) | 10/5/1/0.5/0 | −6/6/0/open/0 | 0/0/1.5/1.5/0 |
| B | SSI (WRITE)/FN (ERASE) | 10/5/1/0.5/0 | 12/0/0/0/0 | 0/0/1.5/1.5/0 |
| C | FN (WRITE)/BTBT (ERASE) | −12/0/0/0/0 | −6/6/0/open/0 | 0/0/1.5/1.5/0 |
| D | FN (WRITE)/FN (ERASE) | −12/0/0/0/0 | 12/0/0/0/0 | 0/0/1.5/1.5/0 |

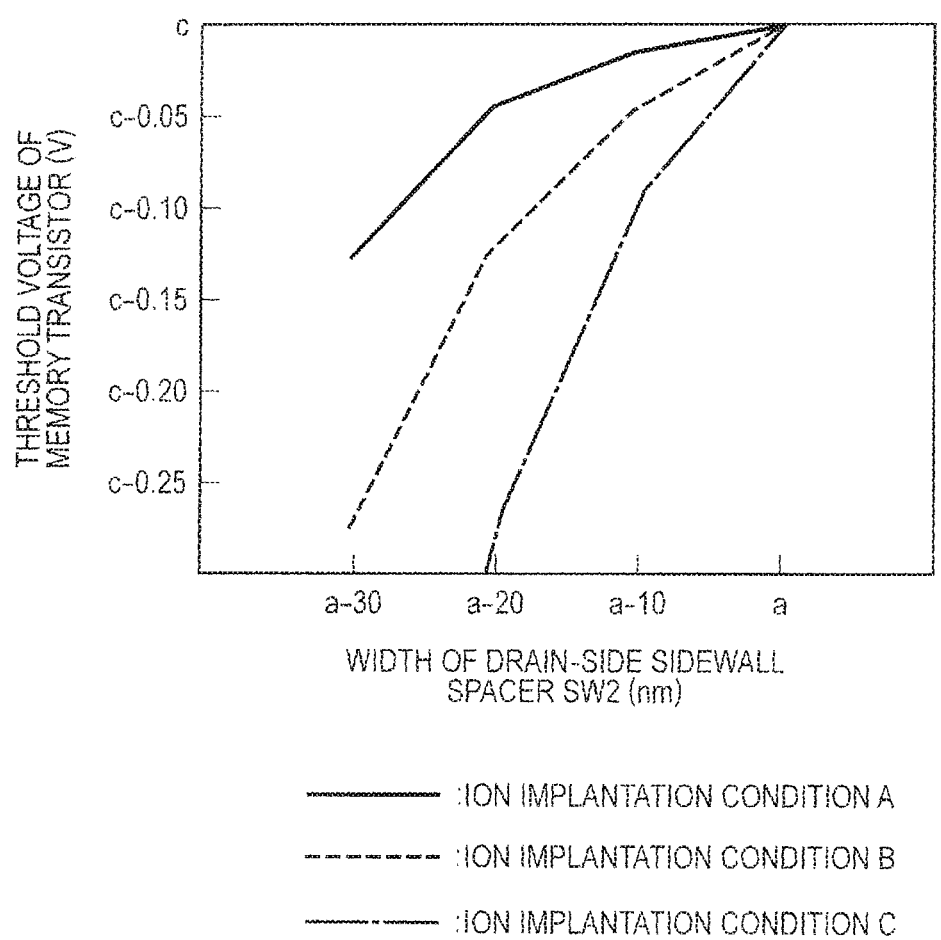

SEMICONDUCTOR DEVICE AND MANUFACTURING METHOD THEREOF

CROSS-REFERENCE TO RELATED APPLICATIONS

The disclosure of Japanese Patent Application No. 2016-112601 filed on Jun. 6, 2016 including the specification, drawings and abstract is incorporated herein by reference in its entirety.

BACKGROUND

The present invention relates to a semiconductor device and a manufacturing method thereof, and particularly to a semiconductor device having a nonvolatile memory and a manufacturing method thereof.

As an electrically writable/erasable nonvolatile semiconductor storage device, an EEPROM (Electrically Erasable and Programmable Read Only Memory) has been used widely. Such a storage device represented by a flash memory which is currently used widely has a conductive floating gate electrode or a trapping insulating film surrounded by oxide films under the gate electrode of a MISFET. A charge storage state in the floating gate or trapping insulating film is used as stored information and read as the threshold of the transistor. The trapping insulating film refers to an insulating film capable of storing charges therein, and examples thereof include a silicon nitride film. By injection/release of charges into/from such a charge storage region, the threshold of the MISFET is shifted to allow the MISFET to operate as a storage element. Examples of the flash memory include a split-gate cell using a MONOS (Metal-Oxide-Nitride-Oxide-Semiconductor) film. In such a memory, a silicon nitride film is used as a charge storage region to provide advantages over a conductive floating gate film such that, due to discrete storage of charges, data retention reliability is high, and the high data retention reliability allows the oxide films over and under the silicon nitride film to be thinned and allows a voltage for a write/erase operation to be reduced.

Each of Japanese Unexamined Patent Publication No. 2009-124106 (Patent Document 1) and Japanese Unexamined Patent Publication No. 2014-75557 (Patent Document 2) describes a technique related to a semiconductor device including a nonvolatile memory. On the other hand, Japanese Unexamined Patent Publication No. 2007-281091 (Patent Document 3) describes a technique which forms sidewall spacers having different widths

Related Art Documents

Patent Documents

[Patent Document 1] Japanese Unexamined Patent Publication No. 2009-124106
[Patent Document 2] Japanese Unexamined Patent Publication No. 2014-75557
[Patent Document 3] Japanese Unexamined Patent Publication No. 2007-281091

SUMMARY

It is desired to improve the performance of a semiconductor device having a nonvolatile memory. Alternatively, it is desired to suppress the manufacturing cost of the semiconductor device. Still alternatively, it is desired to improve the performance of the semiconductor device and reduce the manufacturing cost of the semiconductor device.

Other problems and novel features of the present invention will become apparent from a statement in the present specification and the accompanying drawings.

According to an embodiment, in a semiconductor device including a split-gate nonvolatile memory cell having a control electrode and a memory gate electrode which are adjacent to each other, a width of a sidewall spacer formed adjacent to the memory gate electrode is adjusted to control the threshold voltage of the memory transistor of the nonvolatile memory cell in a neutral state.

Also, according to the embodiment, in a semiconductor device including a split-gate nonvolatile memory cell having a control electrode and a memory gate electrode which are adjacent to each other, a width of a sidewall spacer formed adjacent to the control gate electrode is adjusted to control the threshold voltage of the control transistor of the nonvolatile memory cell.

According to the embodiment, it is possible to improve the reliability of the semiconductor device.

Alternatively, it is possible to reduce the manufacturing cost of the semiconductor device.

Still alternatively, it is possible to improve the performance of the semiconductor device and reduce the manufacturing cost of the semiconductor device.

BRIEF DESCRIPTION OF THE DRAWINGS

FIG. 8 is a table showing an example of conditions under which voltages are applied to the individual portions of a selected memory cell during "Write", "Erase", and "Read" operations.

FIG. 80 is a graph showing the correlation between the width of a drain-side sidewall spacer and the threshold voltage of a control transistor.

DETAILED DESCRIPTION

Figure 1:
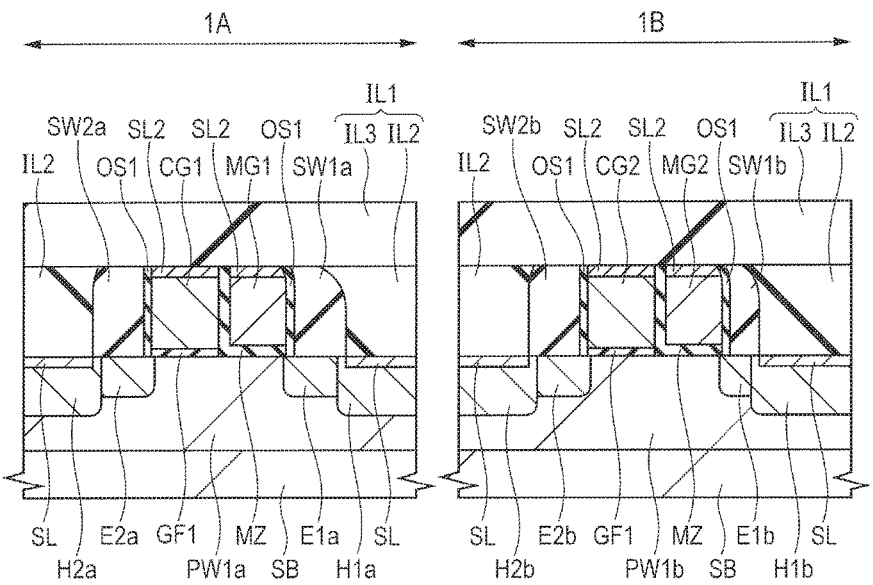
FIG. 1 is a main-portion cross-sectional view of a semiconductor device in an embodiment.

In the following embodiments, if necessary for the sake of convenience, each of the embodiments will be described by being divided into a plurality of sections or embodiments. However, they are by no means irrelevant to each other unless particularly explicitly described otherwise, but are in relations such that one of the sections or embodiments is a modification, details, supplementary explanation, and so forth of part or the whole of the others. Also, in the following embodiments, when the number and the like (including the number, numerical value, amount, range, and the like) of elements are referred to, they are not limited to specific numbers unless particularly explicitly described otherwise or unless they are obviously limited to specific numbers in principle. The number and the like of the elements may be not less than or not more than specific numbers. Also, in each of the following embodiments, the components thereof (including also elements, steps, and the like) are not necessarily indispensable unless particularly explicitly described otherwise or unless the components are considered to be obviously indispensable in principle. Likewise, if the shapes, positional relationships, and the like of the components and the like are referred to in each of the following embodiments, the shapes and the like are assumed to include those substantially proximate or similar thereto and the like unless particularly explicitly described otherwise or unless it can be considered that they obviously do not in principle. The same shall apply in regard to the foregoing numerical value and range.

The following will describe the embodiments in detail on the basis of the drawings. Note that, throughout all the drawings for illustrating the embodiments, members having the same functions are designated by the same reference numerals, and a repeated description thereof is omitted. Also, in the following embodiments, a description of the same or like parts will not be repeated in principle unless particularly necessary.

In the drawings used in the embodiments, hatching may be omitted even in a cross section for improved clarity of illustration, while even a plan view may be hatched for improved clarity of illustration.

(Embodiment 1)

<About Structure of Semiconductor Device>

A semiconductor device in each of Embodiment 1 and Embodiment 2 shown below includes a nonvolatile memory (nonvolatile storage element, flash memory, or nonvolatile semiconductor storage device). In each of Embodiment 1 and Embodiment 2 shown below, the nonvolatile memory will be described on the basis of a memory cell based on an n-channel MISFET (Metal Insulator Semiconductor Field Effect Transistor). Also, in each of Embodiment 1 and Embodiment 2 shown below, polarities are intended to describe operations to the memory cell based on the n-channel MISFET. In the case of a memory cell based on a p-channel MISFET, operations which are the same in principle can be obtained by inverting all the polarities of applied potentials, the conductivity types of the carriers, and the like.

Referring to the drawings, the semiconductor device in Embodiment 1 will be described.

Figure 2:
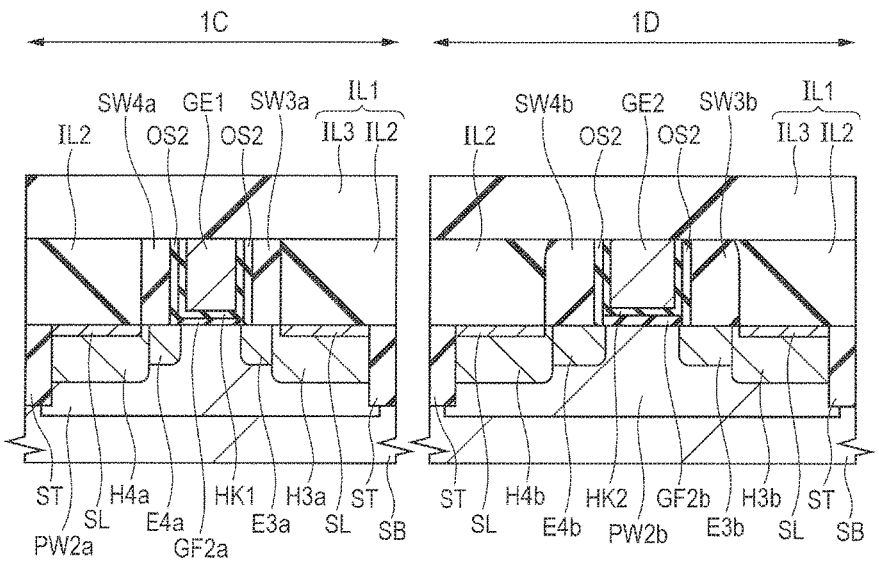
FIG. 2 is a main-portion cross-sectional view of the semiconductor device in the embodiment.
Figure 3:
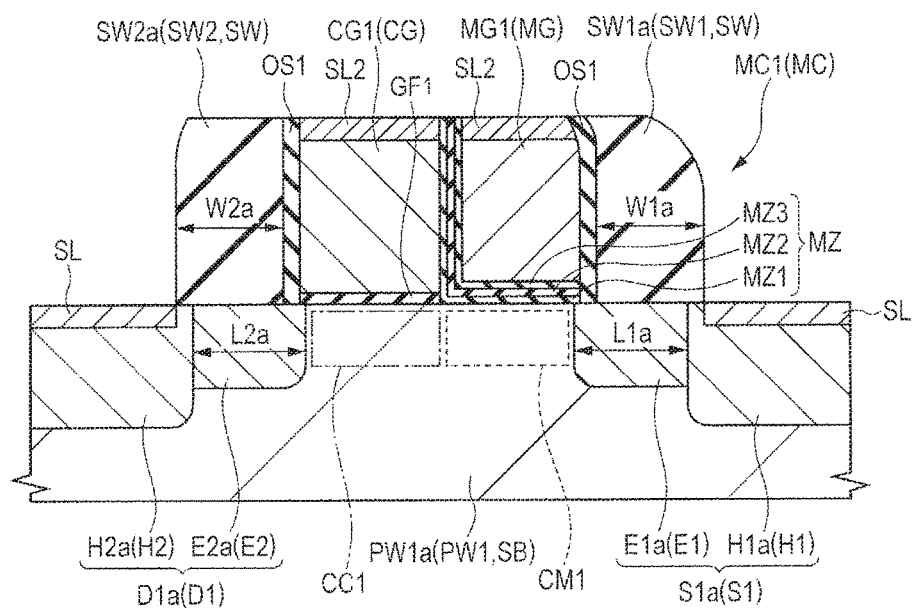
FIG. 3 is a main-portion cross-sectional view of the semiconductor device in the embodiment.
Figure 4:
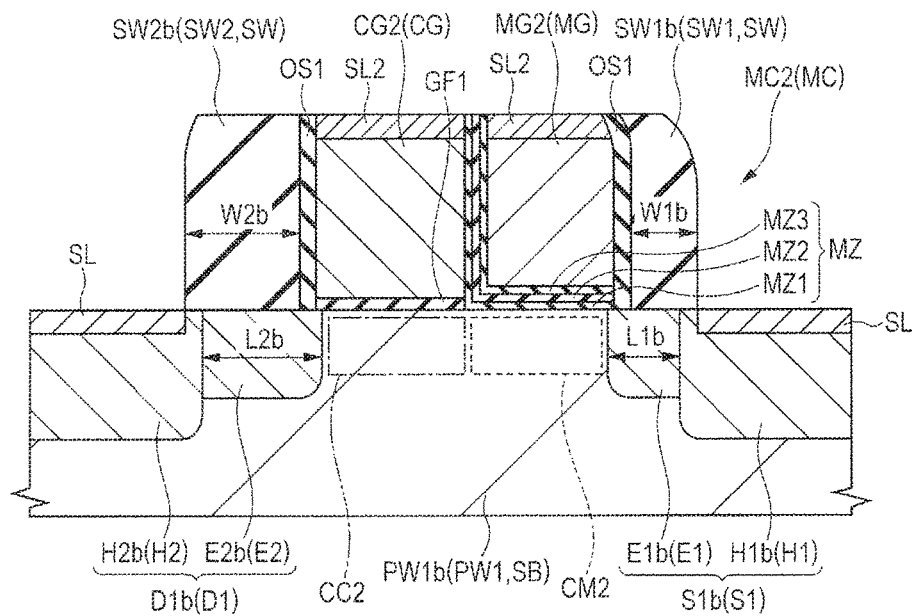
FIG. 4 is a main-portion cross-sectional view of the semiconductor device in the embodiment.
Figure 5:
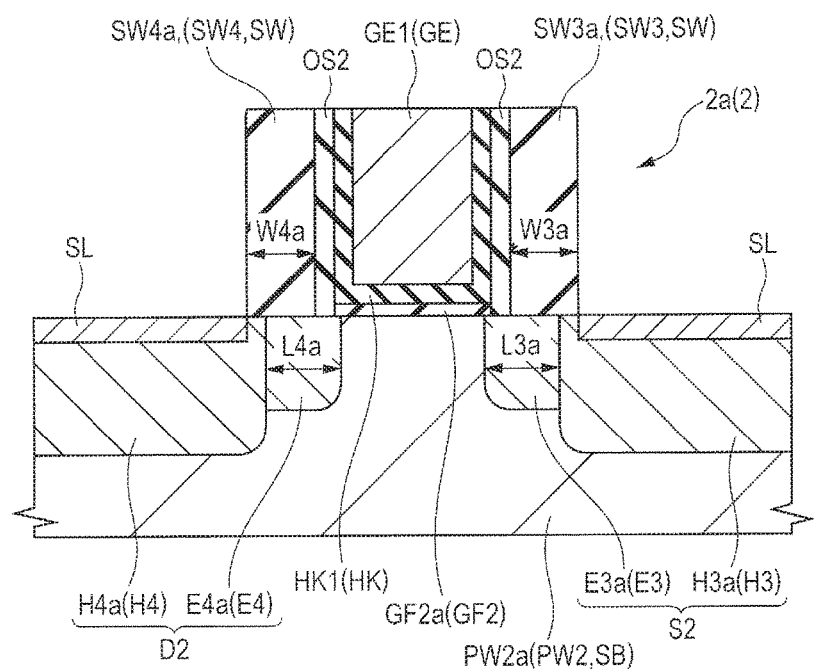
FIG. 5 is a main-portion cross-sectional view of the semiconductor device in the embodiment.
Figure 6:
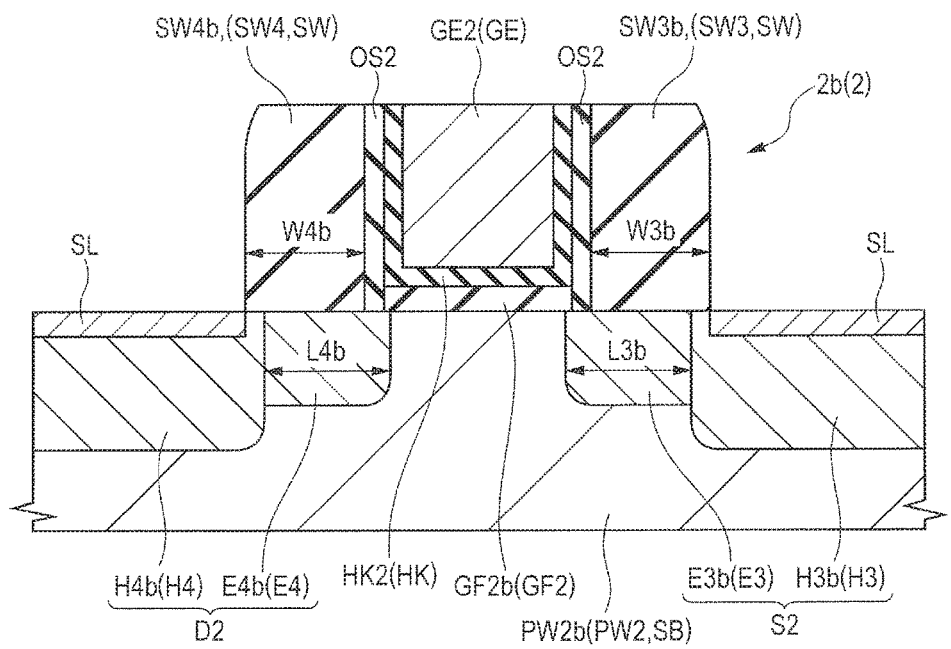
FIG. 6 is a main-portion cross-sectional view of the semiconductor device in the embodiment.
Figure 7:
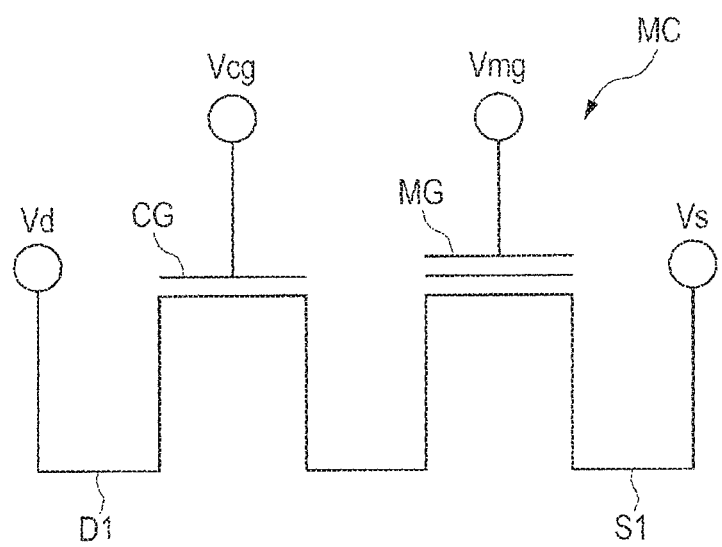
FIG. 7 is an equivalent circuit diagram of a memory cell.

FIGS. 1 to 6 are main-portion cross-sectional views of the semiconductor device in Embodiment 1. FIG. 1 shows a main-portion cross-sectional view of a memory cell region 1A and a memory cell region 1B. FIG. 2 shows a main-portion cross-sectional view of a lower-breakdown-voltage MIS region 1C and a higher-breakdown-voltage MIS region 1D. FIG. 3 is a partially enlarged cross-sectional view of the memory cell region 1A in FIG. 1. FIG. 4 is a partially enlarged cross-sectional view of the memory cell region 1B in FIG. 1. FIG. 5 is a partially enlarged cross-sectional view of the lower-breakdown-voltage MIS region 1C in FIG. 2. FIG. 6 is a partially enlarged cross-sectional view of the higher-breakdown-voltage MIS region 1D in FIG. 2. Note that the illustration of insulating films IL2 and IL3 shown in FIGS. 1 and 2 is omitted in FIGS. 3 to 6. FIG. 7 is an equivalent circuit diagram of memory cells MC1 and MC2.

Each of the memory cell regions 1A and 1B mentioned herein is the region of the main surface of a semiconductor substrate SB where a memory cell in a nonvolatile memory is formed. The lower-breakdown-voltage MIS region 1C is the region of the main surface of the semiconductor substrate SB where a lower-breakdown-voltage MISFET included in a peripheral circuit is formed. The higher-breakdown-voltage MIS region 1D is a region of the main surface of the semiconductor substrate SB where a higher-breakdown-voltage MISFET included in the peripheral circuit is formed. The memory cell regions 1A and 1B, the lower-breakdown-voltage MIS region 1C, and the higher-breakdown-voltage MIS region 1D correspond to the different two-dimensional regions of the main surface of the same semiconductor substrate SB. The peripheral circuits are circuits other than the nonvolatile memory. Examples of the peripheral circuits include a processor such as a CPU, a control circuit, a sense amplifier, a column decoder, a row decoder, and an input/output circuit.

In the semiconductor substrate (semiconductor wafer) SB made of p-type monocrystalline silicon having a specific resistance of, e.g., about 1 to 10 Ωm or the like, isolation regions ST for isolating elements are formed. In each of the memory cell regions 1A and 1B, in an active region defined by the isolation region ST, a p-type well PW1 is formed.

In each of the memory cell regions 1A and 1B, a memory cell MC in the nonvolatile memory is formed. It is assumed herein that he memory cell MC formed in the memory cell region 1A is referred to as a memory cell MC1, and the memory cell MC formed in the memory cell region 1B is referred to as a memory cell MC2. In the memory cell region 1A, a plurality of the memory cells MC1 are actually formed in an array. Also, in the memory cell region 1B, a plurality of the memory cells MC2 are actually formed in an array. Each of the memory cells MC is a split-gate memory cell in which two MISFETs, i.e., a control transistor having a control gate electrode CG and a memory transistor having a memory gate electrode MG are coupled to each other.

A MISFET including a gate insulating film including a charge storage portion (charge storage layer) and the memory gate electrode MG is referred to herein as the memory transistor and a MISFET including a gate insulating film and the control gate electrode CG is referred to herein as the control transistor. Note that, since the control transistor is a memory cell selection transistor, the control transistor can also be regarded as a selection transistor. Accordingly, the control gate electrode CG can also be regarded as a selection gate electrode. The memory transistor is a storage transistor.

The following will specifically describe the basic structure of each of the memory cells MC. The basic configuration of the memory cell MC described herein is common to the memory cells MC1 and MC2.

As shown in FIGS. 1, 3, and 4, each of the memory cells MC in the nonvolatile memory has source and drain n-type semiconductor regions S1 and D1 formed in the p-type well PW1 of the semiconductor substrate SB, the control gate electrode CG formed over the semiconductor substrate SB (p-type well PW1), and the memory gate electrode MG formed over the semiconductor substrate SB (p-type well PW1) to be adjacent to the control gate electrode CG. The memory cell MC in the nonvolatile memory further has an insulating film (gate insulating film) GF1 formed between the control gate electrode CG and the semiconductor substrate SB (p-type well PW1), an insulating film MZ formed between the memory gate electrode MG and the semiconductor substrate SB (p-type well PW1) and between the memory gate electrode MG and the control gate electrode CG. The memory cell MC in the nonvolatile memory further has sidewall spacers SW formed over the respective side surfaces of the memory gate electrode MG and the selection gate electrode SG which are not adjacent to each other.

The control gate electrode CG and the memory gate electrode MG are arranged side by side to extend along the main surface of the semiconductor substrate SB with the insulating film MZ being interposed between the respective facing side surfaces thereof. Each of the control gate electrode CG and the memory gate electrode MG extends in a direction perpendicular to the plane of the paper with FIGS. 1, 3, and 4. Each of the control gate electrode CG and the memory gate electrode MG is made of a conductive film, e.g., a silicon film such as an n-type polysilicon film.

The control gate electrode CG and the memory gate electrode MG are formed over the semiconductor substrate SB (p-type well PW1) located between the semiconductor regions D1 and S1. The memory gate electrode MG is located closer to the semiconductor region S1, while the control gate electrode CG is located closer to the semiconductor region D1. Note that the control gate electrode CG and the memory gate electrode MG are formed over the semiconductor substrate SB (p-type well PW1) via the respective insulating films GF1 and MZ. The insulating film GF1 formed between the control gate electrode CG and the semiconductor substrate SB (p-type well PW1), i.e., the insulating film GF1 under the control gate electrode CG functions as the gate insulating film of the control transistor. The insulating film GF1 is made of, e.g., a silicon dioxide film or the like.

The control gate electrode CG and the memory gate electrode MG are adjacent to each other via the insulating film MZ. The insulating film MZ extends continuously over two regions, i.e., the region between the memory gate electrode MG and the semiconductor substrate SB (p-type well PW1) and the region between the memory gate electrode MG and the control gate electrode CG. The insulating film MZ can be regarded as a gate insulating film. Note that the insulating film MZ between the memory gate electrode MG and the semiconductor substrate SB (p-type well PW1), i.e., the insulating film MZ under the memory gate electrode MG functions as the gate insulating film of the memory transistor, while the insulating film MZ between the memory gate electrode MG and the control gate electrode CG functions as an insulating film for providing insulation between the memory gate electrode MG and the control gate electrode CG.

The insulating film MZ is a multi-layer insulating film and made of a multi-layer film including an insulating film MZ1, an insulating film MZ2 over the insulating film MZ2, and an insulating film MZ3 over the insulating film MZ2. Here, the insulating film MZ1 is made of a silicon dioxide film (oxide film), the insulating film MZ2 is made of a silicon nitride film (nitride film), and the insulating film MZ3 is made of a silicon dioxide film (oxide film).

Note that, in FIG. 1, for improved clarity of illustration, the multi-layer film including the insulating films MZ1, MZ2, and MZ3 is shown as the single-layer insulating film MZ. However, actually, as shown in FIGS. 3 and 4, the insulating film MZ is made of the multi-layer film including the insulating films MZ1, MZ2, and MZ3.

In the insulating film MZ, the insulating film MZ2 is an insulating film (trapping insulating film) having a charge storing function. That is, in the insulating film MZ, the insulating film MZ2 is intended to store charges and can function as a charge storage portion (charge storage layer). Accordingly, the insulating film MZ can be regarded as an insulating film having an internal charge storage portion (which is the insulating film MZ2 herein). In the insulating film MZ, the insulating films MZ3 and MZ1 located over and under the insulating film MZ2 as the trapping insulating film can function as charge blocking layers for confining charges to the trapping insulating film. The respective band gaps of the insulating films MZ1 and MZ3 are larger than the band gap of the insulating film MZ2 as the trapping insulating film.

The semiconductor region S1 functions as one of a source region and a drain region, while the semiconductor region D1 functions as the other of the source region and the drain region. Here, the semiconductor region S1 functions as the source region, while the semiconductor region D1 functions as the drain region. Note that the respective names of the source region and the drain region in the memory cell MC correspond to the source region and the drain region during a read operation to the memory cell MC.

Each of the semiconductor regions S1 and D1 is made of an n-type semiconductor region in which an n-type impurity is introduced and has an LDD (lightly doped drain) structure. That is, the source semiconductor region S1 has an $n^-$-type semiconductor region E1 and an $n^+$-type semiconductor region H1 having an impurity concentration higher than that of the $n^-$-type semiconductor region E1. The drain semiconductor region D1 has an $n^-$-type semiconductor region E2 and an $n^+$-type semiconductor region H2 having an impurity concentration higher than that of the $n^-$-type semiconductor region E2. The $n^+$-type semiconductor region H1 has a junction depth deeper than that of the $n^-$-type semiconductor region E1 and an impurity concentration higher than that of the $n^-$-type semiconductor region E1. The $n^+$-type semiconductor region H2 has a junction depth deeper than that of the $n^-$-type semiconductor region E2 and an impurity concentration higher than that of the $n^-$-type semiconductor region E2.

Over the respective side surfaces (side walls) of the memory gate electrode MG and the control gate electrode CG which are not adjacent to each other, the sidewall spacers (sidewalls or side-wall insulating films) SW each made of an insulator (insulating film) are formed. That is, over the side surface of the memory gate electrode MG opposite to the side surface thereof adjacent to the control gate electrode CG via the insulating film MZ and over the side surface of the control gate electrode CG opposite to the side surface thereof adjacent to the memory gate electrode MG via the insulating film MZ, the sidewall spacers SW are formed. Each of the sidewall spacers SW is made of a single-layer or multi-layer insulating film.

It is assumed herein that the sidewall spacer SW formed over the side surface of the memory gate electrode MG is referred to as a sidewall spacer SW1, and the sidewall spacer SW formed over the side surface of the control gate electrode CG is referred to as a sidewall spacer SW2. The sidewall spacer SW1 is formed over the side surface of the memory gate electrode MG to be adjacent thereto but, between the sidewall spacer SW1 and the memory gate electrode MG, an offset spacer (side-wall insulating film) OS1 made of an insulating film may also be interposed. Also, the sidewall spacer SW2 is formed over the side surface of the control gate electrode CG to be adjacent thereto but, between the sidewall spacer SW2 and the control gate electrode CG, the offset spacer OS1 made of an insulating film may also be interposed.

The $n^-$-type semiconductor region E1 is formed by self-alignment with the side surface of the memory gate electrode MG or the offset spacer OS1 over the side surface. The $n^+$-type semiconductor region H1 is formed by self-alignment with the side surface of the sidewall spacer SW1 (side surface of the sidewall spacer SW1 opposite to the side surface thereof in contact with the memory gate electrode MG). Accordingly, the lower-concentration $n^-$-type semiconductor region E1 is formed mainly under the sidewall spacer SW1, while the higher-concentration $n^+$-type semiconductor region H1 is formed outside the lower-concentration $n^-$-type semiconductor region E1. As a result, the lower-concentration $n^-$-type semiconductor region E1 is formed so as to be adjacent to the channel formation region (CM1 or CM2) of the memory transistor, while the higher-concentration $n^+$-type semiconductor region H1 is formed so as to be adjacent to the lower-concentration $n^-$-type semiconductor region E1 and apart from the channel formation region (CM1 or CM2) of the memory transistor by a distance corresponding to the $n^-$-type semiconductor region E1. The $n^-$-type semiconductor region E1 is interposed between the $n^+$-type semiconductor region H1 and the channel formation region (CM1 or CM2) of the memory transistor.

The $n^-$-type semiconductor region E2 is formed by self-alignment with the side surface of the control gate electrode CG or the offset spacer OS1 over the side surface. The $n^+$-type semiconductor region H2 is formed by self-alignment with the side surface of the sidewall spacer SW2 (side surface of the sidewall spacer SW2 opposite to the side surface thereof in contact with the control gate electrode CG). Accordingly, the lower-concentration $n^-$-type semiconductor region E2 is formed mainly under the sidewall spacer SW2, while the higher-concentration $n^+$-type semiconductor region H2 is formed outside the lower-concentration $n^-$-type semiconductor region E2. As a result, the lower-concentration $n^-$-type semiconductor region E2 is formed so as to be adjacent to the channel formation region (CC1 or CC2) of the control transistor, while the higher-concentration $n^+$-type semiconductor region H2 is formed so as to be adjacent to the lower-concentration $n^-$-type semiconductor region E2 and apart from the channel formation region (CC1 or CC2) of the control transistor by a distance corresponding to the $n^-$-type semiconductor region E2. The $n^-$-type semiconductor region E2 is interposed between the $n^+$-type semiconductor region H2 and the channel formation region (CC1 or CC2) of the control transistor.

The region of the p-type well PW1 which is located under the insulating film MZ under the memory gate electrode MG corresponds to the channel formation region (CM1 or CM2) where the channel region of the memory transistor is formed. On the other hand, the region of the p-type well PW1 which is located under the insulating film GF1 under the control gate electrode CG corresponds to the channel formation region (CC1 or CC2) where the channel region of the control transistor is formed. The impurity concentration of the channel formation region (CC1 or CC2) of the control transistor is adjusted to control the threshold voltage of the control transistor. Also, the impurity concentration of the channel formation region (CM1 or CM2) of the memory transistor is adjusted to control the threshold voltage of the memory transistor.

The foregoing is the basic configuration of the memory cell MC. The memory cell MC having such a configuration is formed in each of the memory cell regions 1A and 1B.

It is assumed herein that the sidewall spacer SW1 for the memory cell MC1 formed in the memory cell region 1A is referred to as a sidewall spacer SW1a and the sidewall spacer SW2 for the memory cell MC1 formed in the memory cell region 1A is referred to as a sidewall spacer SW2a. It is also assumed herein that the memory gate electrode MG and the control gate electrode CG each for the memory cell MC1 formed in the memory cell region 1A are respectively referred to as a memory gate electrode MG1 and a control gate electrode CG1. It is also assumed herein that the sidewall spacer SW1 for the memory cell MC2 formed in the memory cell region 1B is referred to as a sidewall spacer SW1b and the sidewall spacer SW2 for the memory cell MC2 formed in the memory cell region 1B is referred to as a sidewall spacer SW2b. It is also assumed herein that the memory gate electrode MG and the control gate electrode CG each for the memory cell MC2 formed in the memory cell region 1B are respectively referred to as a memory gate electrode MG2 and a control gate electrode CG2.

It is assumed that the p-type well PW1 formed in the memory cell region 1A is referred to as a p-type well PW1a and the semiconductor regions S1 and D1 for the memory cell MC1 formed in the memory cell region 1A are respectively referred to as semiconductor regions S1a and D1a. It is also assumed that the $n^-$-type semiconductor region E1 and the $n^+$-type semiconductor region H1 each for the memory cell MC1 formed in the memory cell region 1A are respectively referred to as an $n^-$-type semiconductor region E1a and an $n^+$-type semiconductor region H1a, and the $n^-$-type semiconductor region E2 and the $n^+$-type semiconductor region H2 each for the memory cell MC1 formed in the memory cell region 1A are respectively referred to as an $n^-$-type semiconductor region E2a and an $n^+$-type semiconductor region H2a.

It is assumed that the p-type well PW1 formed in the memory cell region 1B is referred to as a p-type well PW1b, and the semiconductor regions S1 and D1 for the memory cell MC2 formed in the memory cell region 1B are respectively referred to as semiconductor regions S1b and D1b. It is also assumed that the $n^-$-type semiconductor region E1 and the $n^+$-type semiconductor region H1 each for the memory cell MC2 formed in the memory cell region 1B are respectively referred to as an $n^-$-type semiconductor region E1b and an $n^+$-type semiconductor region H1b, and the $n^-$-type semiconductor region E2 and the $n^+$-type semiconductor region H2 each for the memory cell MC2 formed in the memory cell region 1B are respectively referred to as an $n^-$-type semiconductor region E2b and an $n^+$-type semiconductor region H2b.

Next, a basic configuration of each of respective MISFETs 2 formed in the lower-breakdown-voltage MIS region 1C and the higher-breakdown-voltage MIS region will be specifically described. Note that a description will be given herein of the case where the MISFETs 2 are n-channel MISFETs, but the MISFETs 2 may also be p-channel MISFETs.

As shown in FIGS. 2, 5, and 6, in the semiconductor substrate SB located in the lower-breakdown-voltage MIS region 1C and the higher-breakdown-voltage MIS region 1D, in active regions defined by the isolation regions ST, p-type wells PW2 are formed. In each of the lower-breakdown-voltage MIS region 1C and the higher-breakdown-voltage MISFET region 1D, the MISFET 2 includes n-type source and drain semiconductor regions S2 and D2 formed in the p-type well PW2 of the semiconductor substrate SB and gate electrodes GE formed over the semiconductor substrate SB (p-type well PW2) via respective insulating films GF2 and HK.

Each of the gate electrodes GE is formed over the semiconductor substrate SB (p-type well PW2) located between the semiconductor regions D2 and S2 via the insulating films GF2 and HK. Each of the semiconductor regions S2 functions as one of the source region and the drain region, while each of the semiconductor regions D2 functions as the other of the source region and the drain region. Here, the semiconductor region S2 functions as the source region, while the semiconductor region D2 functions as the drain region.

Over the side surfaces (side walls) of each of the gate electrodes GE, the sidewall spacers SW made of an insulator (insulating film) are formed. Each of the sidewall spacers SW is formed of a single-layer or multi-layer insulating film.

It is assumed herein that the sidewall spacer SW formed over the source-side side surface (closer to the semiconductor region S2) of each of the gate electrodes GE is referred to as a sidewall spacer SW3. It is also assumed herein that the sidewall spacer SW formed over the drain-side side surface (closer to the semiconductor region D2) of the gate electrode GE is referred to as a sidewall spacer SW4.

Between each of the gate electrodes GE and the semiconductor substrate SB (p-type well P2), a multi-layer film including the insulating films GF2 and HK is interposed. The insulating film GF2 is in the lower layer (closer to the semiconductor substrate SB), while the insulating film HK is in the upper layer (closer to the gate electrode GE). The multi-layer film including the insulating films GF2 and HK and interposed between the gate electrode GE and the semiconductor substrate (p-type well PW2) functions as the gate insulating film of the MISFET 2.

The insulating film G2 is made of, e.g., a silicon dioxide film, while the insulating film HK is made of a high-dielectric-constant insulating film. The high-dielectric-constant insulating film mentioned herein indicates an insulating film having a dielectric constant higher than that of a silicon nitride film. Examples of the high-dielectric-constant film include a hafnium oxide film, an aluminum oxide film, and a tantalum oxide film.

The gate electrode is made of a conductive film, which is a metal film herein. Accordingly, the gate electrode GE is a so-called metal gate electrode.

It is assumed that, in the present application, when a metal film included in a gate electrode is mentioned, the metal film indicates a conductive film showing metal conduction and includes not only a single-element metal film (pure metal film) and an alloy film, but also a metal compound film (such as a metal nitride film or a metal carbide film) showing metal conduction. Accordingly, the gate electrode GE is made of a conductive film showing metal conduction and has a resistivity as low as that of a metal.

After dummy gate electrodes DG1 and DG2 described later are removed, the gate electrodes GE and the insulating films HK are embedded in the regions from which the dummy gate electrodes DG1 and DG2 have been removed, the details of which will be described later. Consequently, the insulating film GF2 is formed in the region interposed between each of the gate electrodes GE and the semiconductor substrate (p-type well PW), while the insulating film HK is formed not only in the region interposed between the gate electrode GE and the semiconductor substrate SB (p-type well PW2), but also in each of the region interposed between the gate electrode GE and the sidewall spacer SW3 and the region interposed between the gate electrode GE and the sidewall spacer SW4. That is, the insulating film HK extends continuously between the gate electrode GE and the sidewall spacer SW3 and between the gate electrode GE and the sidewall spacer SW4.

There may also be a case where, between each of the sidewall spacers SW3 and SW4 and each of the gate electrodes GE, not only the insulating film HK, but also the offset spacer (side-wall insulating film) OS1 made of an insulating film is interposed. In that case, each of the sidewall spacers SW3 and SW4 is in contact with the offset spacer OS1, while the gate electrode GE is in contact with the insulating film HK.

Each of the semiconductor regions S2 and D2 is made of an n-type semiconductor region in which an n-type impurity is introduced and includes an LDD structure. That is, the source semiconductor region S2 has an $n^-$-type semiconductor region E3 and an $n^+$-type semiconductor region H3 having an impurity concentration higher than that of the $n^-$-type semiconductor region E3. The drain semiconductor region D2 has an $n^-$-type semiconductor region E4 and an $n^+$-type semiconductor region H4 having an impurity concentration higher than that of the $n^-$-type semiconductor region E4. The $n^+$-type semiconductor region H3 has a junction depth deeper than that of the $n^-$-type semiconductor region E3 and an impurity concentration higher than that of the $n^-$-type semiconductor region E3. The $n^+$-type semiconductor region H4 has a junction depth deeper than that of the $n^-$-type semiconductor region E4 and an impurity concentration higher than that of the $n^-$-type semiconductor region E4.

In the p-type well PW2, the lower-concentration $n^-$-type semiconductor region E3 is formed mainly under the sidewall spacer SW3, while the higher-concentration $n^+$-type semiconductor region H3 is formed outside the $n^-$-type semiconductor region E3. Also, in the p-type well PW2, the lower-concentration $n^-$-type semiconductor region E4 is formed mainly under the sidewall spacer SW4, while the higher-concentration $n^+$-type semiconductor region H4 is formed outside the $n^-$-type semiconductor region E4. Accordingly, the $n^-$-type semiconductor regions E3 and E4 are formed to be adjacent to the channel formation region of the MISFET 2 such that the channel formation region is interposed therebetween in a channel length direction. The $n^+$-type semiconductor region H3 is formed so as to be adjacent to the $n^-$-type semiconductor region E3 and apart from the channel formation region of the MISFET 2 by a distance corresponding to the $n^-$-type semiconductor region E3. The $n^+$-type semiconductor region H4 is formed so as to be adjacent to the $n^-$-type semiconductor region E4 and apart from the channel formation region of the MISFET 2 by a distance corresponding to the $n^-$-type semiconductor region E4. Consequently, the $n^-$-type semiconductor region E3 is interposed between the $n^+$-type semiconductor region H3 and the channel formation region of the MISFET 2, while the $n^-$-type semiconductor region E4 is interposed between the $n^+$-type semiconductor region H4 and the channel formation region of the MISFET 2.

In each of the p-type wells PW2, the region under the insulating films HK and GF2 under the gate electrode GE corresponds to a channel formation region where the channel region of the MISFET 2 is formed. To control the threshold voltage of the MISFET 2, the impurity concentration of the channel formation region of the MISFET 2 is adjusted. The channel formation region of the MISFET 2 is shown without a reference numeral.

The foregoing is the basic configuration of the MISFET 2. The MISFET 2 having such a configuration is formed in each of the lower-breakdown-voltage MIS region 1C and the higher-breakdown-voltage MIS region 1D.

It is assumed that the MISFET 2 formed in the lower-breakdown-voltage MIS region 1C is referred to as a MISFET 2a and the MISFET 2 formed in the higher-breakdown-voltage MIS region 1D is referred to as a MISFET 2b. It is also assumed that the p-type well PW2 formed in the lower-breakdown-voltage MIS region 1C is referred to as a p-type well PW2a and the p-type well PW2 formed in the higher-breakdown-voltage MIS region 1D is referred to as a p-type well PW2b. It is also assumed that the sidewall spacer SW3 for the MISFET 2a formed in the lower-breakdown-voltage MIS region 1C is referred to as a sidewall spacer SW3a and the sidewall spacer SW4 for the MISFET 2a formed in the lower-breakdown-voltage MIS region 1C is referred to as a sidewall spacer SW4a. It is also assumed that the sidewall spacer SW3 for the MISFET 2b formed in the higher-breakdown-voltage MIS region 1D is referred to as a sidewall spacer SW3b and the sidewall spacer SW4 for the MISFET 2b formed in the higher-breakdown-voltage MIS region 1D is referred to as a sidewall spacer SW4b.

It is assumed that the gate electrode GE for the MISFET 2a formed in the lower-breakdown-voltage MIS region 1C is referred to as a gate electrode GE1 and the gate electrode GE for the MISFET 2b formed in the higher-breakdown-voltage MIS region 1D is referred to as a gate electrode GE2. It is also assumed that the insulating film GF2 for the MISFET 2a formed in the lower-breakdown-voltage MIS region 1C is referred to as an insulating film GF2a and the insulating film GF2 for the MISFET 2b formed in the higher-breakdown-voltage MIS region 1D is referred to as an insulating film GF2b. It is also assumed that the insulating film HK for the MISFET 2a formed in the lower-breakdown-voltage MIS region 1C is referred to as an insulating film HK1 and the insulating film HK for the MISFET 2b formed in the higher-breakdown-voltage MIS region 1D is referred to as an insulating film HK2.

It is assumed that the $n^-$-type semiconductor region E3 for the MISFET 2a and the $n^+$-type semiconductor region H3 for the MISFET 2a which are formed in the lower-breakdown-voltage MIS region 1C are referred to as an $n^-$-type semiconductor region E3a and an $n^+$-type semiconductor region H3a. It is also assumed that the $n^-$-type semiconductor region E4 for the MISFET 2a and the $n^+$-type semiconductor region H4 for the MISFET 2a which are formed in the lower-breakdown-voltage MIS region 1C are referred to as an $n^-$-type semiconductor region E4a and an $n^+$-type semiconductor region H4a. It is also assumed that the $n^-$-type semiconductor region E3 for the MISFET 2b and the $n^+$-type semiconductor region H3 for the MISFET 2b which are formed in the higher-breakdown-voltage MIS region 1D are referred to as an $n^-$-type semiconductor region E3b and an $n^+$-type semiconductor region H3b. It is also assumed that the $n^-$-type semiconductor region E4 for the MISFET 2b and the $n^+$-type semiconductor region H4 for the MISFET 2b which are formed in the higher-breakdown-voltage MIS region 1D are referred to as an $n^-$-type semiconductor region E4b and an $n^+$-type semiconductor region H4b.

In the respective upper portions (upper surfaces) of the $n^+$-type semiconductor regions H1, H2, H3, and H4, metal silicide layers SL are formed. In the respective upper portions (upper surfaces) of the memory gate electrode MG and the control gate electrode CG, metal silicide layers SL2 are formed. Each of the metal silicide layers SL and SL2 is made of, e.g., a cobalt silicide layer, a nickel silicide layer, a platinum-added nickel silicide layer, or the like. By forming the metal silicide layers SL, a diffusion resistance and a contact resistance can be reduced. There may also be a case where, in terms of maximally preventing a short circuit between the memory gate electrode MG and the control gate electrode CG, the metal silicide layer SL2 is not formed in either or each of the respective upper portions of the memory gate electrode MG and the control gate electrode CG.

Over the semiconductor substrate SB, an interlayer insulating film IL1 is formed as an insulating film so as to cover the control gate electrodes CG1 and CG2, the memory gate electrodes MG1 and MG2, the gate electrodes GE1 and GE2, and the sidewall spacers SW1a, SW1b, SW2a, SW2b, SW3a, SW3b, SW4a, and SW4b. The interlayer insulating film IL1 mentioned herein includes the insulating film IL2 and the insulating film IL3 over the insulating film IL2. The interlayer insulating film IL1 has a planarized upper surface.

In the interlayer insulating film IL1, contact holes described later are formed. In the contact holes, plugs PG described later are formed. Over the interlayer insulating film IL1 in which the plugs PG are embedded, an insulating film IL6 and wires M1 each described later are formed. The illustration and description of the contact holes, the plugs PG, the insulating film IL6, and the wires M1 is omitted herein.

Next, a description will be given of the thicknesses of the respective gate insulating films in the MISFET 2a in the lower-breakdown-voltage MIS region 1C and the MISFET 2b in the higher-breakdown-voltage MIS region 1D.

The thickness of the insulating film GF2b for the MISFET 2b formed in the higher-breakdown-voltage MIS region 1D is larger than the thickness of the insulating film GF2a for the MISFET 2a formed in the lower-breakdown-voltage MIS region 1C. The insulating film HK2 in the higher-breakdown-voltage MIS region 1D and the insulating film HK1 in the lower-breakdown-voltage MIS region 1C, which are formed of a common insulating film, are made of the same insulating material and have the same thickness. Accordingly, the total thickness of the insulating films GF2b and HK2 interposed between the gate electrode GE2 and the semiconductor substrate SB in the higher-breakdown-voltage MIS region 1D is larger than the total thickness of the insulating films GF2a and HK1 interposed between the gate electrode GE1 and the semiconductor substrate SB in the lower-breakdown-voltage MIS region 1C. That is, the thickness of the gate insulating film for the MISFET 2b in the higher-breakdown-voltage MIS region 1D is larger than the thickness of the gate insulating film for the MISFET 2a in the lower-breakdown-voltage MISFET 1C. Also, the breakdown voltage of the MISFET 2b is higher than the breakdown voltage of the MISFET 2a, and the operation voltage of the MISFET 2b is higher than the operation voltage of the MISFET 2a.

Next, a description will be given of the widths (thicknesses) of the sidewall spacers SW. In Embodiment 1, the widths of the sidewall spacers SW are set in accordance with the properties of the elements including the sidewall spacers SW.

First, focus is attention on the lower-breakdown-voltage MIS region 1C and the higher-breakdown-voltage MIS region 1D. In the lower-breakdown-voltage MIS region 1C, a width W3a of the sidewall spacer SW3a is equal to a width W4a of the sidewall spacer SW4a (W3a=W4a). Also, in the higher-breakdown-voltage MIS region 1D, a width W3b of the sidewall spacer SW3b is equal to a width W4b of the sidewall spacer SW4b (W3b=W4b). The respective widths W3b and W4b of the sidewall spacers SW3b and SW4b in the higher-breakdown-voltage MIS region 1D are larger than the respective widths W3a and W4a of the sidewall spacers SW3a and SW4a in the lower-breakdown-voltage MIS region 1D (W4b=W3b>W3a=W4b). This allows the breakdown voltage of the MISFET 2b in the higher-breakdown-voltage MIS region 1D to be set higher than the breakdown voltage of the MISFET 2a in the lower-breakdown-voltage MIS region 1C.

Next, attention is focused on the memory cell regions 1A and 1B. A width W2a of the sidewall spacer SW2a in the memory cell region 1A is equal to a width W2b of the sidewall spacer SW2b in the memory cell region 1B (W2a=W2b). However, a width W1b of the sidewall spacer SW1b in the memory cell region 1B is smaller than a width W1a of the sidewall spacer SW1a in the memory cell region 1A (W1a>W1b). The width W1a of the sidewall spacer SW1a in the memory cell region 1A is substantially equal to each of the widths W2a and W2b of the sidewall spacers SW2a and SW2b (W1a=W2a=W2b).

The following is the result of making a comparison between the respective widths of the sidewall spacers SW in the memory cell regions 1A and 1B, the lower-breakdown-voltage MIS region 1C, and the higher-breakdown-voltage MIS region 1D. That is, the width W1b of the sidewall spacer SW1b in the memory cell region 1B is substantially equal to the respective widths W3a and W4a of the sidewall spacers SW3a and SW4b in the lower-breakdown-voltage MIS region 1C (W1b=W3a=W4a). The respective widths W1a, W2a, and W2b of the sidewall spacers SW1a, SW2a, and SW2b in the memory cell regions 1A and 1B are substantially equal to the respective widths W3b and W4b of the sidewall spacers SW3b and SW4b in the higher-breakdown-voltage MIS region 1D (W1a=W2a=W2b=W3b=W4b). Accordingly, W1b=W3a=W4a<W1a=W2a=W2b=W3b=W4b is satisfied.

The width of each of the sidewall spacers SW mentioned herein is a width (dimension) measured in a gate length direction. That is, in the memory cell region 1A, the width W1a of the sidewall spacer SW1a is the width (dimension) of the sidewall spacer SW1a in the gate length direction of the memory gate electrode MG1, and the width W2a of the sidewall spacer SW2a is the width (dimension) of the sidewall spacer SW2a in the gate length direction of the control gate electrode CG1. In the memory cell region 1B, the width W1b of the sidewall spacer SW1b is the width (dimension) of the sidewall spacer SW1b in the gate length direction of the memory gate electrode MG2, and the width W2b of the sidewall spacer SW2b is the width (dimension) of the sidewall spacer SW2b in the gate length direction of the control gate electrode CG2. In the lower-breakdown-voltage MIS region 1C, the respective widths W3a and W4a of the sidewall spacers SW3a and SW4a are the respective widths (dimensions) of the sidewall spacers SW3a and SW4a in the gate length direction of the gate electrode G1. In the higher-breakdown-voltage MIS region 1D, the respective widths W3b and W4b of the sidewall spacers SW3b and SW4b are the respective widths (dimensions) of the sidewall spacers SW3b and SW4b in the gate length direction of the gate electrode G2.

Next, attention is focused on the respective dimensions (dimensions in a gate length direction) of the n⁻-type semiconductor regions E1a, E1b, E2a, E2b, E3a, E3b, E4a, and E4b. The n⁻-type semiconductor regions E1a, E1b, E2a, E2b, E3a, E3b, E4a, and E4b have the dimensions reflecting the widths of the sidewall spacers SW. As the widths of the sidewall spacers SW are larger, the dimensions of the n⁻-type semiconductor regions E1a, E1b, E2a, E2b, E3a, E3b, E4a, and E4b formed thereunder are larger.

Accordingly, in the lower-breakdown-voltage MIS region 1C, reflecting the relationship between the sidewall spacers SW3a and SW4a given by W3a=W4a, a dimension L3a of the n⁻-type semiconductor region E3a is substantially equal to a dimension L4a of the n⁻-type semiconductor region E4a (L3a=L4a). Also, in the higher-breakdown-voltage MIS region 1D, reflecting the relationship between the sidewall spacers SW3b and SW4b given by W3b=W4b, a dimension L3b of the n⁻-type semiconductor region E3b is substantially equal to a dimension L4b of the n⁻-type semiconductor region E4b (L3b=L4b). In addition, reflecting the relationships between the sidewall spacers SW3a and SW4a and the sidewall spacers SW3b and SW4b such that the respective widths W3a and W4a of the sidewall spacers SW3a and SW4a are smaller than the respective widths W3b and W4b of the sidewall spacers SW3b and SW4b, the respective dimensions L3a and L4a of the n⁻-type semiconductor regions E3a and E4a are smaller than the respective dimensions L3b and L4b of the n⁻-type semiconductor regions E3b and E4b (L3a=L4a<L4b=L3b).

In the memory cell regions 1A and 1B, reflecting the relationships between the sidewall spacers SW1a, SW2a, and SW2b given by W1a=W2a=W2b, a dimension L1a of the n⁻-type semiconductor region E1a, a dimension L2a of the n⁻-type semiconductor region E2a, and a dimension L2b of the n⁻-type semiconductor region E2b are substantially equal (L1a=L2a=L2b). In addition, reflecting the relationships between the sidewall spacer SW1b and the sidewall spacers SW1a, SW2a, and SW2a such that the width W1b of the sidewall spacer SW1b is smaller than the respective widths W1a, W2a, and W2b of the sidewall spacers SW1a, SW2a, and SW2b (W1b<W1a=W2a=W2b), the dimension L1b of the n⁻-type semiconductor region E1b is smaller than each of the respective dimensions L1a, L2a, and L2b of the n⁻-type semiconductor regions E1a, E2a, and E2b (L1b<L1a=L2a=L2b).

The dimension L1a of the n⁻-type semiconductor region E1a mentioned herein is the dimension (length) of the n⁻-type semiconductor region E1a in the gate length direction of the memory gate electrode MG1. The dimension L2a of the n⁻-type semiconductor region E2a mentioned herein is the dimension of the n⁻-type semiconductor region E2a in the gate length direction of the control gate electrode CG1. The dimension L1b of the n⁻-type semiconductor region E1b mentioned herein is the dimension of the n⁻-type semiconductor region E1b in the gate length direction of the memory gate electrode MG2. The dimension L2b of the n⁻-type semiconductor region E2b mentioned herein is the dimension of the n⁻-type semiconductor region E2b in the gate length direction of the control gate electrode CG2. The respective dimensions L3a and L4a of the n⁻-type semiconductor regions E3a and E4a are the respective dimensions of the n⁻-type semiconductor regions E3a and E4a in the gate length direction of the gate electrode GE1. The respective dimensions L3b and L4b of the n⁻-type semiconductor regions E3b and E4b are the respective dimensions of the n⁻-type semiconductor regions E3b and E4b in the gate length direction of the gate electrode GE2.

Since the relationship given by W1b<W1a is established, the distance from the side surface of the sidewall spacer SW1b to the memory gate electrode MG2 (the side surface thereof) in the gate length direction of the memory gate electrode MG2 is smaller than the distance from the side surface of the sidewall spacer SW1a to the memory gate electrode MG1 (the side surface thereof) in the gate length direction of the memory gate electrode MG1. Also, since the relationship given by W2b=W2a is satisfied, the distance from the side surface of the sidewall spacer SW2b to the control gate electrode CG2 (the side surface thereof) in the gate length direction of the control gate electrode CG2 is substantially equal to the distance from the side surface of the sidewall spacer SW2a to the control gate electrode CG1 (the side surface thereof) in the gate length direction of the control gate electrode CG1. The respective side surfaces of the sidewall spacers SW's and SW1b mentioned herein correspond to the respective side surfaces of the sidewall spacers SW's and SW1b opposite to the respective side surfaces thereof adjacent to the memory gate electrodes (MG1 and MG2). The respective side surfaces of the sidewall spacers SW2a and SW2b mentioned herein correspond to the respective side surfaces of the sidewall spacers SW2a and SW2b opposite to the respective side surfaces thereof adjacent to the control gate electrodes (CG1 and CG2).

Note that, in the case where the offset spacer OS1 is not formed, the distance from the side surface of the sidewall spacer SW1b to the memory gate electrode MG2 in the gate length direction of the memory gate electrode MG2 is equal to the foregoing width W1b. In the case where the offset spacer OS1 is formed, the distance from the side surface of the sidewall spacer SW1b to the memory gate electrode MG2 in the gate length direction of the memory gate electrode MG2 has a value obtained by adding the width (width in the gate length direction of the memory gate electrode MG1) of the offset spacer OS1 to the foregoing width W1b. The same idea can also hold true for the sidewall spacers SW1a, SW2a, and SW2b.

<About Operations in Nonvolatile Memory>

Next, a description will be given of an example of operations in the nonvolatile memory with reference to FIG. 8.

FIG. 8 is a table showing an example of conditions under which voltages are applied to the individual portions of the selected memory cell during "Write", "Erase", and "Read" operations in Embodiment 1. In the table of FIG. 8, a voltage Vmg is the voltage applied to each of the memory gate electrodes MG, a voltage Vs is the voltage applied to each of the semiconductor regions S1, a voltage Vcg is the voltage applied to each of the control gate electrodes CG, a voltage Vd is the voltage applied to each of the semiconductor regions D1, and a base voltage Vb is the base voltage applied to each of the p-type wells PW1. The table of FIG. 8 shows a preferred example of the conditions for voltage application, and the conditions for voltage application are not limited thereto. In Embodiment 1, the injection of electrons into a charge storage portion (which is the insulating film MZ2 herein) in the insulating film MZ of each of the memory transistors is defined as the "Write" operation, and the injection of holes (positive holes) into the charge storage portion in the insulating film MZ of the memory transistor is defined as the "Erase" operation. Note that, in the table of FIG. 8, the row A corresponds to the case where an SSI method is used as a write method and a BTBT method is used as an erase method. The row B corresponds to the case where the SSI method is used as the write method and a FN method is used as the erase method. The row C corresponds to the case where the FN method is used as the write method and the BTBT method is used as the erase method. The row D corresponds to the case where the FN method is used as each of the write method and the erase method.

A write method is subdivided into a write method called the SSI (Source Side Injection) method which performs a write operation by performing hot electron injection in accordance with source side injection and a write method called the FN (Fowler Nordheim) method which performs a write operation using FN tunneling.

A write operation in accordance with the SSI method is performed by applying, e.g., such voltages as shown as "Write Operation Voltages" in the row A or B in the table of FIG. 8 to the individual portions of the selected memory cell to which the write operation is to be performed and injecting electrons into the insulating film MZ2 in the insulating film MZ of the selected memory cell. At this time, hot electrons are generated in the channel region (between the source and drain regions) under the space between the two gate electrodes (memory gate electrode MG and control gate electrode CG) and injected into the charge storage portion (insulating film MZ2) in the insulating film MZ under the memory gate electrode MG. The injected hot electrons are trapped by the trap level in the insulating film MZ2, resulting in an increase in the threshold voltage of the memory transistor. That is, the memory transistor is brought into a written state.

A write operation in accordance with the FN method is performed by applying, e.g., such voltages as shown as "Write Operation Voltages" in the row C or D in the table of FIG. 8 to the individual portions of the selected memory cell to which the write operation is to be performed and causing tunneling of electrons from the memory gate electrode MG and injection thereof into the insulating film MZ2 in the insulating film MZ of the selected memory cell. The injected electrons are trapped by the trap level in the insulating film MZ2, resulting in an increase in the threshold voltage of the memory transistor. That is, the memory transistor is brought into the written state.

An erase method is subdivided into an erase method called the BTBT (Band-To-Band Tunneling phenomenon) method which performs an erase operation by hot hole injection using the BTBT and an erase method called the FN method which performs an erase operation using the FN tunneling.

An erase operation in accordance with the BTBT method is performed by injecting holes generated by the BTBT into the charge storage portion (insulating film MZ2 in the insulating film MZ). For example, such voltages as shown as "Erase Operation Voltages" in the row A or C in the table of FIG. 8 are applied to the individual portions of the selected memory cell to which the erase operation is to be performed. Thus, the holes are generated using the BTBT phenomenon and subjected to electric field acceleration to be injected into the insulating film MZ2 in the insulating film MZ of the selected memory cell, thus reducing the threshold voltage of the memory transistor. That is, the memory transistor is brought into an erased state.

An erase operation in accordance with the FN method is performed by applying, e.g., such voltages as shown as "Erase Operation Voltages" in the row B or D in the table of FIG. 8 to the individual portions of the selected memory cell to which the erase operation is to be performed and causing tunneling of holes from the memory gate electrode MG and injection thereof into the insulating film MZ2 in the insulating film MZ. The injected holes are trapped by the trap level in the insulating film MZ2, resulting in a reduction in the threshold voltage of the memory transistor. That is, the memory transistor is brought into an erased state.

During a read operation, e.g., such voltages as shown as "Read Operation Voltages" in the row A, B, C, or D in the table of FIG. 8 are applied to the individual portions of the selected memory cell to which the read operation is to be performed. By setting the voltage Vmg to be applied to the memory gate electrode MG during the read operation to a value between the threshold voltage of the memory transistor in the written state and the threshold voltage thereof in the erased state, the written state or the erased state can be determined.

<About Manufacturing Process of Semiconductor Device>

Next, a description will be given of a manufacturing method of the semiconductor device in Embodiment 1.

Figure 9:
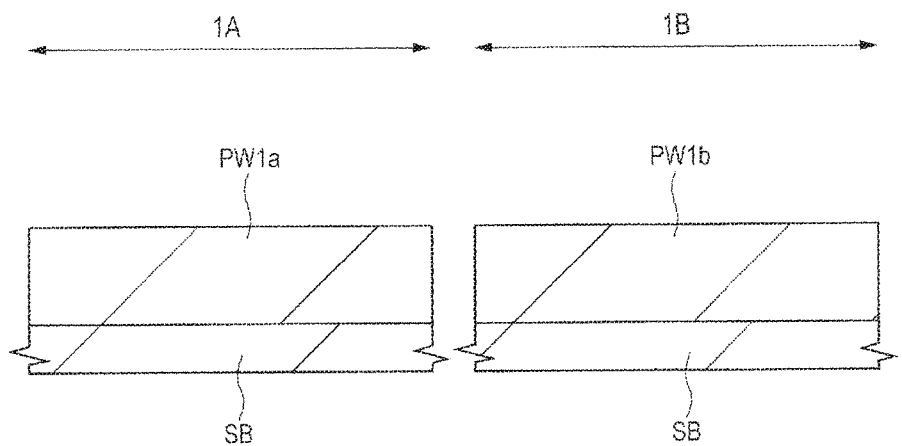
FIG. 9 is a main-portion cross-sectional view of the semiconductor device in the embodiment during the manufacturing process thereof.
Figure 68:
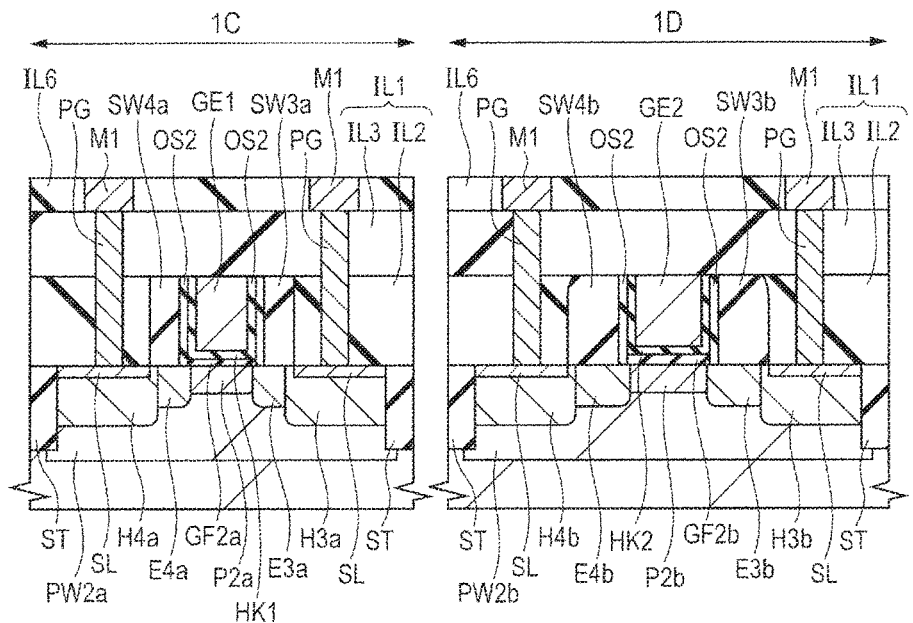
FIG. 68 is a main-portion cross-sectional view of the semiconductor device during the manufacturing process thereof, which is similar to FIG. 67.

FIGS. 9 to 68 are main-portion cross-sectional views of the semiconductor device in Embodiment 1 during a manufacturing process thereof. FIGS. 9 to 68 show cross-sectional views of regions corresponding to FIG. 1 described above or cross-sectional views of regions corresponding to FIG. 2 described above.

Figure 10:
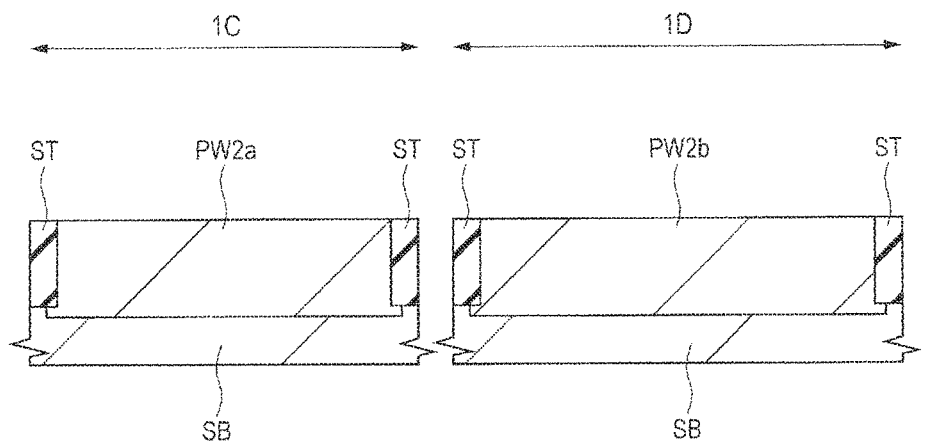
FIG. 10 is a main-portion cross-sectional view of the semiconductor device during the manufacturing process thereof, which is similar to FIG. 9.

As shown in FIGS. 9 and 10, first, the semiconductor substrate (semiconductor wafer) SB made of p-type monocrystalline silicon having a specific resistance of, e.g., about 1 to 10 Ωcm or the like is provided. Then, in the main surface of the semiconductor substrate SB, the isolation regions ST defining active regions are formed. The isolation regions ST are made of an insulator such as silicon dioxide and can be formed by, e.g., a STI (Shallow Trench Isolation Method) or the like.

Next, the p-type wells PW1a, PW1b, PW2a, and PW2b are formed respectively in the semiconductor substrate SB located in the memory cell region 1A, the semiconductor substrate SB located in the memory cell region 1B, the semiconductor substrate SB located in the lower-breakdown-voltage MIS region 1C, and the semiconductor substrate SB located in the higher-breakdown-voltage MIS region 1D. Each of the p-type wells PW1a, PW1b, PW2a, and PW2b can be formed by ion-implanting a p-type impurity such as, e.g., boron (B) into the semiconductor substrate SB and is formed over a predetermined depth from the main surface of the semiconductor substrate SB.

Figure 11:
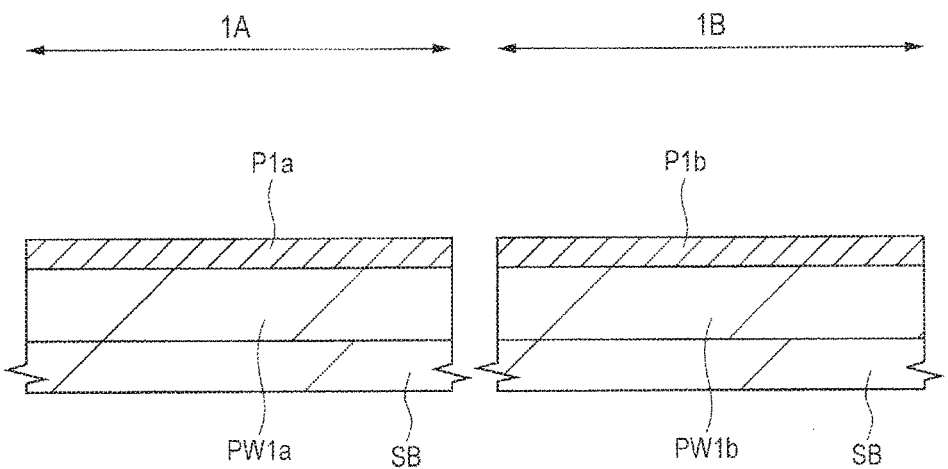
FIG. 11 is a main-portion cross-sectional view of the semiconductor device during the manufacturing process thereof, which is subsequent to FIG. 9.
Figure 12:
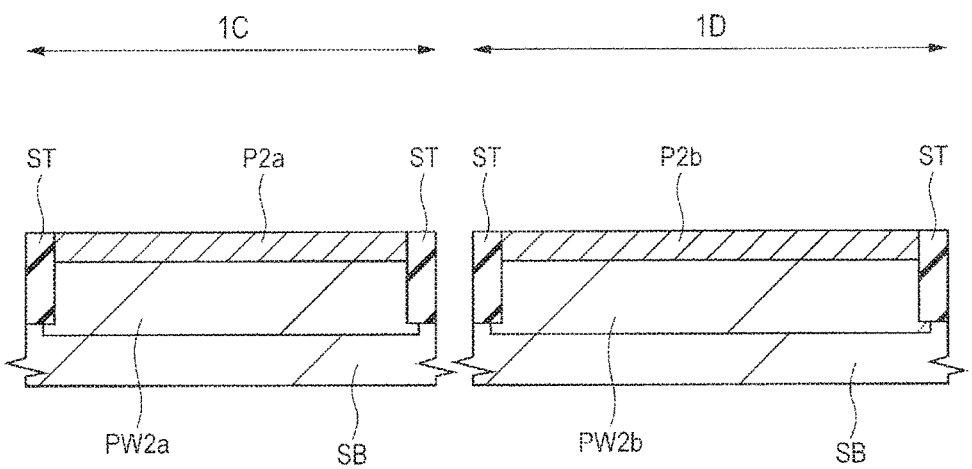
FIG. 12 is a main-portion cross-sectional view of the semiconductor device during the manufacturing process thereof, which is similar to FIG. 11.

Next, into the surface layer portion of the semiconductor substrate SB located in each of the memory cell regions 1A and 1B, the lower-breakdown-voltage MIS region 1C, and the higher-breakdown-voltage MIS region 1D (p-type wells PW1a, PW1b, PW2a, and PW2b), a p-type impurity such as boron (B) is implanted by performing channel doping ion implantation. Thus, as shown in FIG. 11, in the surface layer portion of the semiconductor substrate SB (p-type well PW1a) located in the memory cell region 1A, a p-type semiconductor region P1a having a concentration higher than that of the p-type well PW1a is formed and, in the surface layer portion of the semiconductor substrate SB (p-type well PW1b) located in the memory cell region 1B, a p-type semiconductor region P1b having a concentration higher than that of the p-type well PW1b is formed. Also, as shown in FIG. 12, in the surface layer portion of the semiconductor substrate SB (p-type well PW2a) located in the lower-breakdown-voltage MIS region 1C, a p-type semiconductor region P2a having a concentration higher than that of the p-type well PW2a is formed and, in the surface layer portion of the semiconductor substrate SB (p-type well PW2b) located in the higher-breakdown-voltage MIS region 1D, a p-type semiconductor region P2b having a concentration higher than that of the p-type well PW2b is formed.

In the memory cell region 1A, the impurity concentration of a channel formation region (CC1) of the control transistor is mainly defined by the impurity concentration of the p-type semiconductor region P1a. In the memory cell region 1B, the impurity concentration of a channel formation region (CC2) of the control transistor is mainly defined by the impurity concentration of the p-type semiconductor region P1b.

In Embodiment 1 and Embodiment 2 described later, channel doping ion implantation for the memory cell region 1A (ion implantation for forming the p-type semiconductor region P1a) and channel doping ion implantation for the memory cell region 1B (ion implantation for forming the p-type semiconductor region P1b) can be simultaneously performed by the same ion implantation step. That is, the p-type semiconductor regions P1a and P1b are formed by the same ion implantation step. Accordingly, the formed p-type semiconductor regions P1a and P1b have substantially equal impurity concentrations.

Channel doping ion implantation for the semiconductor substrate SB located in the lower-breakdown-voltage MIS region 1C and/or the higher-breakdown-voltage MIS region 1D and the channel doping ion implantation for the semiconductor substrate SB located in the memory cell regions 1A and 1B can be performed by the same ion implantation step, but can also be performed by different ion implantation steps. Accordingly, the impurity concentrations of the p-type semiconductor region P2a and/or the p-type semiconductor region P2b may be the same as the impurity concentrations of the p-type semiconductor regions P1a and P1b or different from the impurity concentrations of the p-type semiconductor regions P1a and P1b.

Figure 13:
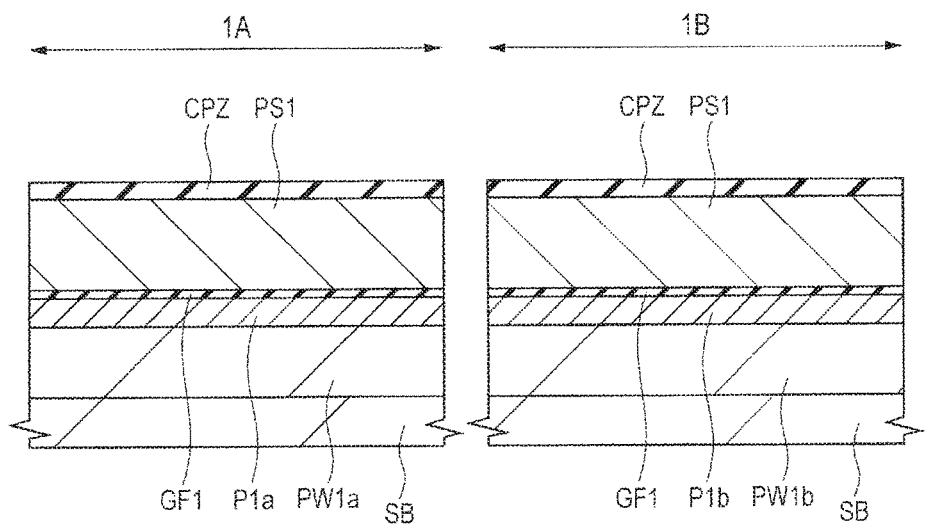
FIG. 13 is a main-portion cross-sectional view of the semiconductor device during the manufacturing process thereof, which is subsequent to FIG. 11.
Figure 14:
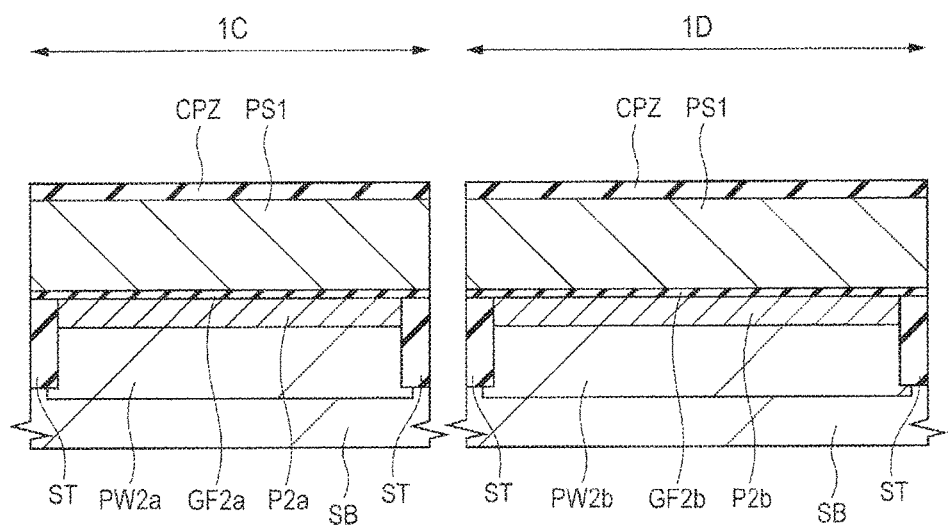
FIG. 14 is a main-portion cross-sectional view of the semiconductor device during the manufacturing process thereof, which is similar to FIG. 13.

Next, as shown in FIGS. 13 and 14, the insulating films GF1, GF2a, and GF2b are formed. The insulating film GF1 is formed over the top surface of the semiconductor substrate SB located in the memory cell regions 1A and 1B. The insulating film GF2a is formed over the top surface of the semiconductor substrate SB located in the lower-breakdown-voltage MIS region 1C. The insulating film GF2b is formed over the top surface of the semiconductor substrate SB located in the higher-breakdown-voltage MIS region 1D.

Each of the insulating films GF1, GF2a, and GF2b is made of, e.g., a silicon dioxide film or a silicon oxynitride film and can be formed using a film deposition technique based on a thermal oxidation method or a CVD method, a photolithographic technique, and a wet etching technique. The thickness of the insulating film GF2b in the higher-breakdown-voltage MIS region 1D is larger than the thickness of the insulating film GF1 in each of the memory cell regions 1A and 1B and the thickness of the insulating film GF2a in the lower-breakdown-voltage MIS region 1C and can be, e.g., about 3 to 20 nm. The thickness of the insulating film GF1 in the memory cell region 1A, the thickness of the insulating film GF1 in the memory cell region 1B, and the thickness of the insulating film GF2a in the lower-breakdown-voltage MIS region 1C are substantially equal and can be, e.g., about 1 to 5 nm.

The step of forming the insulating films GF1, GF2a, and GF2b can be performed, e.g., as follows. That is, the top surface of the semiconductor substrate SB is cleaned first by diluted hydrofluoric acid cleaning or the like. Then, over the top surface of the semiconductor substrate SB, a silicon dioxide film for the insulating film GF2b is formed using a thermal oxidation method or the like. Then, using a photolithographic technique and an etching technique, the silicon dioxide film for the insulating film GF2b is removed from the memory cell regions 1A and 1B and the lower-breakdown-voltage MIS region 1C, while the silicon dioxide film for the insulating film GF2b is left in the higher-breakdown-voltage MIS region 1D. Then, using a thermal oxidation method, the silicon dioxide film for each of the insulating films GF1 and GF2a is formed over the top surface of the semiconductor substrate SB located in the memory cell regions 1A and 1B and the lower-breakdown-voltage MIS region 1C. Thus, a structure is obtained in which the insulating film GF1 is formed over the top surface of the semiconductor substrate SB located in the memory cell regions 1A and 1B, the insulating film GF2a is formed over the top surface of the semiconductor substrate SB located in the lower-breakdown-voltage MIS region 1C, and the insulating film GF2b is formed over the top surface of the semiconductor substrate SB located in the higher-breakdown-voltage MIS region 1D. FIG. 14 shows the case where the insulating films GF2a and GF2b are formed over the isolation regions ST but, in the case where the insulating films GF1, GF2a, and GF2b are formed using a thermal oxidation method, the insulating films GF1, GF2a, and GF2b are not formed over the isolation regions ST.

Next, over the entire main surface of the semiconductor substrate SB, i.e., over the insulating films GF1, GF2a, and GF2b, a silicon film PS1 is formed as a conductive film for forming the control gate electrodes CG.

The silicon film PS1 is made of a polysilicon film and can be formed using a CVD (Chemical Vapor Deposition) method or the like. It is also possible to form an amorphous silicon film as the polysilicon film PS1 during the deposition thereof and then change the polysilicon film PS1 made of the amorphous silicon film to the silicon film PS1 made of the polysilicon film by subsequent heat treatment. The silicon film PS1 can be changed to a low-resistivity doped polysilicon film by introducing an n-type impurity into the silicon film PS1 by ion implantation after the deposition thereof or by introducing an n-type impurity into the silicon film PS1 using a film deposition gas during the deposition thereof. An n-type impurity is introduced into the silicon film PS1 located in the memory cell regions 1A and 1B, but the silicon film PS1 in the lower-breakdown-voltage MIS region 1C and the higher-breakdown-voltage MIS region 1D may also be a non-doped silicon film.

Next, over the silicon film PS1, an insulating film CPZ is formed. The insulating film CPZ is made of, e.g., a silicon nitride film and can be formed using a CVD method or the like.

Figure 15:
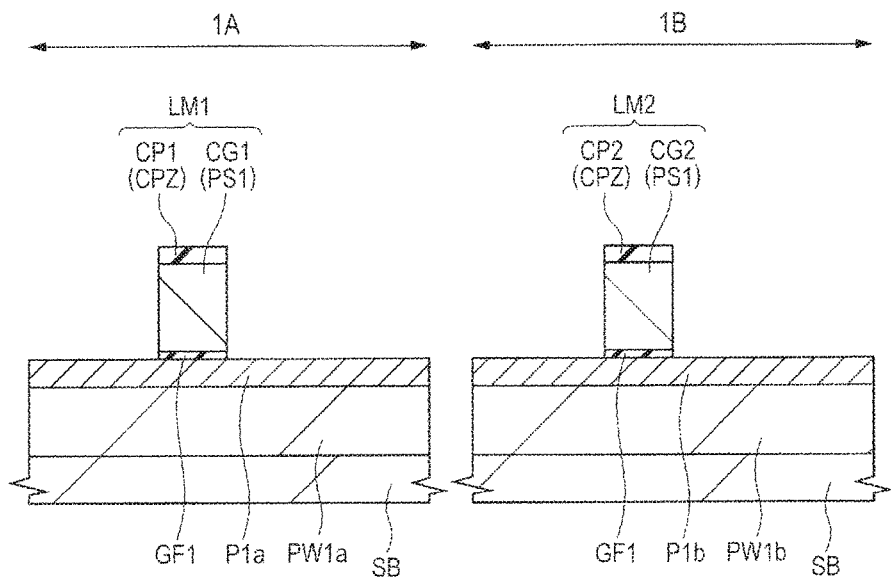
FIG. 15 is a main-portion cross-sectional view of the semiconductor device during the manufacturing process thereof, which is subsequent to FIG. 13.
Figure 16:
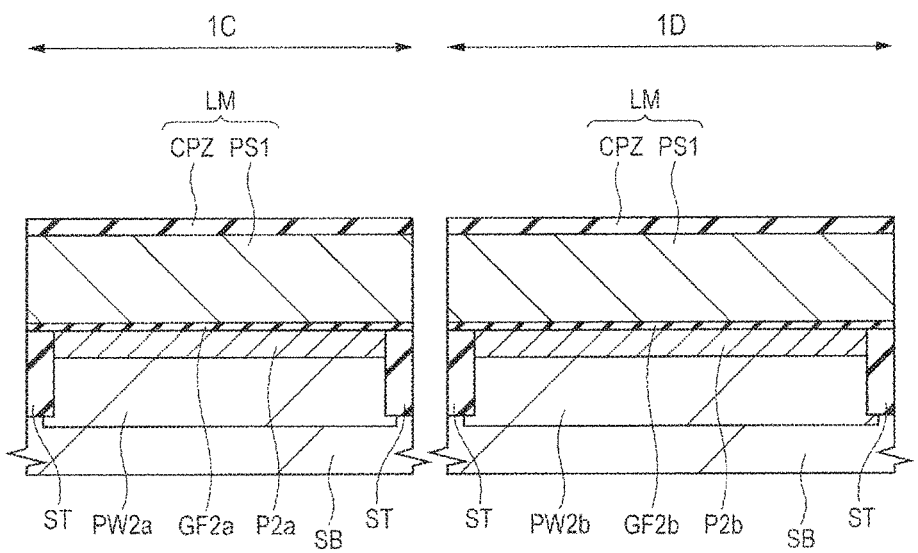
FIG. 16 is a main-portion cross-sectional view of the semiconductor device during the manufacturing process thereof, which is similar to FIG. 15.

Next, as shown in FIGS. 15 and 16, a multi-layer film including the silicon film PS1 and the insulating film CPZ is patterned using a photolithographic technique and an etching technique. As a result, in the memory cell region 1A, a multi-layer body LM1 including the control gate electrode CG1 made of the patterned silicon film PS1 and a cap insulating film CP1 made of the patterned insulating film CPZ is formed. Also, in the memory cell region 1B, a multi-layer body LM2 including the control gate electrode CG2 made of the patterned silicon film PS1 and a cap insulating film CP2 made of the patterned insulating film CPZ is formed. At this time, in the lower-breakdown-voltage MIS region 1C and the higher-breakdown-voltage MIS region 1D, the multi-layer film including the silicon film PS1 and the insulating film CPZ is not patterned and remains unchanged. It is assumed that the multi-layer film including the silicon film PS1 and the insulating film CPZ remaining in each of the lower-breakdown-voltage MIS region 1C and the higher-breakdown-voltage MIS region 1D is referred to as a multi-layer film LM.

In the memory cell regions 1A and 1B, the insulating film GF1 remaining under each of the multi-layer bodies LM1 and LM2 serves as the gate insulating film of each of the control transistors. Accordingly, in the memory cell region 1A, the control gate electrode CG1 is formed over the semiconductor substrate SB (p-type well PW1a) via the insulating film GF1 as the gate insulating film, and the cap insulating film CP1 having substantially the same two-dimensional shape as that of the control gate electrode CG1 is formed over the control gate electrode CG1. In the memory cell region 1B, the control gate electrode CG2 is formed over the semiconductor substrate SB (p-type well PW1b) via the insulating film GF1 as the gate insulating film, and the cap insulating film CP2 having substantially the same two-dimensional shape as that of the control gate electrode CG2 is formed over the control gate electrode CG2. In the memory cell regions 1A and 1B, the insulating films GF1 except for the portions thereof covered with the control gate electrodes CG1 and CG2 may be removed by dry etching performed in the patterning step or by wet etching performed after the dry etching.

Figure 17:
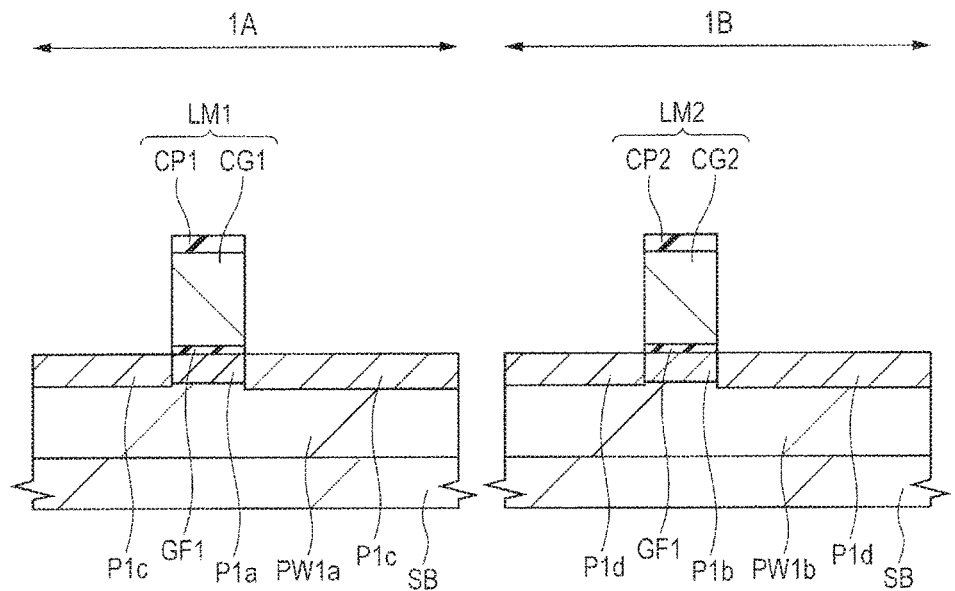
FIG. 17 is a main-portion cross-sectional view of the semiconductor device during the manufacturing process thereof, which is subsequent to FIG. 15.
Figure 18:
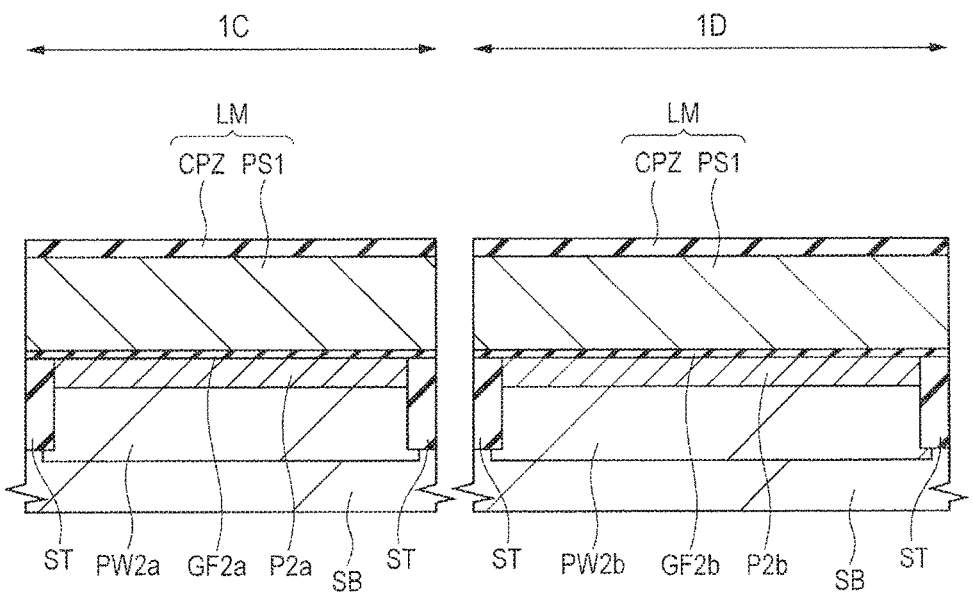
FIG. 18 is a main-portion cross-sectional view of the semiconductor device during the manufacturing process thereof, which is similar to FIG. 17.

Next, into the surface layer portion of the semiconductor substrate SB located in each of the memory cell regions 1A and 1B (p-type wells PW1a and PW1b), an n-type impurity such as arsenic (As) is implanted by performing channel doping ion implantation using the multilayer bodies LM1 and LM2 as a mask (ion implantation inhibition mask). Thus, as shown in FIG. 17, in the memory cell region 1A, the n-type impurity is implanted into the surface layer portion of the part of the semiconductor substrate SB (p-type well PW1a) which is uncovered with the multi-layer body LM1 to form a p-type semiconductor region P1c having an effective p-type impurity concentration lower than that of the p-type semiconductor region P1a. Also, in the memory cell region 1B, the n-type impurity is implanted into the surface layer portion of the part of the semiconductor substrate SB (p-type well PW1b) which is uncovered with the multi-layer body LM2 to form a p-type semiconductor region P1d having an effective p-type impurity concentration lower than that of the p-type semiconductor region P1b. The p-type semiconductor region P1c has the effective p-type impurity concentration lower than that of the p-type semiconductor region P1a due to the ion-implanted n-type impurity that has cancelled out a part of the already existing p-type impurity. Also, the p-type semiconductor region P1d has the effective p-type impurity concentration lower than that of the p-type semiconductor region P1b due to the ion-implanted n-type impurity that has cancelled out a part of the already existing p-type impurity.

The effective impurity concentration in a region containing only a p-type impurity as a polarity impurity corresponds to the concentration of the p-type impurity. The effective impurity concentration in a region containing only an n-type impurity as a polarity impurity corresponds to the concentration of the n-type impurity. The effective impurity concentration in a region containing both a p-type impurity and an n-type impurity corresponds to the concentration of the remaining impurity (p-type or n-type impurity) after the p-type impurity and the n-type impurity which have cancelled out each other are removed. Accordingly, in a region containing both a p-type impurity and an n-type impurity, the difference between the respective concentrations of the p-type impurity and the n-type impurity corresponds to the effective impurity concentration. The effective impurity concentration can also be regarded as the charge density of an impurity.

In the memory cell region 1A, the impurity concentration of the channel formation region (CM1) of the memory transistor is mainly defined by the impurity concentration in the p-type semiconductor region P1c. Also, in the memory cell region 1B, the impurity concentration in the channel formation region (CM2) of the memory transistor is mainly defined by the impurity concentration of the p-type semiconductor region P1d.

In Embodiment 1, channel doping ion implantation for the memory cell region 1A (ion implantation for forming the p-type semiconductor region P1c) and channel doping ion implantation for the memory cell region 1B (ion implantation for forming the p-type semiconductor region P1d) can simultaneously be performed by the same ion implantation step. That is, in Embodiment 1, the p-type semiconductor regions P1c and P1d can be formed by the same ion implantation step. Accordingly, in Embodiment 1, an impurity is implanted at the same dose into each of the p-type semiconductor regions P1c and P1d so that the formed p-type semiconductor regions P1c and P1d have substantially equal effective p-type impurity concentrations.

Note that, in the case of Embodiment 2 described later, channel doping ion implantation for the memory cell region 1A (ion implantation for forming the p-type semiconductor region P1c) and channel doping ion implantation for the memory cell region 1B (ion implantation for forming the p-type semiconductor region P1d) are performed by different ion implantation steps. That is, in the case of Embodiment 2 described later, the p-type semiconductor regions P1c and P1d are formed by different ion implantation steps. A dose in the ion implantation for forming the p-type semiconductor region P1c is different from a dose in the ion implantation for forming the p-type semiconductor region P1d. Specifically, the dose of the n-type impurity in the ion implantation for forming the p-type semiconductor region P1d is higher than the dose of the n-type impurity in the ion implantation for forming the p-type semiconductor region P1c. Accordingly, in the case of Embodiment 2 described later, the effective p-type impurity concentration of the formed p-type semiconductor region P1d is lower than the effective p-type impurity concentration of the formed p-type semiconductor region P1c.

Figure 19:
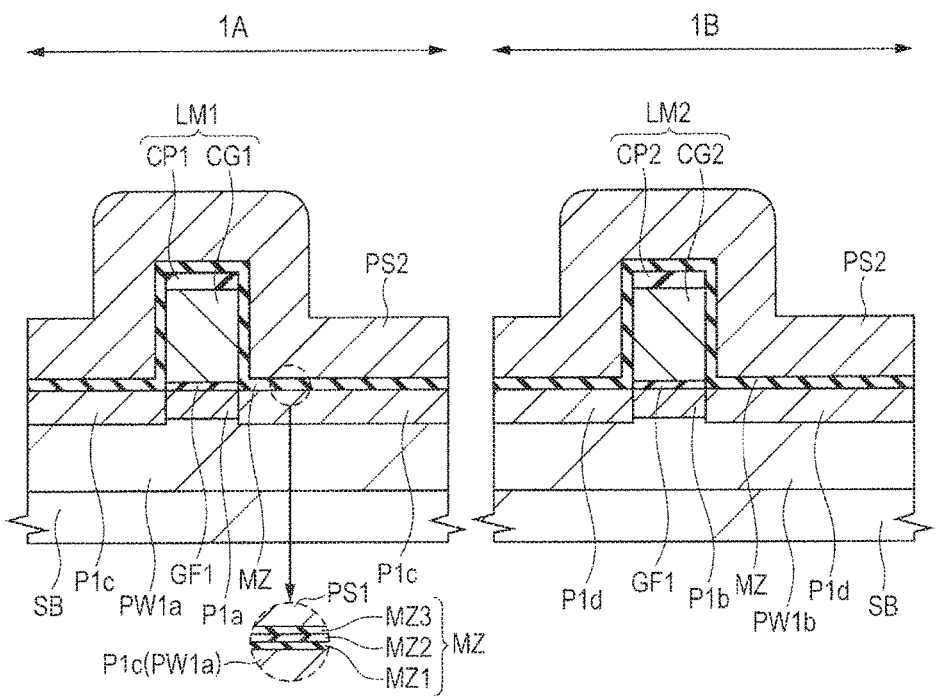
FIG. 19 is a main-portion cross-sectional view of the semiconductor device during the manufacturing process thereof, which is subsequent to FIG. 17.
Figure 20:
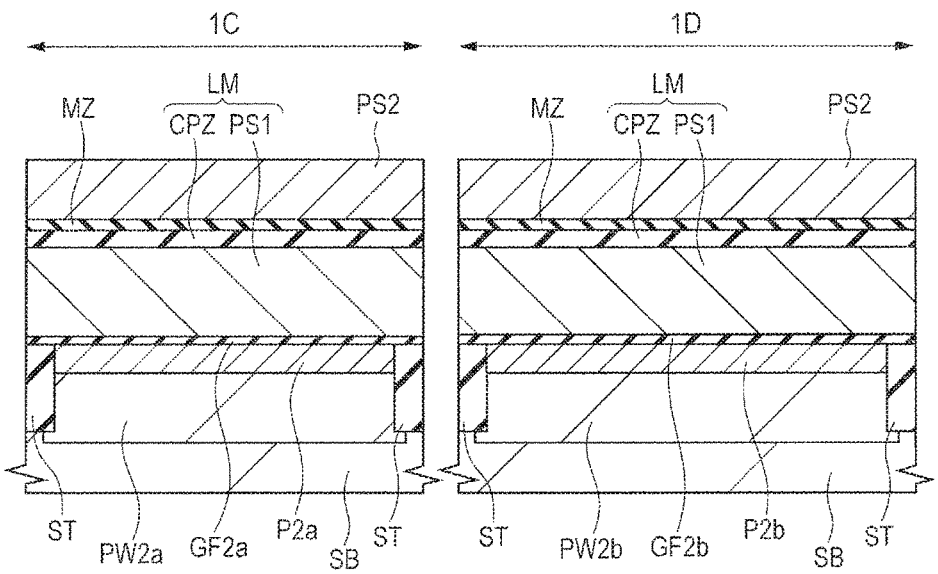
FIG. 20 is a main-portion cross-sectional view of the semiconductor device during the manufacturing process thereof, which is similar to FIG. 19.

Next, a cleaning process is performed to clean the main surface of the semiconductor substrate SB. Then, as shown in FIGS. 19 and 20, over the entire main surface of the semiconductor substrate SB, i.e., over the top surface of the semiconductor substrate SB and over the upper and side surfaces of the multi-layer bodies LM1 and LM2, the insulating film MZ for the gate insulating films of the memory transistors is formed. At this time, the insulating film MZ may also be formed over the upper and side surfaces of the multi-layer films LM. Accordingly, the insulating film MZ is formed over the semiconductor substrate SB so as to cover the multi-layer bodies LM1 and LM2 and the multi-layer films LM.

The insulating film MZ is the insulating film for the gate insulating films of the memory transistors and has an internal charge storage portion. Note that, for improved clarity of illustration, in FIG. 19, the insulating film MZ including the insulating films MZ1, MZ2, and MZ3 is shown as the single-layer insulating film MZ. However, actually, as shown in the enlarged view of the region enclosed by the dotted circle in FIG. 19, the insulating film MZ is made of the multi-layer film including the insulating film MZ1, the insulating film MZ2 over the insulating film MZ1, and the insulating film MZ3 over the insulating film MZ2.

To form the insulating film MZ, e.g., the insulating film MZ1 made of a silicon dioxide film is formed first by a thermal oxidation, and then the insulating film MZ2 made of a silicon nitride film is deposited over the insulating film MZ1 by a CVD method. Over the insulating film MZ2, the insulating film MZ3 made of a silicon dioxide film is further formed by a CVD method, a thermal oxidation method, or both of the CVD method and the thermal oxidation method. Instead of the silicon dioxide film, a silicon oxynitride film can also be formed.

Next, over the entire main surface of the semiconductor substrate SB, i.e., over the insulating film MZ, a silicon film PS2 is formed as a conductive film for forming the memory gate electrodes MG1 and MG2 so as to cover the multi-layer bodies LM1 and LM2 in the memory cell regions 1A and 1B and cover the multi-layer films LM in the lower-breakdown-voltage MIS region 1C and the higher-breakdown-voltage MIS region 1D.

The silicon film PS2 is made of a polysilicon film and can be formed using a CVD method or the like. It may also be possible to form an amorphous silicon film as the silicon film PS2 during the deposition thereof and then change the silicon film PS2 made of the amorphous silicon film to the silicon film PS2 made of a polysilicon film by subsequent heat treatment. The silicon film PS2 has a low resistivity due to the n-type impurity introduced therein by ion implantation during or after the deposition thereof.

Figure 21:
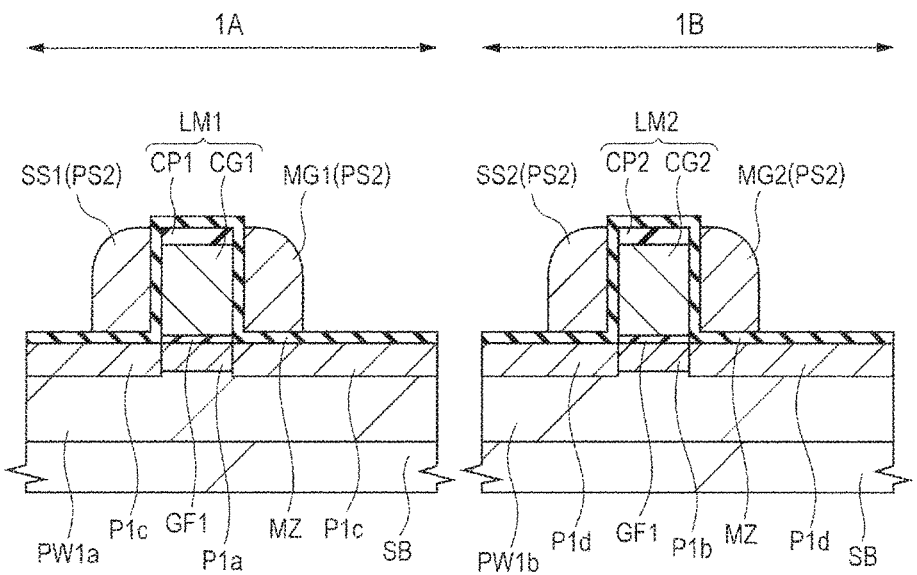
FIG. 21 is a main-portion cross-sectional view of the semiconductor device during the manufacturing process thereof, which is subsequent to FIG. 19.
Figure 22:
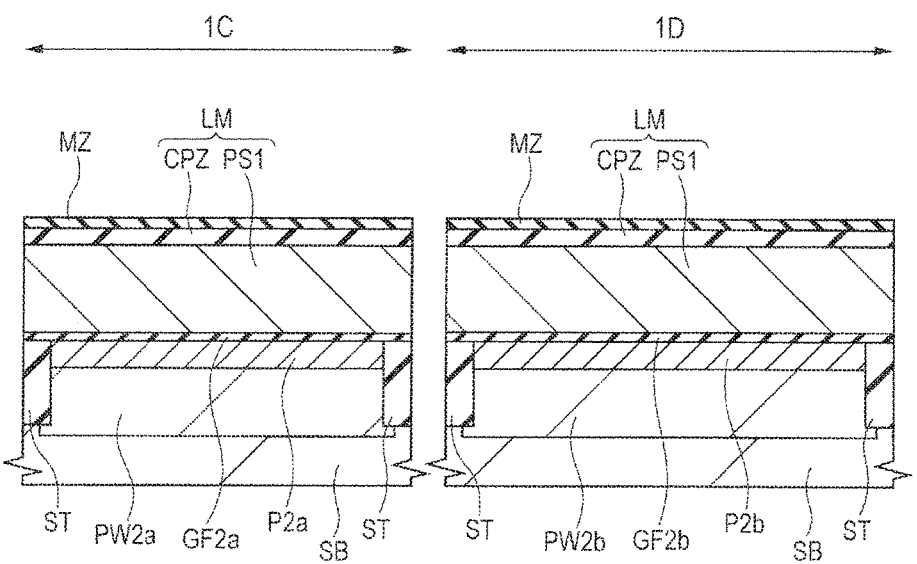
FIG. 22 is a main-portion cross-sectional view of the semiconductor device during the manufacturing process thereof, which is similar to FIG. 21.

Next, using an anisotropic etching technique, the silicon film PS2 is etched back (by etching, dry etching, or anisotropic etching). In the step of etching back the silicon film PS2, the silicon film PS2 is anisotropically etched by the film thickness of the deposited silicon film PS2 to be left in the form of sidewall spacers over the both side surfaces of each of the multi-layer bodies LM1 and LM2 via the insulating films MZ, while being removed from the other region. Thus, as shown in FIG. 21, in the memory cell region 1A, the silicon film PS2 left in the form of the sidewall spacer over one of the side surfaces of the multi-layer body LM1 via the insulating film MZ forms the memory gate electrode MG1, while the silicon film PS2 left in the form of a sidewall spacer over the other side surface of the multi-layer body LM1 via the insulating film MZ forms a silicon spacer SS1. Also, in the memory cell region 1B, the silicon film PS2 left in the form of a sidewall spacer over one of the side surfaces of the multi-layer body LM2 via the insulating film MZ forms the memory gate electrode MG2, while the silicon film PS2 left in the form of a sidewall spacer over the other side surface of the multi-layer body LM2 via the insulating film MZ forms a silicon spacer SS2. In the memory cell region 1A, the memory gate electrode MG1 is formed over the insulating film MZ so as to be adjacent to the multi-layer body LM1 via the insulating film MZ. In the memory cell region 1B, the memory gate electrode MG2 is formed over the insulating film MZ so as to be adjacent to the multi-layer body LM2 via the insulating film MZ. The insulating film MZ in the region uncovered with the memory gate electrodes MG1 and MG2 and the silicon spacers SS1 and SS2 is exposed.

Figure 23:
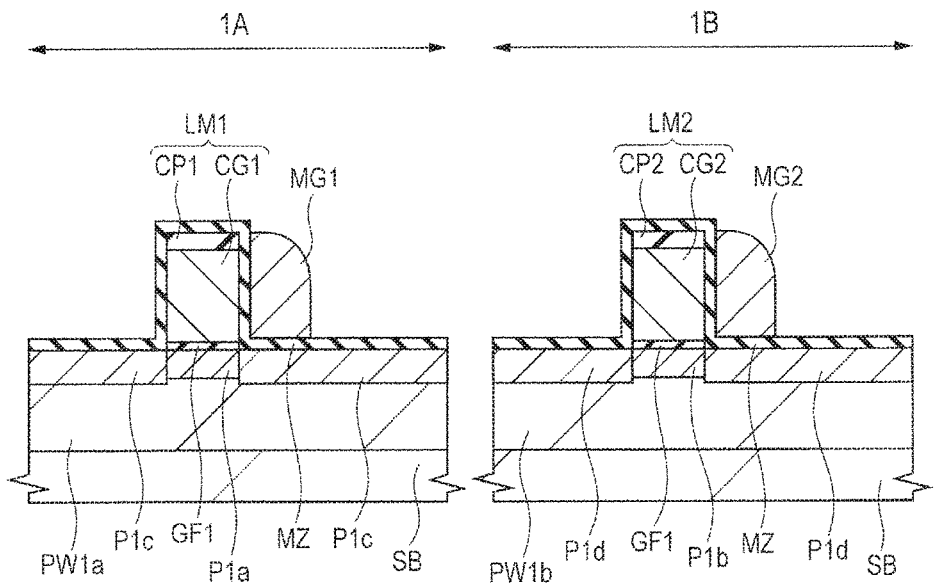
FIG. 23 is a main-portion cross-sectional view of the semiconductor device during the manufacturing process thereof, which is subsequent to FIG. 21.
Figure 24:
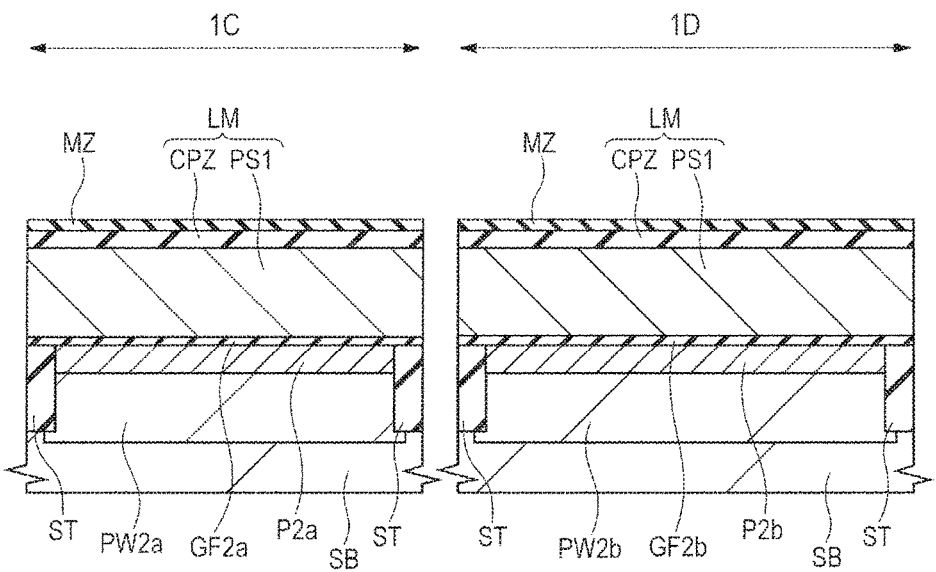
FIG. 24 is a main-portion cross-sectional view of the semiconductor device during the manufacturing process thereof, which is similar to FIG. 23.

Next, using a photolithographic technique, a photoresist pattern (not shown) which covers the memory gate electrodes MG1 and MG2 and exposes the silicon spacers SS1 and SS2 is formed over the semiconductor substrate SB. Then, by dry etching using the photoresist pattern as an etching mask, the silicon spacers SS1 and SS2 are removed. The memory gate electrodes MG1 and MG2 are not etched and remain. Subsequently, the photoresist pattern is removed. FIGS. 23 and 24 show this process stage.

Figure 25:
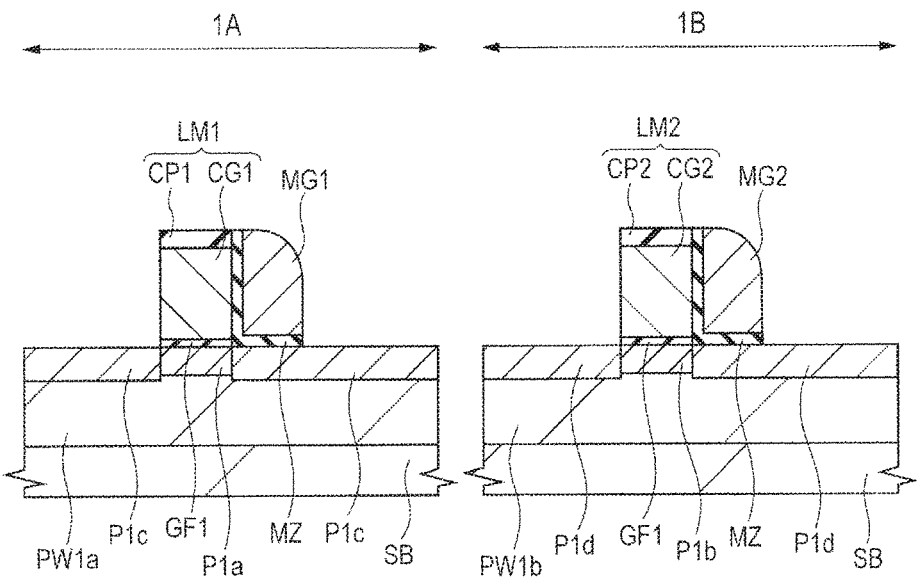
FIG. 25 is a main-portion cross-sectional view of the semiconductor device during the manufacturing process thereof, which is subsequent to FIG. 23.
Figure 26:
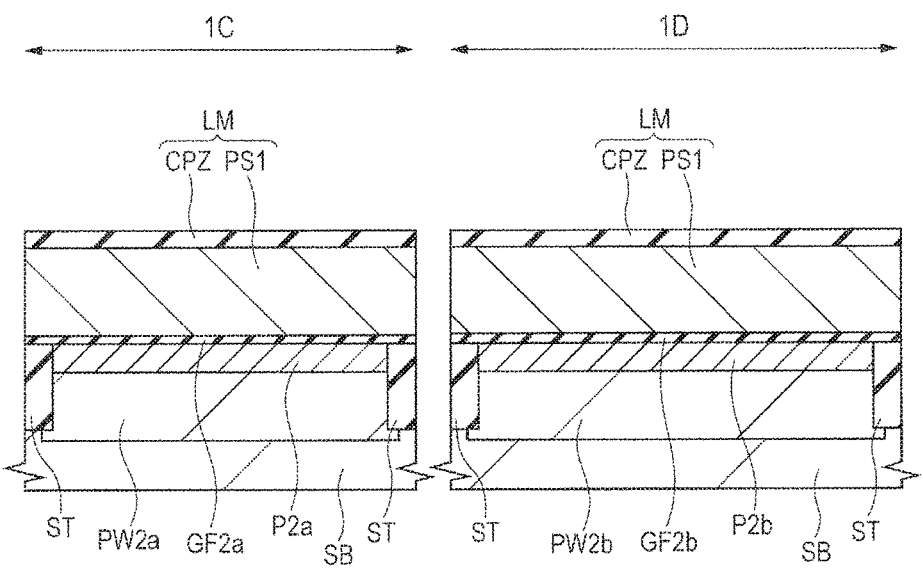
FIG. 26 is a main-portion cross-sectional view of the semiconductor device during the manufacturing process thereof, which is similar to FIG. 25.

Next, as shown in FIGS. 25 and 26, the portion of the insulating film MZ which is uncovered with the memory gate electrodes MG1 and MG2 and exposed is removed by etching (e.g., wet etching). At this time, in the memory cell region 1A, the insulating film MZ located under the memory gate electrode MG1 and between the memory gate electrode MG1 and the multi-layer body LM1 is not removed and remains. In the memory cell region 1B, the insulating film MZ located under the memory gate electrode MG2 and between the memory gate electrode MG2 and the multi-layer body LM2 is not removed and remains, while the insulating film MZ is removed from the other region.

Figure 27:
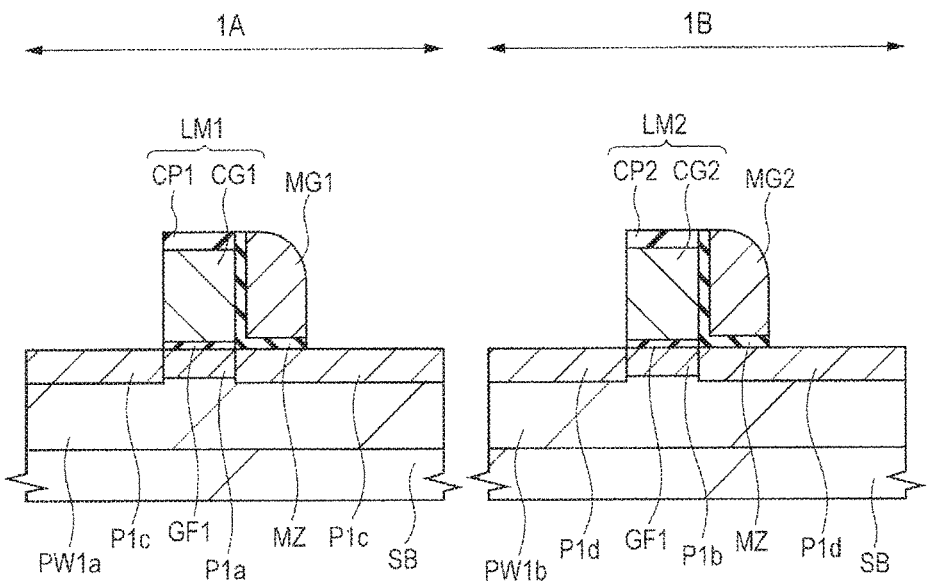
FIG. 27 is a main-portion cross-sectional view of the semiconductor device during the manufacturing process thereof, which is subsequent to FIG. 25.
Figure 28:
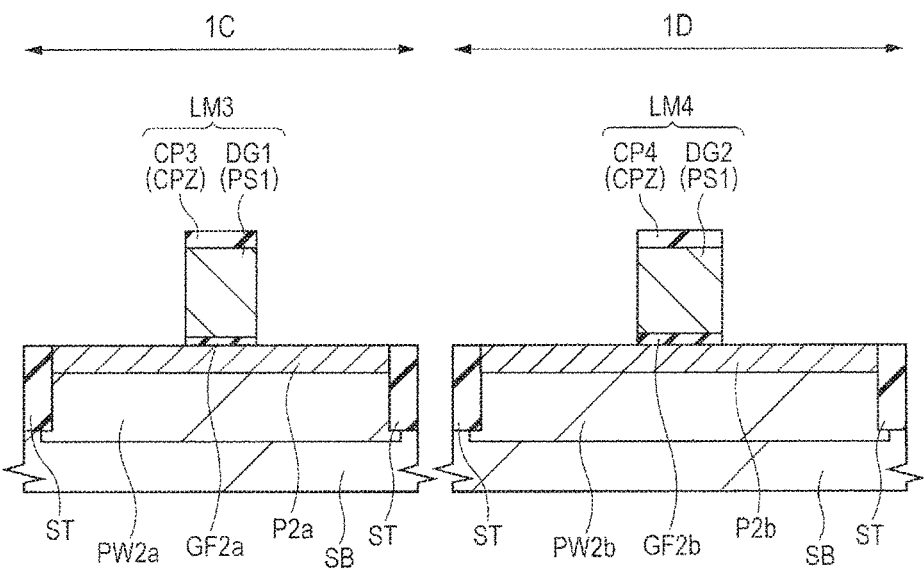
FIG. 28 is a main-portion cross-sectional view of the semiconductor device during the manufacturing process thereof, which is similar to FIG. 27.

Next, as shown in FIGS. 27 and 28, the multi-layer films LM are patterned using a photolithographic technique and an etching technique to form a multi-layer body LM3 made of the patterned multi-layer film LM in the lower-breakdown-voltage MIS region 1C and form a multi-layer body LM4 made of the patterned multi-layer film LM in the higher-breakdown-voltage MIS region 1D. During the patterning, the memory cell regions 1A and 1B are covered with a photoresist pattern (not shown) so that the memory gate electrodes MG1 and MG2 and the multi-layer bodies LM1 and LM2 are not etched and remain.

The multi-layer body LM3 includes the dummy gate electrode (gate electrode to be replaced) DG1 and a cap insulating film CP3 located thereover. The multi-layer body LM4 includes the dummy gate electrode (gate electrode to be replaced) DG2 and a cap insulating film CP4 located thereover. Each of the dummy gate electrodes DG1 and DG2 is made of the patterned silicon film PS1. Each of the cap insulating films CP3 and CP4 is made of the patterned insulating film CPZ.

In the lower-breakdown-voltage MIS region 1C, the insulating film GF2$a$ remains under the multi-layer body LM3. In the higher-breakdown-voltage MIS region 1D, the insulating film GF2$b$ remains under the multi-layer body LM4. In the lower-breakdown-voltage MIS region 1C and the higher-breakdown-voltage MIS region 1D, the insulating films GF2$a$ and GF2$b$ except for the portions thereof covered with the dummy gate electrodes DG1 and DG2 may be removed by dry etching performed in the patterning step or by wet etching performed after the dry etching. As a result, in the lower-breakdown-voltage MIS region 1C, the dummy gate electrode DG1 is formed over the semiconductor substrate SB via the insulating film GF2$a$ and, over the dummy gate electrode DG1, the cap insulating film CP2 having substantially the same two-dimensional shape as that of the dummy gate electrode DG1 is formed. Also, in the higher-breakdown-voltage MIS region 1D, the dummy gate electrode DG2 is formed over the semiconductor substrate SB via the insulating film GF2$b$ and, over the dummy gate electrode DG2, the cap insulating film CP4 having substantially the same two-dimensional shape as that of the dummy gate electrode DG2 is formed.

Figure 29:
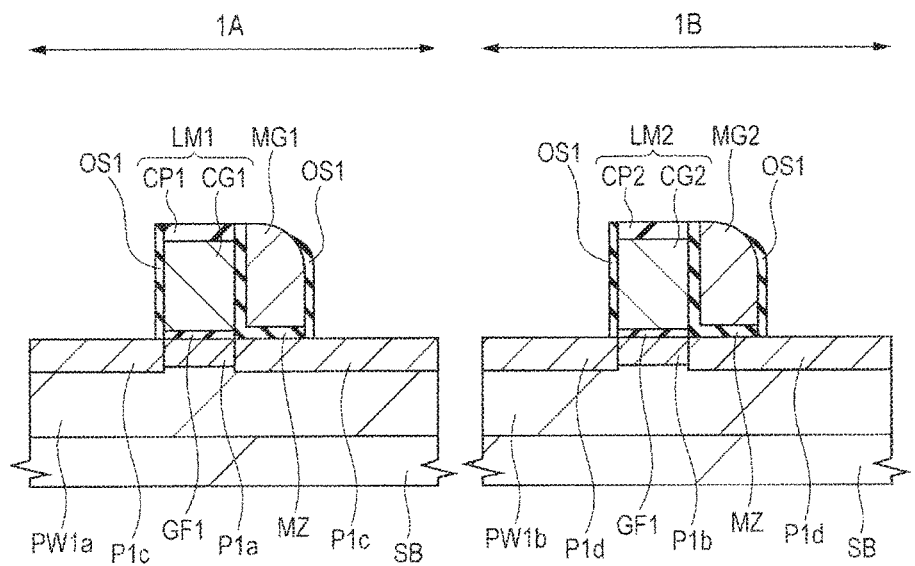
FIG. 29 is a main-portion cross-sectional view of the semiconductor device during the manufacturing process thereof, which is subsequent to FIG. 27.
Figure 30:
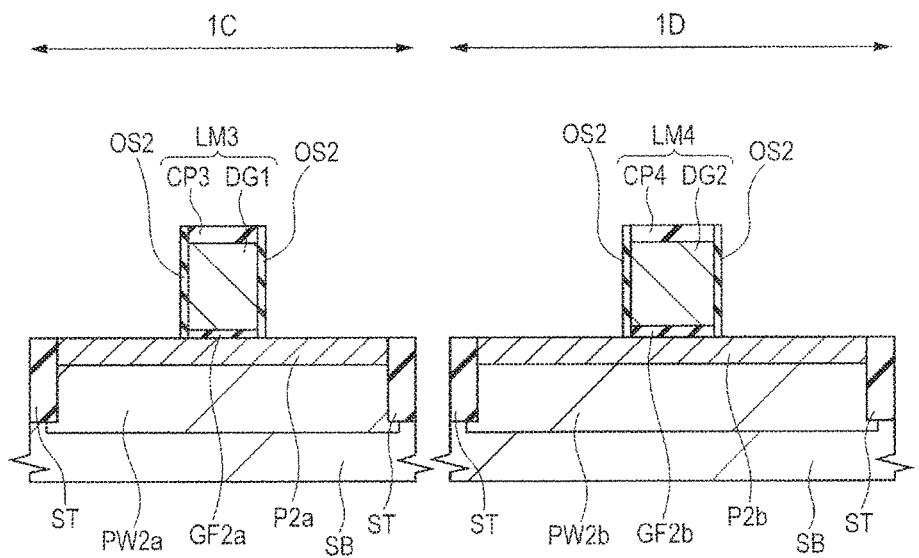
FIG. 30 is a main-portion cross-sectional view of the semiconductor device during the manufacturing process thereof, which is similar to FIG. 29.

Next, as shown in FIGS. 29 and 30, the offset spacers (side-wall insulating films) OS1 and offset spacers (side-wall insulating films) OS2 are formed.

Each of the offset spacers OS1 is made of a multi-layer film including, e.g., a silicon dioxide film and a silicon nitride film. Each of the offset spacers OS2 is made of, e.g., a single-layer silicon nitride film. In the memory cell region 1A, the offset spacers OS1 are formed over the respective side surfaces of the multi-layer body LM1 and the memory gate electrode MG1 (side surfaces opposite to the side surfaces thereof adjacent to each other via the insulating film MZ). Also, in the memory cell region 1B, the offset spacers OS1 are formed over the respective side surfaces of the multi-layer body LM2 and the memory gate electrode MG2 (side surfaces opposite to the side surfaces thereof adjacent to each other via the insulating film MZ). In the lower-breakdown-voltage MIS region 1C, the offset spacers OS2 are formed over the both side surfaces of the multi-layer body LM3. In the higher-breakdown-voltage MIS region 1D, the offset spacers OS2 are formed over the both side surfaces of the multi-layer body LM4.

For example, the offset spacers OS1 and OS2 can be formed as follows. That is, first, over the main surface of the semiconductor substrate SB, a silicon dioxide film is formed using a CVD method or the like so as to cover the memory gate electrodes MG1 and MG2 and the multi-layer bodies LM1, LM2, LM3, and LM4. Then, using a photolithographic technique and an etching technique, the silicon dioxide film is selectively removed from the lower-breakdown-voltage MIS region 1C and the higher-breakdown-voltage MIS region 1D by wet etching or the like, while the silicon dioxide film is not removed from the memory cell regions 1A and 1B to be left therein. Then, over the main surface of the semiconductor substrate SB, a silicon nitride film is formed using a CVD method or the like. This provides a state where, in the memory cell regions 1A and 1B, over the main surface of the semiconductor substrate SB, a multi-layer film including the silicon dioxide film and the silicon nitride film located thereover is formed as an insulating film for forming the offset spacers so as to cover the memory gate electrodes MG1 and MG2 and the multi-layer bodies LM1 and LM2. This also provides a state in which, in the lower-breakdown-voltage MIS region 1C and the higher-breakdown-voltage MIS region 1D, over the main surface of the semiconductor substrate SB, the silicon nitride film is formed as an insulating film for forming the offset spacers so as to cover the multi-layer bodies LM3 and LM4. Then, using an anisotropic etching technique, the insulating films for forming the offset spacers are etched back. Thus, the offset spacers OS1 each made of the multi-layer film including the silicon dioxide film and the silicon nitride film are formed over the side surfaces of the multi-layer body LM1 and the memory gate electrode MG1 in the memory cell region 1A and over the side surfaces of the multi-layer body LM2 and the memory gate electrode MG2 in the memory cell region 1B. Also, the offset spacers OS2 each made of the silicon nitride film are formed over the both side surfaces of the multi-layer body LM3 in the lower-breakdown-voltage MIS region 1C and over the both side surfaces of the multi-layer body LM4 in the higher-breakdown-voltage MIS region 1D.

Note that, similarly to each of the offset spacers OS2, each of the offset spacers OS1 can also be formed of the single-layer silicon nitride film. However, when the offset spacer OS1 is formed of the single-layer silicon nitride film, the insulating film MZ interposed between each of the memory gate electrodes MG and the semiconductor substrate SB is consequently adjacent to the silicon nitride film forming the offset spacer OS1. In this case, however, a phenomenon in which charges are trapped into the silicon nitride film forming the offset spacer OS1 may occur. To prevent this, it is more preferable to form each of the offset spacers OS1 of the multi-layer film including the silicon dioxide film and the silicon nitride film than to form each of the offset spacers OS1 of the single-layer silicon nitride film. When the offset spacer OS1 is formed of the multi-layer film including the silicon dioxide film and the silicon nitride film, it is desirable that the silicon dioxide film, not the silicon nitride film, is in contact with the memory gate electrode (MG) or the control gate electrode (CG).

The respective widths (widths in the gate length direction) of the offset spacers OS1 and OS2 are smaller than the width of each of the sidewall spacers SW formed later. The description has been given heretofore of the case where the offset spacers OS1 and OS2 are formed but, in another form, it may also be possible to omit the formation of the offset spacers OS1 and OS2.

Figure 31:
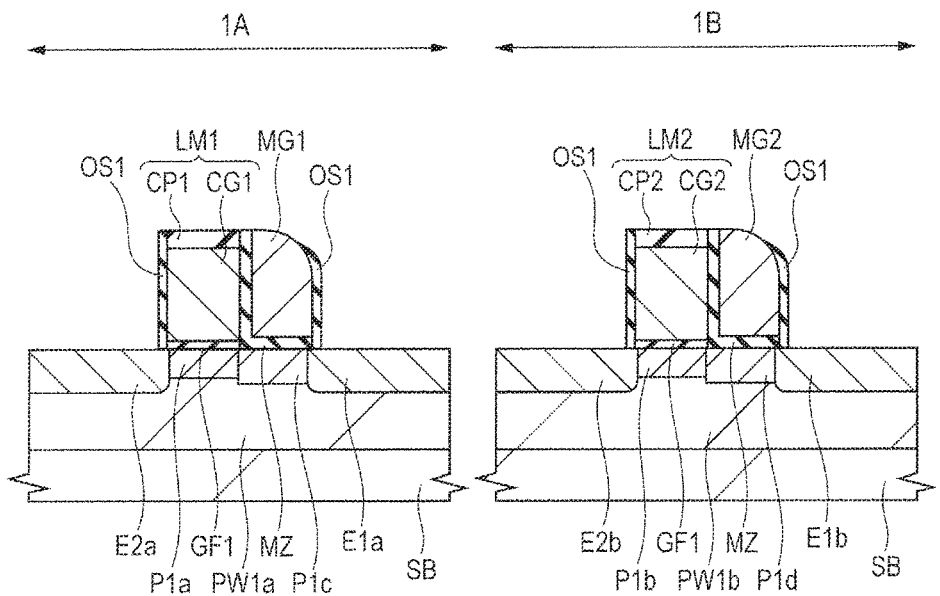
FIG. 31 is a main-portion cross-sectional view of the semiconductor device during the manufacturing process thereof, which is subsequent to FIG. 29.
Figure 32:
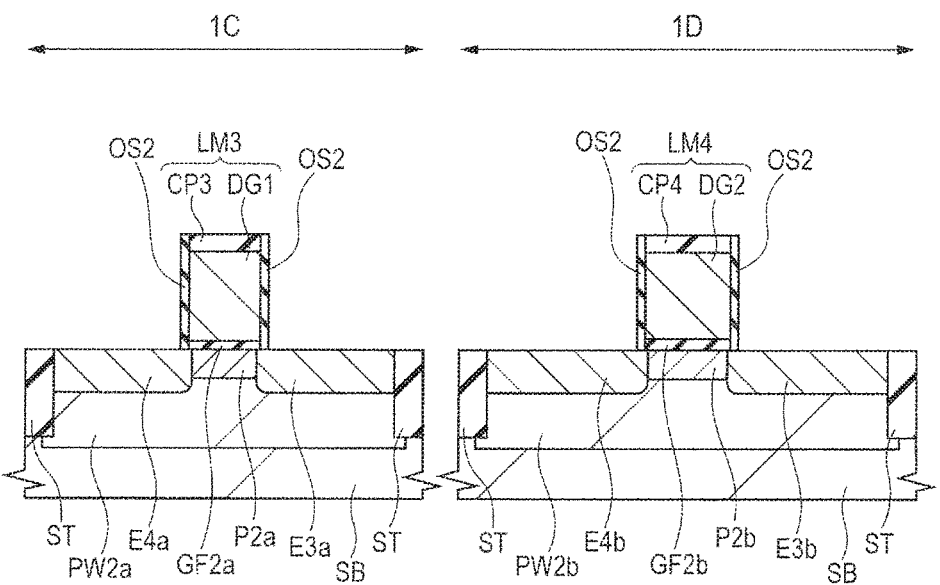
FIG. 32 is a main-portion cross-sectional view of the semiconductor device during the manufacturing process thereof, which is similar to FIG. 31.

Next, as shown in FIGS. 31 and 32, $n^-$-type semiconductor regions E1a, E2a, E1b, E2b, E3a, E4a, E3b, and E4b are formed using an ion implantation method.

Specifically, an n-type impurity such as, e.g., arsenic (As) or phosphorus (P) is ion-implanted into the semiconductor substrate SB (p-type wells PW1a, PW1b, PW2b, and PW2b) using the memory gate electrodes MG1 and MG2 and the multi-layer bodies LM1, LM2, LM3, and LM4 as a mask (ion implantation inhibition mask). This allows the $n^-$-type semiconductor regions E1a, E2a, E1b, E2b, E3a, E4a, E3b, and E4b to be formed.

At this time, in the memory cell region 1A, the $n^-$-type semiconductor region E1a is formed by self-alignment with the offset spacer OS1 over the side surface of the memory gate electrode MG1, and the $n^-$-type semiconductor region E2a is formed by self-alignment with the offset spacer OS1 over the side surface of the multi-layer body LM1. In the memory cell region 1B, the $n^-$-type semiconductor region E1b is formed by self-alignment with the offset spacer OS1 over the side surface of the memory gate electrode MG2, and the $n^-$-type semiconductor region E2b is formed by self-alignment with the offset spacer OS1 over the side surface of the multi-layer body LM2. In the lower-breakdown-voltage MIS region 1C, the $n^-$-type semiconductor region E3a is formed by self-alignment with the offset spacer OS2 over the source-side side surface of the multi-layer body LM3, and the $n^-$-type semiconductor region E4a is formed by self-alignment with the offset spacer OS2 over the drain-side side surface of the multi-layer body LM3. In the higher-breakdown-voltage MIS region 1D, the $n^-$-type semiconductor region E3b is formed by self-alignment with the offset spacer OS2 over the source-side side surface of the multi-layer body LM4, and the $n^-$-type semiconductor region E4b is formed by self-alignment with the offset spacer OS2 over the drain-side side surface of the multi-layer body LM4.

The $n^-$-type semiconductor regions E1a, E2a, E1b, E2b, E3a, E4a, E3b, and E4b can be formed by the same ion implantation step, but can also be formed by different ion implantation steps.

However, the $n^-$-type semiconductor region E1a in the memory cell region 1A and the $n^-$-type semiconductor region E1b in the memory cell region 1B are preferably formed by the same ion implantation step, and the $n^-$-type semiconductor region E2a in the memory cell region 1A and the $n^-$-type semiconductor region E2b in the memory cell region 1B are also preferably formed by the same ion implantation step. Consequently, the formed $n^-$-type semiconductor regions E1a and E1b have substantially equal impurity concentrations, and the formed $n^-$-type semiconductor regions E2a and E2b have substantially equal impurity concentrations.

As necessary, p-type halo regions can also be formed by halo ion implantation. For example, in the semiconductor substrate SB located in the memory cell regions 1A and 1B and the lower-breakdown-voltage MIS region 1C, respective p-type halo regions (not shown) which surround the $n^-$-type semiconductor regions E2a, E2b, E3a and E4a can also be formed.

Figure 33:
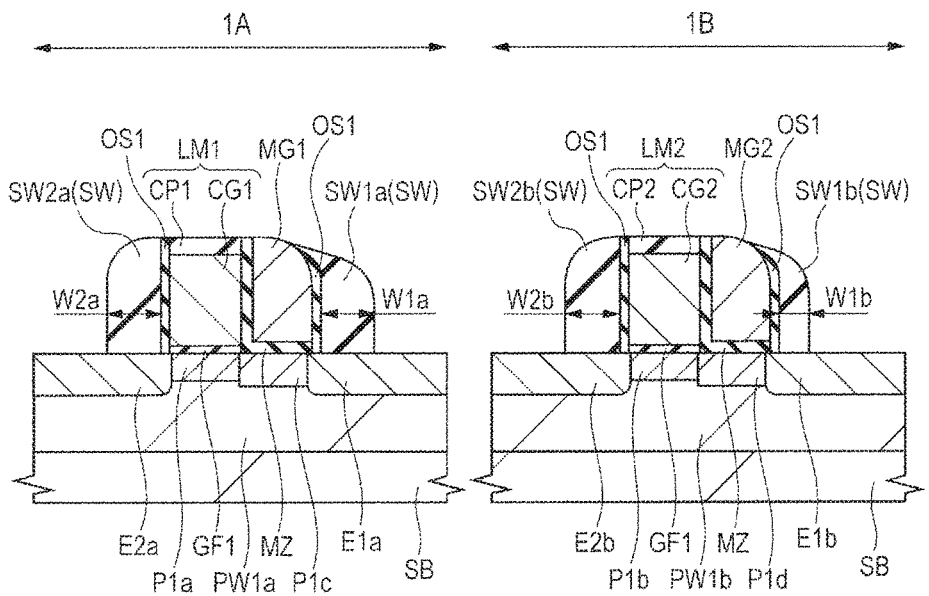
FIG. 33 is a main-portion cross-sectional view of the semiconductor device during the manufacturing process thereof, which is subsequent to FIG. 31.
Figure 34:
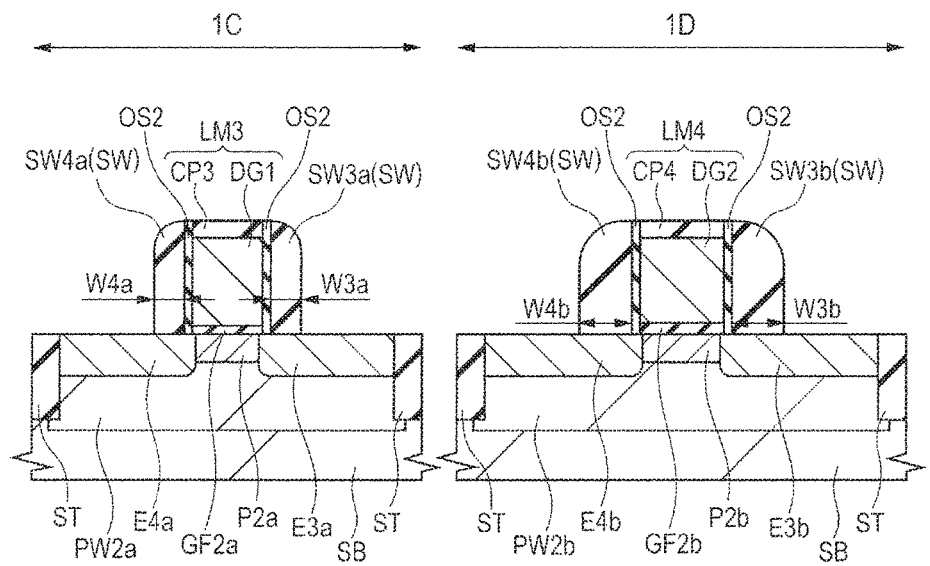
FIG. 34 is a main-portion cross-sectional view of the semiconductor device during the manufacturing process thereof, which is similar to FIG. 33.
Figure 35:
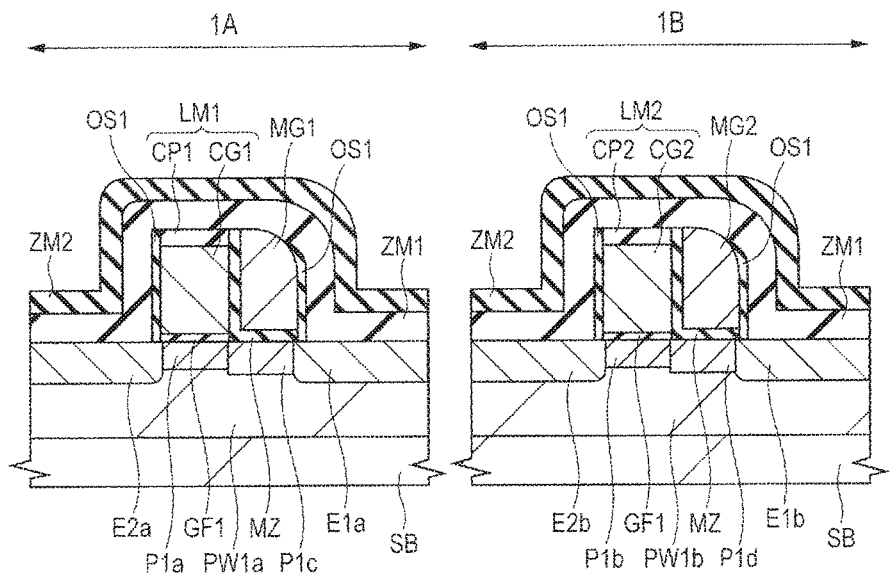
FIG. 35 is a main-portion cross-sectional view of the semiconductor device during the manufacturing process thereof, which is subsequent to FIG. 31.
Figure 36:
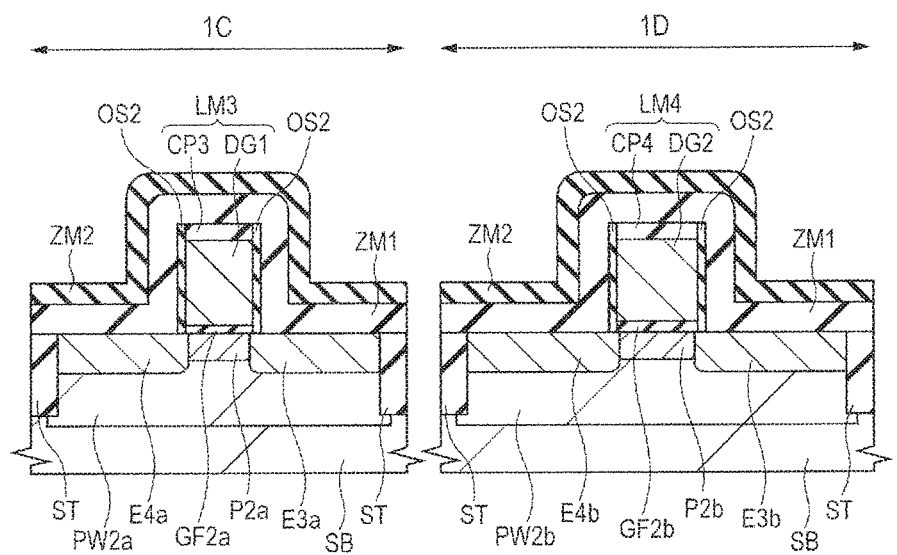
FIG. 36 is a main-portion cross-sectional view of the semiconductor device during the manufacturing process thereof, which is similar to FIG. 35.

Next, as shown in FIGS. 33 and 34, over the respective side surfaces of the multi-layer body LM1 and the memory gate electrode MG1, over the respective side surfaces of the multi-layer body LM2 and the memory gate electrode MG2, over the both side surfaces of the multi-layer body LM3, and over the both side surfaces of the multi-layer body LM4, the sidewall spacers (SW1a, SW2a, SW1b, SW2b, SW3a, SW4a, SW3b, and SW4b) each made of an insulating film (insulator) are formed.

In the memory cell region 1A, the sidewall spacer SW1a is formed over the side surface of the memory gate electrode MG1 which is opposite to the side surface thereof adjacent to the multi-layer body LM1 via the insulating film MZ. However, in the case where the offset spacer OS1 is formed over the side surface of the memory gate electrode MG1, in the memory cell region 1A, the sidewall spacer SW1a is formed over the side surface of the memory gate electrode MG1 via the offset spacer OS1.

Also, in the memory cell region 1A, the sidewall spacer SW2a is formed over the side surface of the multi-layer body LM1 which is opposite to the side surface thereof adjacent to the memory gate electrode MG1 via the insulating film MZ. However, in the case where the offset spacer OS1 is formed over the side surface of the multi-layer body LM1, in the memory cell region 1A, the sidewall spacer SW2a is formed over the side surface of the multi-layer body LM1 via the offset spacer OS1.

In the memory cell region 1B, the sidewall spacer SW1b is formed over the side surface of the memory gate electrode MG2 which is opposite to the side surface thereof adjacent to the multi-layer body LM2 via the insulating film MZ. However, in the case where the offset spacer OS1 is formed over the side surface of the memory gate electrode MG2, in the memory cell region 1B, the sidewall spacer SW1b is formed over the side surface of the memory gate electrode MG2 via the offset spacer OS1.

Also, in the memory cell region 1B, the sidewall spacer SW2b is formed over the side surface of the multi-layer body LM2 which is opposite to the side surface thereof adjacent to the memory gate electrode MG2 via the insulating film MZ. However, in the case where the offset spacer OS1 is formed over the side surface of the multi-layer body LM2, in the memory cell region 1B, the sidewall spacer SW2b is formed over the side surface of the multi-layer body LM2 via the offset spacer OS1.

In the lower-breakdown-voltage MIS region 1C, the sidewall spacer SW3a is formed over the source-side side surface of the multi-layer body LM3, while the sidewall spacer SW4a is formed over the drain-side side surface of the multi-layer body LM3. However, in the case where the offset spacers OS2 are formed over the side surfaces of the multi-layer body LM3, the sidewall spacers SW3a and SW4a are formed over the side surfaces of the multi-layer body LM3 via the offset spacers OS2.

In the higher-breakdown-voltage MIS region 1D, the sidewall spacer SW3b is formed over the source-side side surface of the multi-layer body LM4, while the sidewall spacer SW4b is formed over the drain-side side surface of the multi-layer body LM4. However, in the case where the offset spacers OS2 are formed over the side surfaces of the multi-layer body LM4, the sidewall spacers SW3b and SW4b are formed over the side surfaces of the multi-layer body LM4 via the offset spacers OS2.

The respective widths W1a, W2a, W1b, W2b, W3a, W4a, W3b, and W4b of the sidewall spacers SW1a, SW2a, SW1b, SW2b, SW3a, SW4a, SW3b, and SW4b mentioned herein are not uniform, but the relationships described above with reference to FIGS. 1 to 5 in "About Structure of Semiconductor Device" described above are established therebetween. That is, the relationships given by W1b=W3a=W4a<W1a=W2a=W2b=W3b=W4b are established.

The following will describe an example of the step of forming the sidewall spacers SW with reference to FIGS. 35 to 44.

Figure 37:
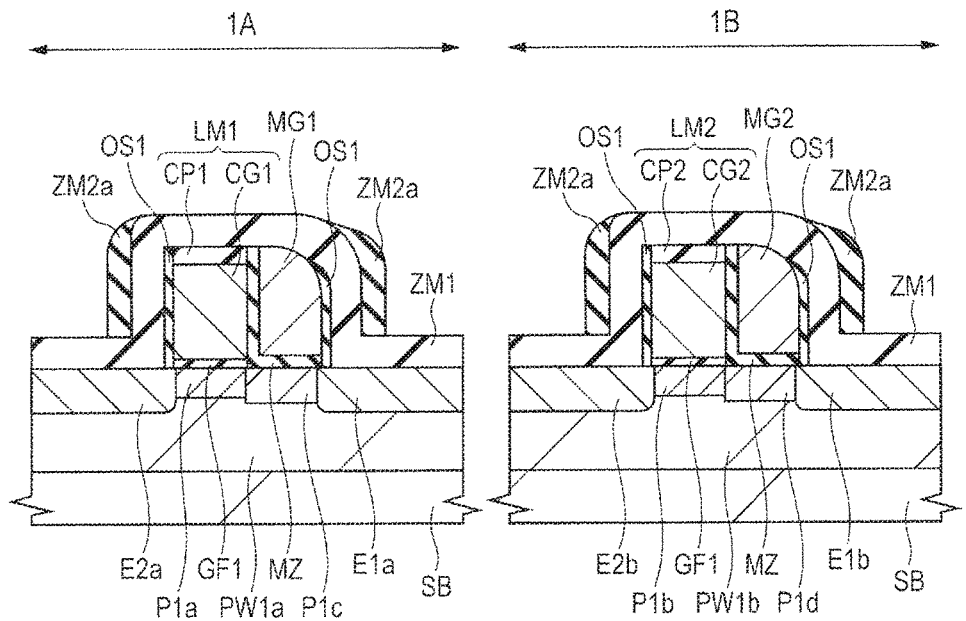
FIG. 37 is a main-portion cross-sectional view of the semiconductor device during the manufacturing process thereof, which is subsequent to FIG. 35.
Figure 38:
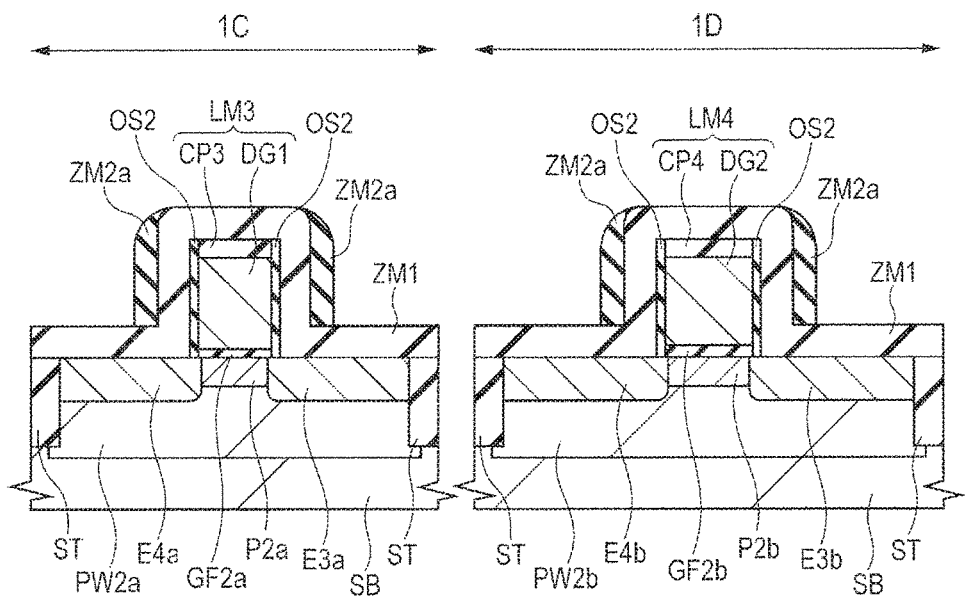
FIG. 38 is a main-portion cross-sectional view of the semiconductor device during the manufacturing process thereof, which is similar to FIG. 37.

That is, after the structure shown in FIGS. 31 and 32 described above is obtained, as shown in FIGS. 35 and 36, over the main surface of the semiconductor substrate SB, an insulating film ZM1 is formed using a CVD method or the like so as to cover the memory gate electrodes MG1 and MG2, the multi-layer bodies LM1, LM2, LM3, and LM4, and the offset spacers OS1 and OS2. Then, over the insulating film ZM1, an insulating film ZM2 is formed using a CVD method or the like. The insulating films ZM1 and ZM2 are made of different materials. The insulating film ZM1 is preferably made of a silicon nitride film, and the insulating film ZM2 is preferably made of a silicon dioxide film. Then, using an anisotropic etching technique, the insulating film ZM2 is etched back to form side-wall insulating films ZM2a made of the insulating film ZM2 remaining in the form of sidewall spacers over the side surfaces of the insulating film ZM1, as shown in FIGS. 37 and 38. At this time, since the insulating film ZM2 is etched back under conditions such that the insulating film ZM1 is less likely to be etched than the insulating film ZM2, the insulating film ZM1 remains in the form of a layer even after the etch-back process is ended. The side surfaces of the insulating film ZM1 where the sidewall insulating films ZM2a are formed are the side surfaces of the top surface of the insulating film ZM1 which correspond to the respective side surfaces of the memory gate electrodes MG1 and MG2 and the multi-layer bodies LM1, LM2, LM3, and LM4.

Figure 39:
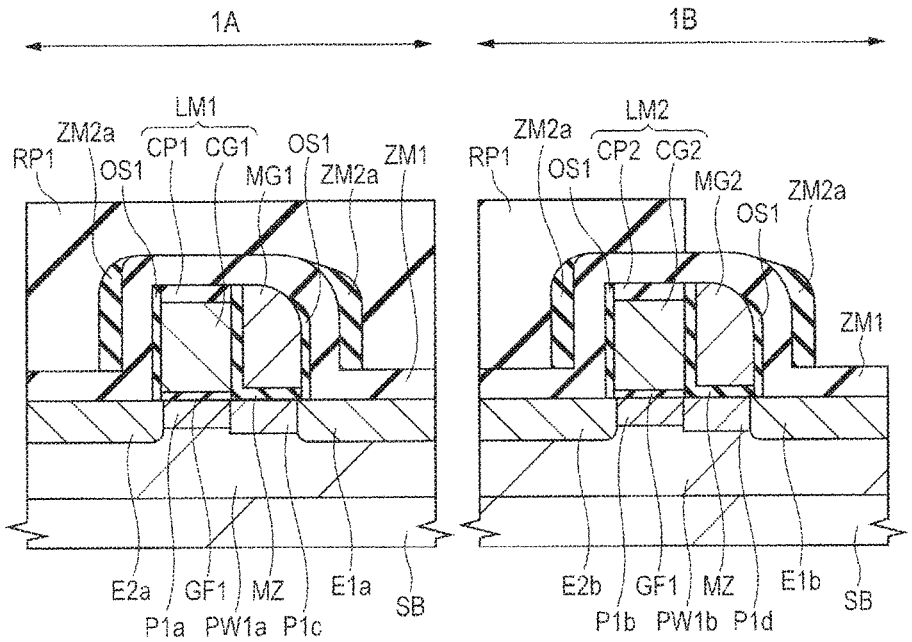
FIG. 39 is a main-portion cross-sectional view of the semiconductor device during the manufacturing process thereof, which is subsequent to FIG. 37.
Figure 40:
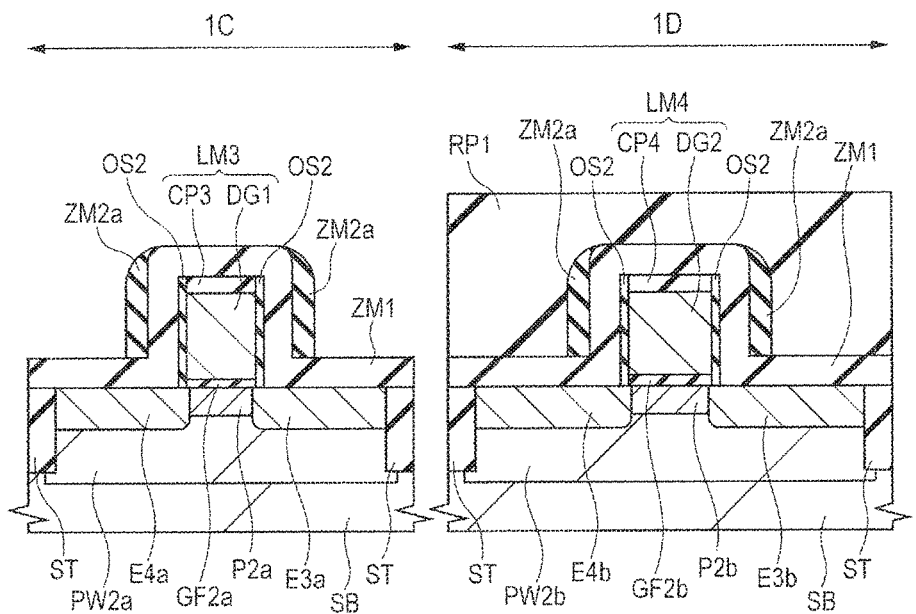
FIG. 40 is a main-portion cross-sectional view of the semiconductor device during the manufacturing process thereof, which is similar to FIG. 39.

Then, as shown in FIGS. 39 and 40, over the insulating film ZM1, a photoresist pattern RP1 is formed using a photolithographic technique. The photoresist pattern RP1 covers the source- and drain-side side-wall insulating films ZM2a in the memory cell region 1A, the drain-side side-wall insulating film ZM2a in the memory cell region 1B, and the source- and drain-side side-wall insulating films ZM2a in the higher-breakdown-voltage MIS region 1D. The source-side side-wall insulating film ZM2a in the memory cell region 1B and the source- and drain-side side-wall insulating films ZM2a in the lower-breakdown-voltage MIS region 1C are uncovered with the photoresist pattern RP1 and exposed.

Figure 41:
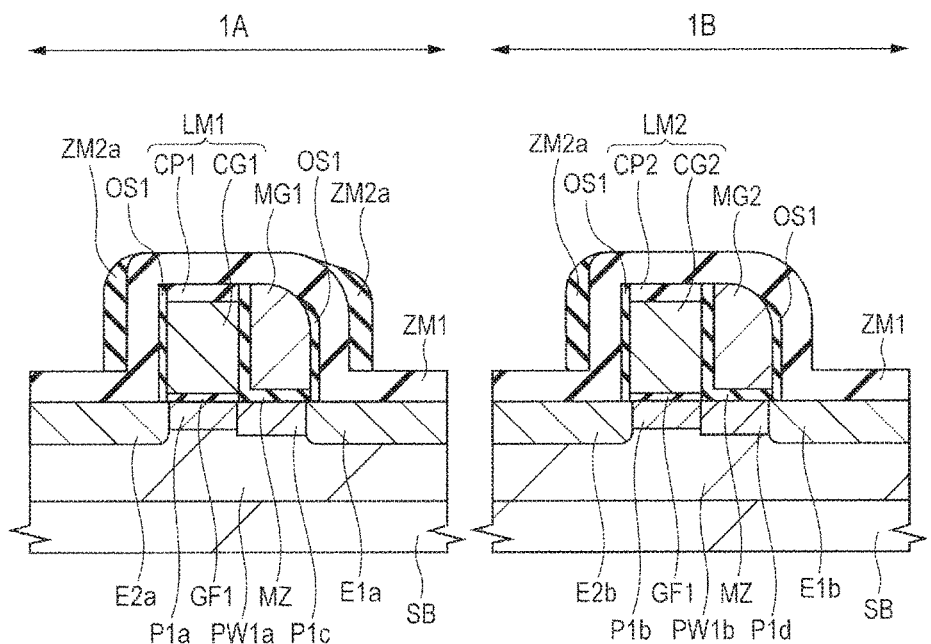
FIG. 41 is a main-portion cross-sectional view of the semiconductor device during the manufacturing process thereof, which is subsequent to FIG. 39.
Figure 42:
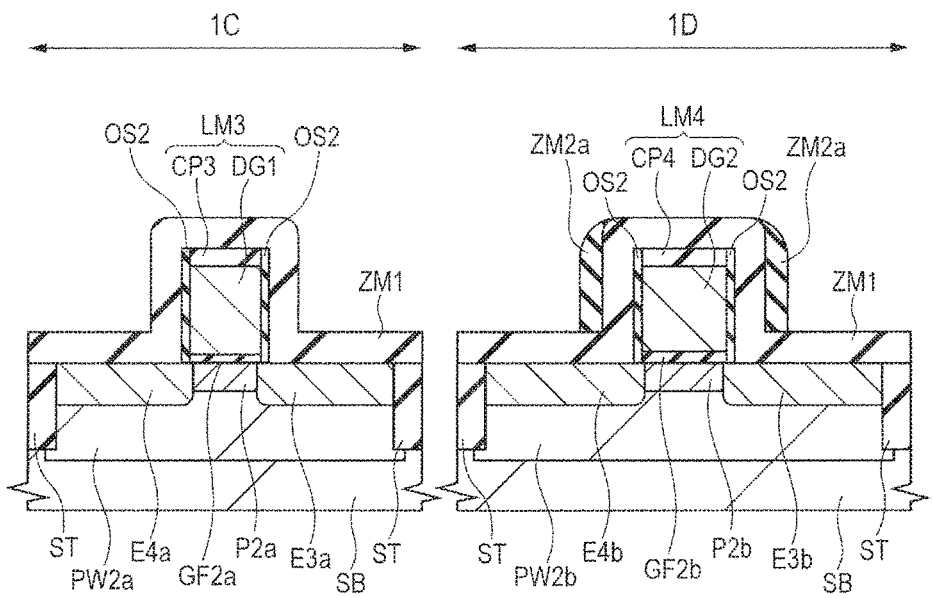
FIG. 42 is a main-portion cross-sectional view of the semiconductor device during the manufacturing process thereof, which is similar to FIG. 41.

Then, the side-wall insulating films ZM2 uncovered with the photoresist pattern RP1 and exposed are etched to be removed. As a result, the source-side side-wall insulating film ZM2a in the memory cell region 1B and the source- and drain-side sidewall insulating films ZM2a in the lower-breakdown-voltage MIS region 1C are removed. On the other hand, the source- and drain-side sidewall insulating films ZM2a in the memory cell region 1A, the drain-side side-wall insulating film ZM2a in the memory cell region 1B, and the source- and drain-side side-wall insulating films ZM2a in the higher-breakdown-voltage MIS region 1D, which are covered with the photoresist pattern RP1, are not removed and remain. Subsequently, the photoresist pattern RP1 is removed. FIGS. 41 and 42 show this process stage.

Figure 43:
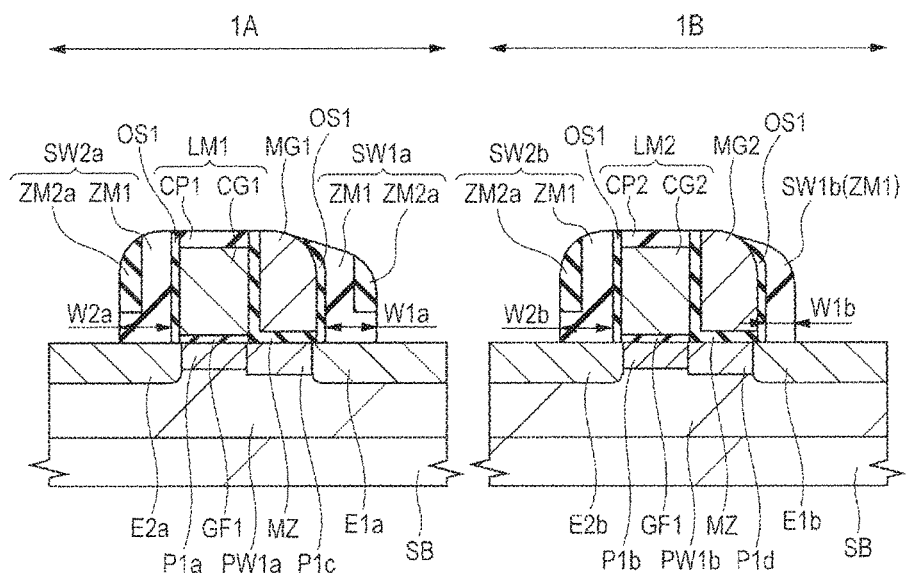
FIG. 43 is a main-portion cross-sectional view of the semiconductor device during the manufacturing process thereof, which is subsequent to FIG. 41.
Figure 44:
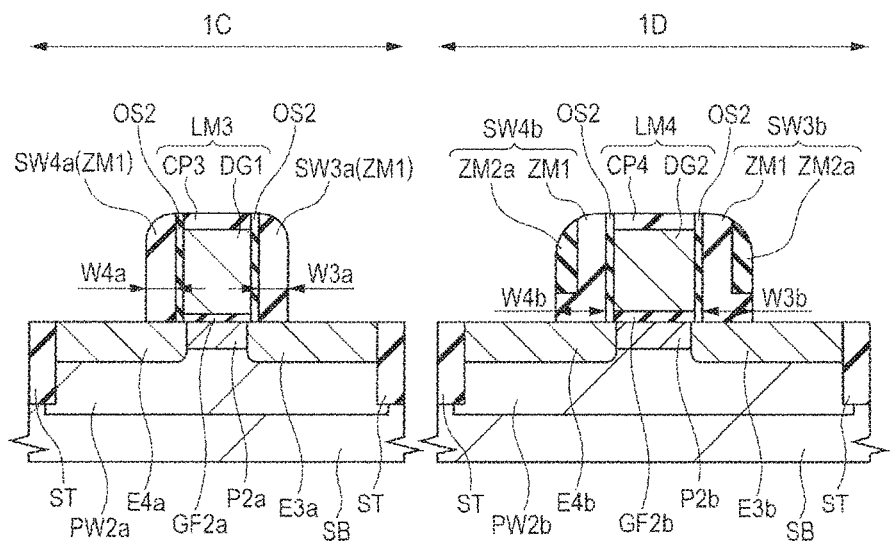
FIG. 44 is a main-portion cross-sectional view of the semiconductor device during the manufacturing process thereof, which is similar to FIG. 43.

Then, using an anisotropic etching technique, the insulating film ZM1 is etched back. At this time, the side-wall insulating film ZM2a can function as an etching mask, but the etch-back process can also be performed under conditions such that each of the side-wall insulating films ZM2a and the insulating film ZM1 is etched. When the etch-back process is performed, as shown in FIGS. 43 and 44, the sidewall spacers SW1a, SW2a, SW2b, SW3b, and SW4b each made of the insulating film ZM1 and the side-wall insulating film ZM2a and the sidewall spacers SW1b, SW3a, and SW4a each made of the insulating film ZM1 are formed.

Since each of the sidewall spacers SW1a, SW2a, SW2b, SW3b, and SW4b is made of the insulating film ZM1 and the side-wall insulating film ZM2a, the sidewall spacers SW1a, SW2a, SW2b, SW3b, and SW4b have substantially equal widths. Since each of the sidewall spacers SW1b, SW3a, and SW4a is made of the insulating film ZM1, the sidewall spacers SW1b, SW3a, and SW4a have equal widths. The respective widths W1a, W2a, W2b, W3b, and W4b of the sidewall spacers SW1a, SW2a, SW2b, SW3b, and SW4b are larger than the respective widths W1b, W3a, and W4a of the sidewall spacers SW1b, SW3b, and SW4a each by the thickness of the side-wall insulating film ZM2a. That is, $W1b=W3a=W4a<W1a=W2a=W2b=W3b=W4b$ is satisfied.

Note that, when the sidewall spacers SW are formed in the steps shown in FIGS. 35 to 44, each of the sidewall spacers SW1a, SW2a, SW2b, SW3b, and SW4b has a multi-layer structure including the insulating film ZM1 and the side-wall insulating film ZM2a. However, in FIGS. 33 and 34 and FIGS. 45 to 68 described later, for simpler illustration, the insulating film ZM1 and the side-wall insulating film ZM2a in each of the sidewall spacers SW1a, SW2a, SW2b, SW3b, and SW4b are integrally shown without any distinction therebetween.

It may also be possible that, after the structure shown in FIGS. 41 and 42 is obtained, when the insulating film ZM1 is etched back, the etching conditions are adjusted such that not only anisotropic etching, but also side etching occurs and the etch-back process is performed under conditions such that both of the side-wall insulating films ZM2a and the insulating film ZM1 are etched. In this case, at the process stage where the etch-back process is ended, the side-wall insulating films ZM2a disappear as a result of the side etching and each of the sidewall spacers SW1a, SW2a, SW1b, SW2b, SW3a, SW4a, SW3b, and SW4b is formed of the insulating film ZM1. In this case, the portions of the insulating film ZM1 which are covered with the side-wall insulating films ZM2a are kept from being side-etched until the side-wall insulating films ZM2a disappear as a result of the side etching. Accordingly, the respective widths W1a, W2a, W2b, W3b, and W4b of the sidewall spacers SW1a, SW2a, SW2b, SW3b, and SW4b are larger than the respective widths W1b, W3a, and W4a of the sidewall spacers SW1b, SW3a, and SW4a each by a difference in the amount of side etching of the insulating film ZM1. Accordingly, in this case, each of the sidewall spacers SW1a, SW2a, SW1b, SW2b, SW3a, SW4a, SW3b, and SW4b is formed of the insulating film ZM1, and also $W1b=W3a=W4a<W1a=W2a=W2b=W3b=W4b$ is satisfied.

In Embodiment 1, the sidewall spacers SW1a, SW2a, SW1b, SW2b, SW3a, SW4a, SW3b, and SW4b are formed so as to satisfy $W1b=W3a=W4a<W1a=W2a=W2b=W3b=W4b$. As a technique used therefor, a technique other than that used for the steps shown in FIGS. 35 to 44 can also be used appropriately.

Figure 45:
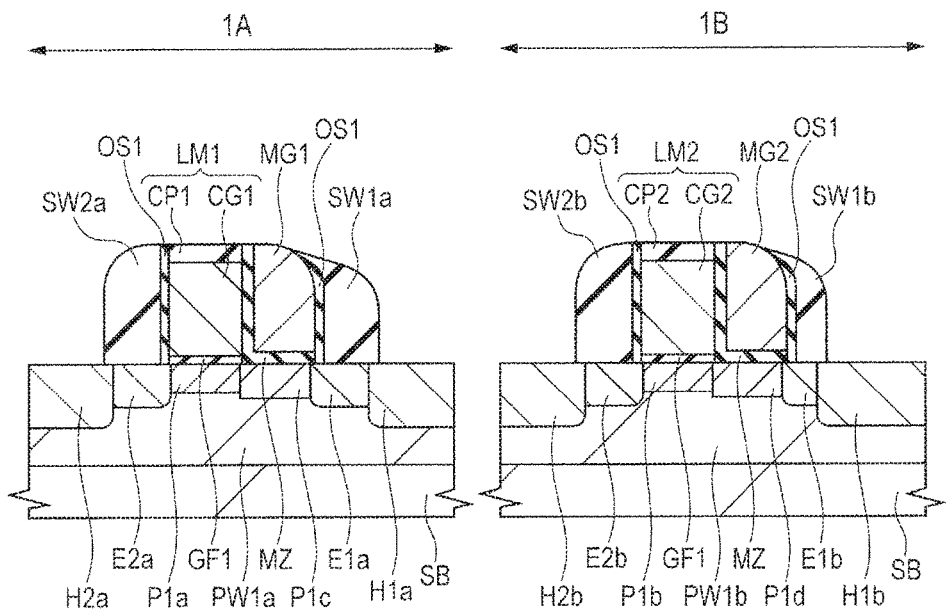
FIG. 45 is a main-portion cross-sectional view of the semiconductor device during the manufacturing process thereof, which is subsequent to FIG. 43.
Figure 46:
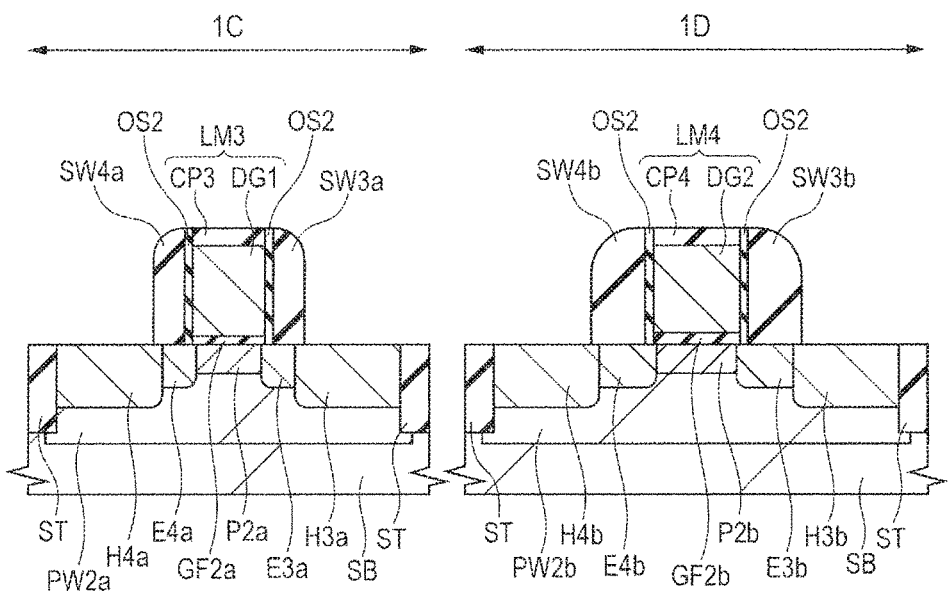
FIG. 46 is a main-portion cross-sectional view of the semiconductor device during the manufacturing process thereof, which is similar to FIG. 45.

After the sidewall spacers SW are thus formed, as shown in FIGS. 45 and 46, the $n^+$-type semiconductor regions H1a, H2a, H1b, H2b, H3a, H4a, H3b, and H4b are formed using an ion implantation method.

Specifically, an n-type impurity such as, e.g., arsenic (As) or phosphorus (P) is ion-implanted into the semiconductor substrate SB (p-type wells PW1a, PW1b, PW2a, and PW2b) using the memory gate electrodes MG1 and MG2, the multi-layer bodies LM1, LM2, LM3, and LM4, and the sidewall spacers SW over the respective side surfaces thereof as a mask (ion implantation inhibition mask). This allows the $n^+$-type semiconductor regions H1a, H2a, H1b, H2b, H3a, H4a, H3b, and H4b to be formed.

At this time, in the memory cell region 1A, the $n^+$-type semiconductor region H1a is formed by self-alignment with the sidewall spacer SW1a over the side surface of the memory gate electrode MG1, and the $n^+$-type semiconductor region H2a is formed by self-alignment with the sidewall spacer SW2a over the side surface of the multi-layer body LM1. In the memory cell region 1B, the $n^+$-type semiconductor region H1b is formed by self-alignment with the sidewall spacer SW1b over the side surface of the memory gate electrode MG2, and the $n^+$-type semiconductor region H2b is formed by self-alignment with the sidewall spacer SW2b over the side surface of the multi-layer body LM2. In the lower-breakdown-voltage MIS region 1C, the $n^+$-type semiconductor region H3a is formed by self-alignment with the sidewall spacer SW3a over the source-side side surface of the multi-layer body LM3, and the $n^+$-type semiconductor region H4a is formed by self-alignment with the sidewall spacer SW4a over the drain-side side surface of the multi-layer body LM3. In the higher-breakdown-voltage MIS region 1D, the $n^+$-type semiconductor region H3b is formed by self-alignment with the sidewall spacer SW3b over the source-side side surface of the multi-layer body LM4, and the $n^+$-type semiconductor region H4b is formed by self-alignment with the sidewall spacer SW4b over the drain-side side surface of the multi-layer body LM4. Thus, the LDD structure is formed.

The $n^+$-type semiconductor regions H1a, H2a, H1b, H2b, H3a, H4a, H3b, and H4b can be formed by the same ion implantation step, but can also be formed by different ion implantation steps.

However, the $n^+$-type semiconductor region H1a in the memory cell region 1A and the $n^+$-type semiconductor region H1b in the memory cell region 1B are preferably formed by the same ion implantation step, and the $n^+$-type semiconductor region H2a in the memory cell region 1A and the $n^+$-type semiconductor region H2b in the memory cell region 1B are preferably formed by the same ion implantation step. Consequently, the formed $n^+$-type semiconductor regions H1a and H1b have substantially equal impurity concentrations, and the formed $n^+$-type semiconductor regions H2a and H2b have substantially equal impurity concentrations.

Thus, in the memory cell regions 1A and 1B, the lower-breakdown-voltage MIS regions 1C, and the higher-breakdown-voltage MIS region 1D, the source semiconductor regions (S1a, S1b, and S2) and the drain semiconductor regions (D1a, D1b, and D2) are formed.

In the memory cell region 1A, the distance (space) between the source higher-concentration region ($n^+$-type semiconductor region H1a) and the channel formation region (CM1) of the memory transistor is defined by the sidewall spacer SW1a. Also, in the memory cell region 1A, the distance (space) between the drain higher-concentration region ($n^+$-type semiconductor region H2a) and the channel formation region (CM1) of the control transistor is defined by the sidewall spacer SW2a. Thus, the theory that the distance between the source or drain higher-concentration and the channel region is defined by the sidewall spacer holds true not only for the sidewall spacers SW1a and SW2a, but also for the sidewall spacers SW1b, SW2b, SW3a, SW4a, SW3b, and SW4b.

Accordingly, the respective dimensions L1b, L3a, L4a of the $n^-$-type semiconductor regions E1b, E3a, and E4a are smaller than the respective dimensions L1a, L2a, L2b, L3b, and L4b of the $n^-$-type semiconductor regions E1a, E2a, E2b, E3b, and E4b. That is, $L3a=L4a=L1b<L1a=L2a=L2b=L3b=L4b$ is satisfied. The dimensions L1a, L2a, L1b, L2b, L3a, L4a, L3b, and L4b are shown in FIGS. 3 to 6 described above.

Next, activation anneal as heat treatment for activating the impurities introduced into the source and drain semiconductor regions (n⁻-type semiconductor regions E1a, E2a, E1b, E2b, E3a, E4a, E3b, and E4b and n⁺-type semiconductor regions H1a, H2a, H1b, H2b, H3a, H4a, H3b, and H4b) is performed.

Figure 47:
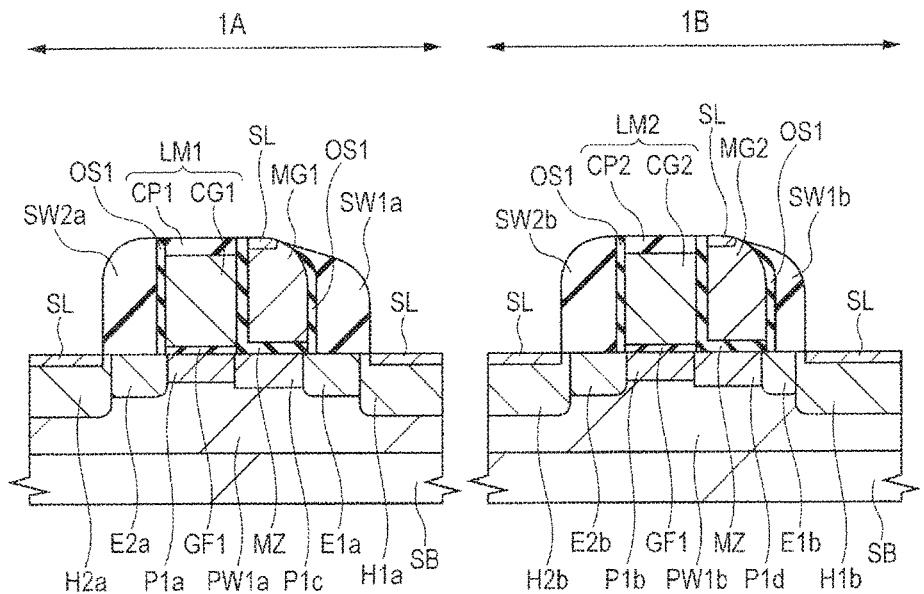
FIG. 47 is a main-portion cross-sectional view of the semiconductor device during the manufacturing process thereof, which is subsequent to FIG. 45.
Figure 48:
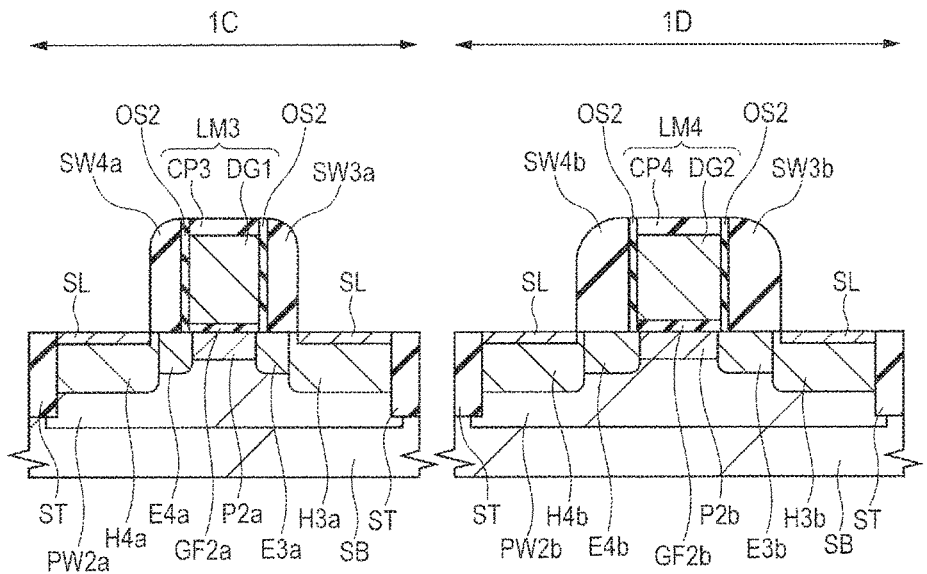
FIG. 48 is a main-portion cross-sectional view of the semiconductor device during the manufacturing process thereof, which is similar to FIG. 47.

Next, as shown in FIGS. 47 and 48, in the respective upper portions of the n⁺-type semiconductor regions H1a, H2a, H1b, H2b, H3a, H4a, H3b, and H4b and the memory gate electrodes MG1 and MG2, the metal silicide layers SL are formed using a salicide technique (Salicide: Self Aligned Silicide) technique.

Specifically, the metal silicide layers SL can be formed as follows. That is, over the entire main surface of the semiconductor substrate SB, a metal film for forming the metal silicide layers SL is formed so as to cover the memory gate electrodes MG1 and MG2, the multi-layer bodies LM1, LM2, LM3, and LM4, and the sidewall spacers SW. The metal film is made of, e.g., a cobalt (Co) film, a nickel (Ni) film, a nickel-platinum alloy film, or the like. Then, by performing heat treatment on the semiconductor substrate SB, the respective upper portions of the n⁺-type semiconductor regions H1a, H2a, H1b, H2b, H3a, H4a, H3b, and H4b and the memory gate electrodes MG1 and MG2 are caused to react with the foregoing metal film and thus form the metal silicide layers SL. Then, the unreacted metal film is removed. FIGS. 47 and 48 show cross-sectional views at this process stage.

Figure 49:
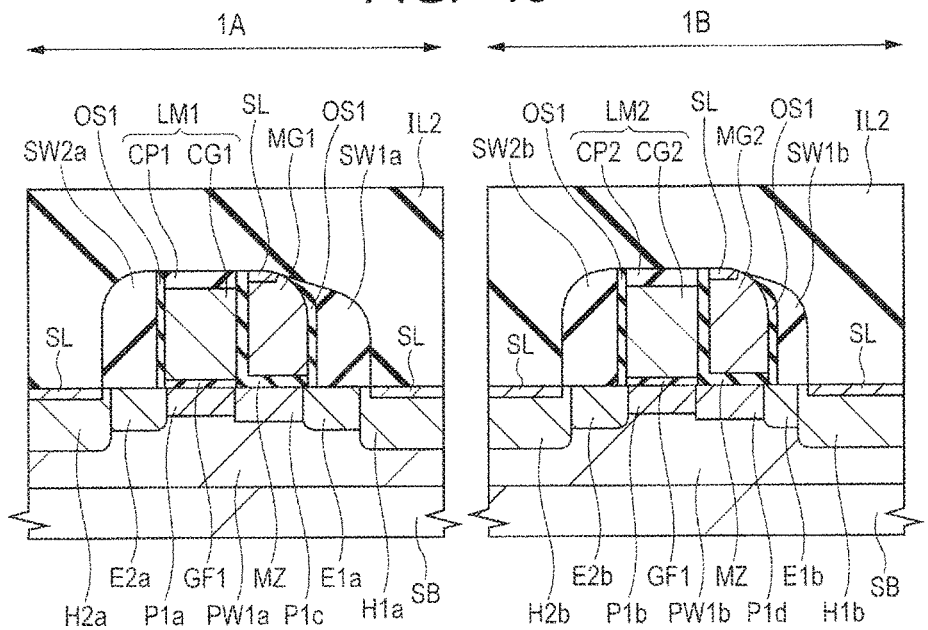
FIG. 49 is a main-portion cross-sectional view of the semiconductor device during the manufacturing process thereof, which is subsequent to FIG. 47.
Figure 50:
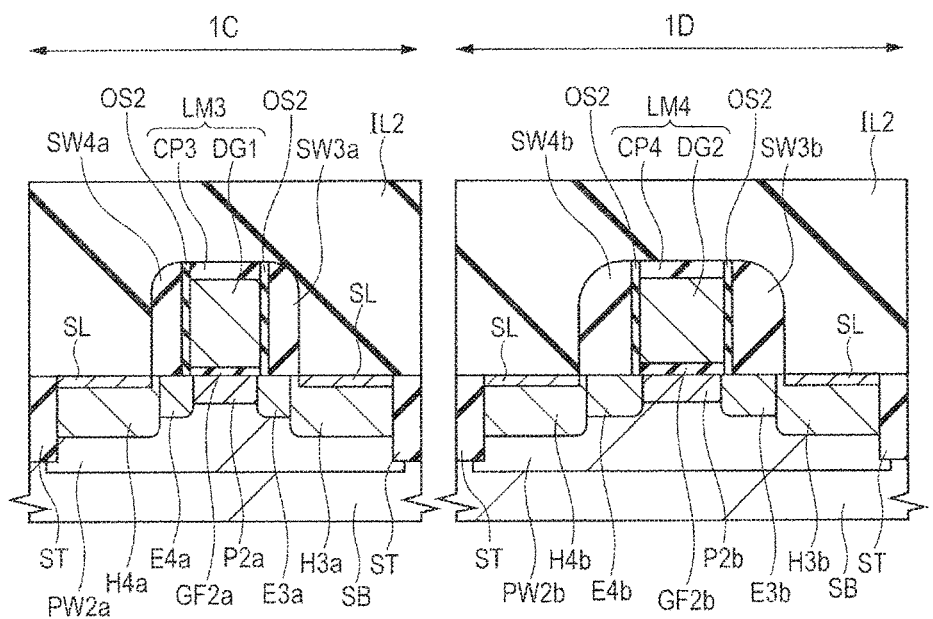
FIG. 50 is a main-portion cross-sectional view of the semiconductor device during the manufacturing process thereof, which is similar to FIG. 49.

Next, as shown in FIGS. 49 and 50, over the entire main surface of the semiconductor substrate SB, the insulating film (interlayer insulating film) IL2 is formed so as to cover the memory gate electrodes MG1 and MG2, the multi-layer bodies LM1, LM2, LM3, LM4, and the sidewall spacers SW.

The insulating film IL2 is made of a single-layer silicon dioxide film, a multi-layer film including a silicon nitride film and a silicon dioxide film formed over the silicon nitride film to be thicker than the silicon nitride film, or the like and can be formed using, e.g., a CVD method or the like.

Figure 51:
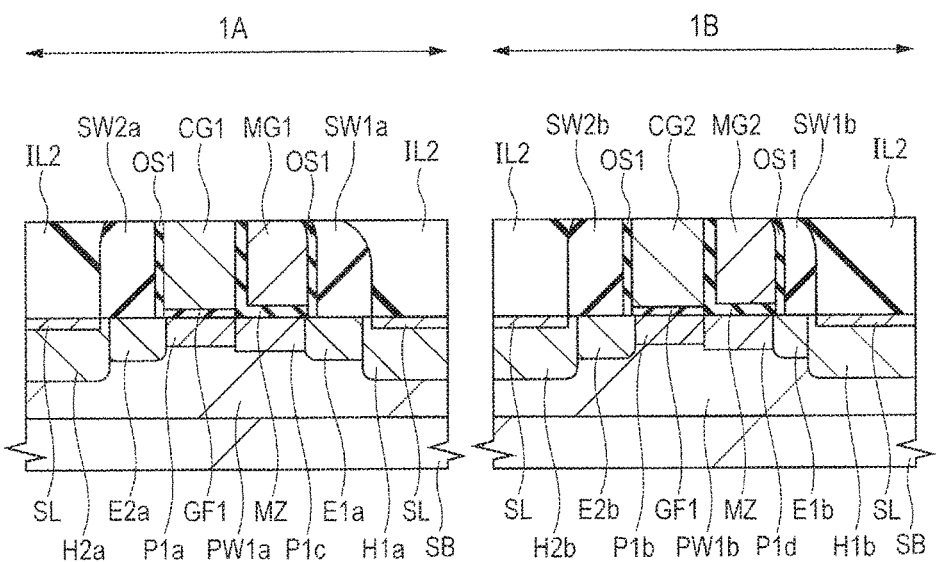
FIG. 51 is a main-portion cross-sectional view of the semiconductor device during the manufacturing process thereof, which is subsequent to FIG. 49.
Figure 52:
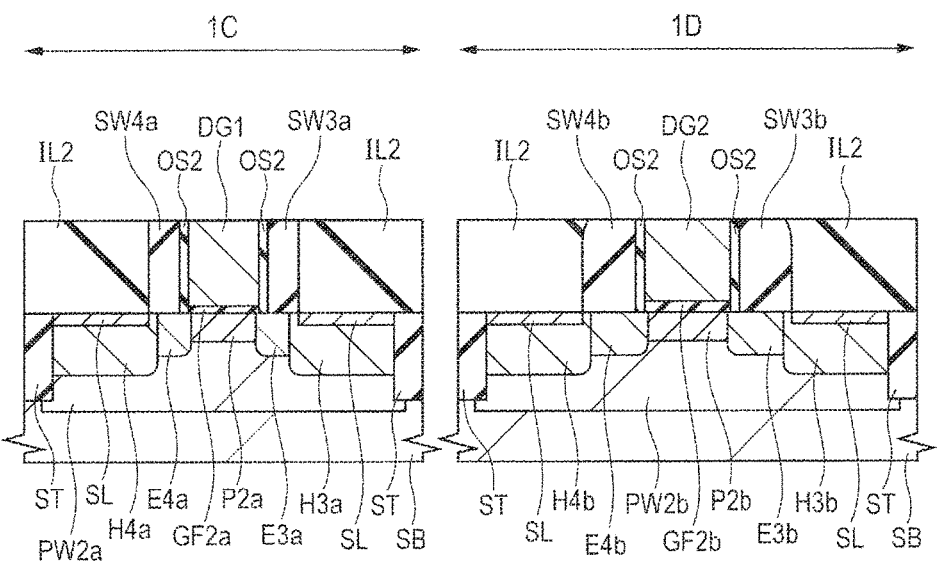
FIG. 52 is a main-portion cross-sectional view of the semiconductor device during the manufacturing process thereof, which is similar to FIG. 51.

Next, as shown in FIGS. 51 and 52, the upper surface of the insulating film IL2 is polished using a CMP (Chemical Mechanical Polishing) method or the like. By the polishing step, the respective upper surfaces of the memory gate electrodes MG1 and MG2, the control gate electrodes CG1 and CG2, and the dummy gate electrodes DG1 and DG2 are exposed. In the polishing step, the cap insulating films CP1, CP2, CP3, and CP4 are also polished to be removed. Also, the respective upper portions of the sidewall spacers SW1a, SW2a, SW1b, SW2b, SW3a, SW4a, SW3b, and SW4b may also be polished. In the case where the metal silicide layers SL are formed in the respective upper portions of the memory gate electrodes MG1 and MG2, in this polishing step, the metal silicide layers SL in the respective upper portions of the memory gate electrodes MG1 and MG2 may also be polished to be removed.

Figure 53:
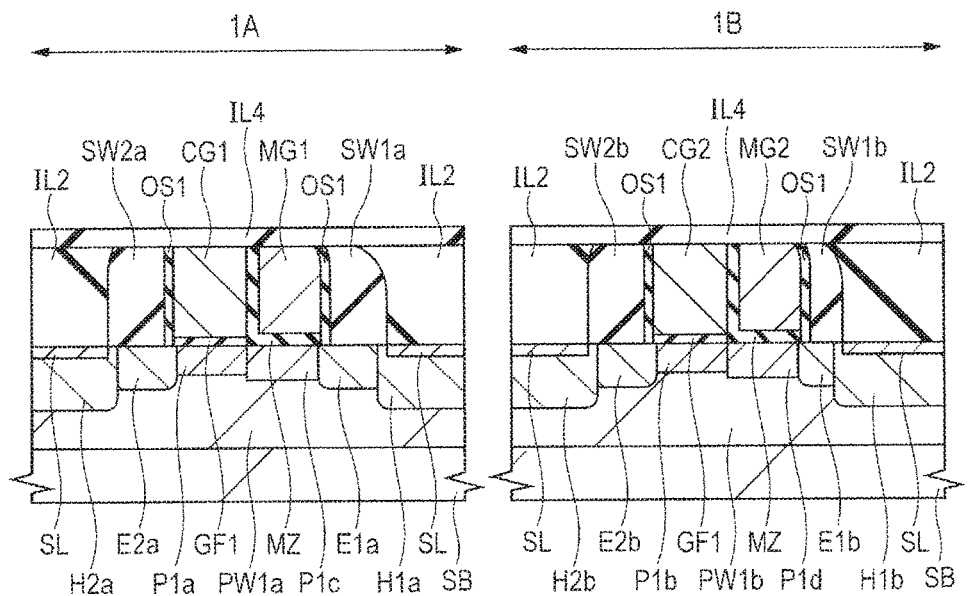
FIG. 53 is a main-portion cross-sectional view of the semiconductor device during the manufacturing process thereof, which is subsequent to FIG. 51.
Figure 54:
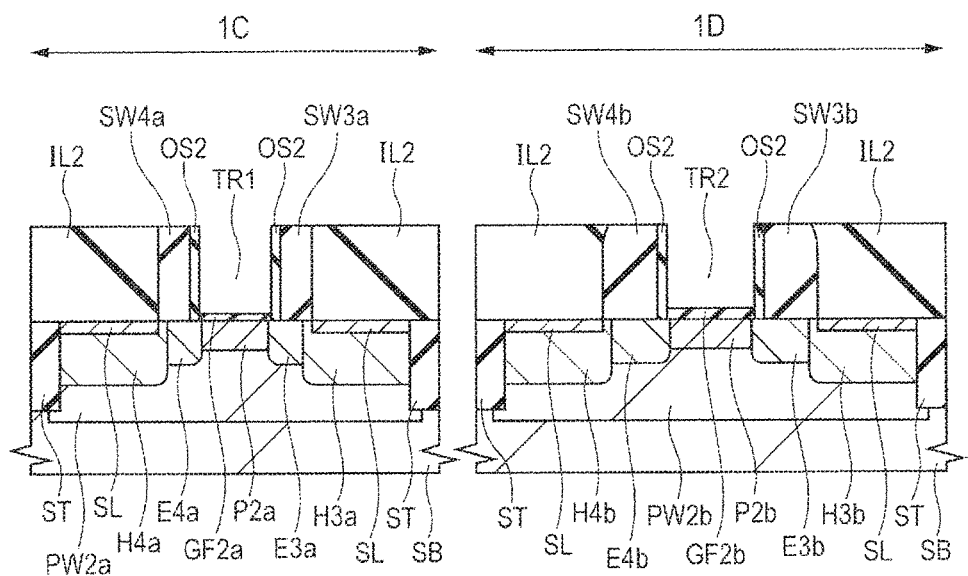
FIG. 54 is a main-portion cross-sectional view of the semiconductor device during the manufacturing process thereof, which is similar to FIG. 53.

Next, as shown in FIGS. 53 and 54, over the insulating film IL2, an insulating film IL4 is formed over the insulating film IL2 to cover the memory cell regions 1A and 1B and expose the lower-breakdown-voltage MIS region 1C and the higher-breakdown-voltage MIS region 1D. The insulating film IL4 can be formed by film deposition using a CVD method and by patterning using a photolithographic method and an etching method. By forming the insulating film IL4, the control gate electrodes CG1 and CG2 and the memory gate electrodes MG1 and MG2, which are covered with the insulating film IL4, are not exposed. On the other hand, the respective upper surfaces of the dummy gate electrodes DG1 and DG2 are uncovered with the insulating film IL4 and exposed.

Next, the dummy gate electrodes DG1 and DG2 are selectively etched to be removed. FIGS. 53 and 54 show the process stage where the etching step has been performed. In this etching step, etching is preferably performed under conditions such that the insulating films IL2, IL4, GF2a, and GF2b, the offset spacers OS2, and the sidewall spacers SW3a, SW4a, SW3b, and SW4b are less likely to be etched than the dummy gate electrodes DG1 and DG2. Since the dummy gate electrodes DG1 and DG2 are formed of silicon, in this etching step, it is easy to ensure a high etching selectivity for each of the dummy gate electrodes DG1 and DG2. The control gate electrodes CG1 and CG2 and the memory gate electrodes MG1 and MG2, which are covered with the insulating film IL4, are not etched and remain unchanged.

As a result of the removal of the dummy gate electrodes DG1 and DG2, trenches (recessed portions or depressed portions) TR1 and TR2 are formed. The trench TR1 corresponds to the region from which the dummy gate electrode DG1 is removed, which is the region where the dummy gate electrode DG1 has been present until the dummy gate electrode DG1 is removed. The trench TR2 corresponds to the region from which the dummy gate electrode DG2 is removed, which is the region where the dummy gate electrode DG2 has been present until the dummy gate electrode DG2 is removed.

The bottom surface of the trench TR1 is formed of the upper surface of the insulating film GF2a. The bottom surface of the trench TR2 is formed of the upper surface of the insulating film GF2b. The respective side surfaces of the trenches TR1 and TR2 are formed of the offset spacers OS2. In the case where the offset spacers OS2 are not formed over the respective side surfaces of the multi-layer bodies LM3 and LM4, the respective side surfaces of the trenches TR1 and TR2 are formed of the sidewall spacers SW.

Figure 55:
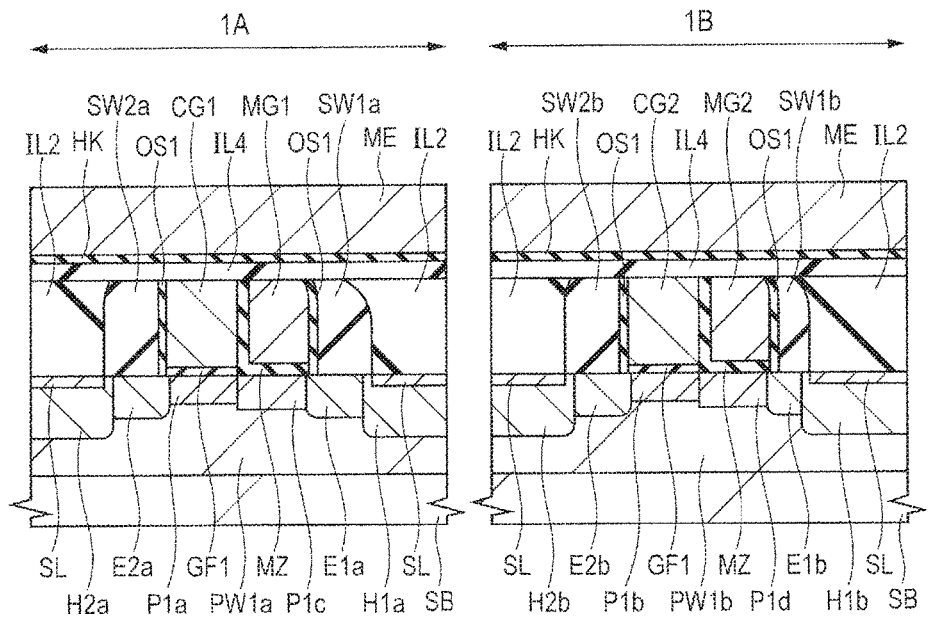
FIG. 55 is a main-portion cross-sectional view of the semiconductor device during the manufacturing process thereof, which is subsequent to FIG. 53.
Figure 56:
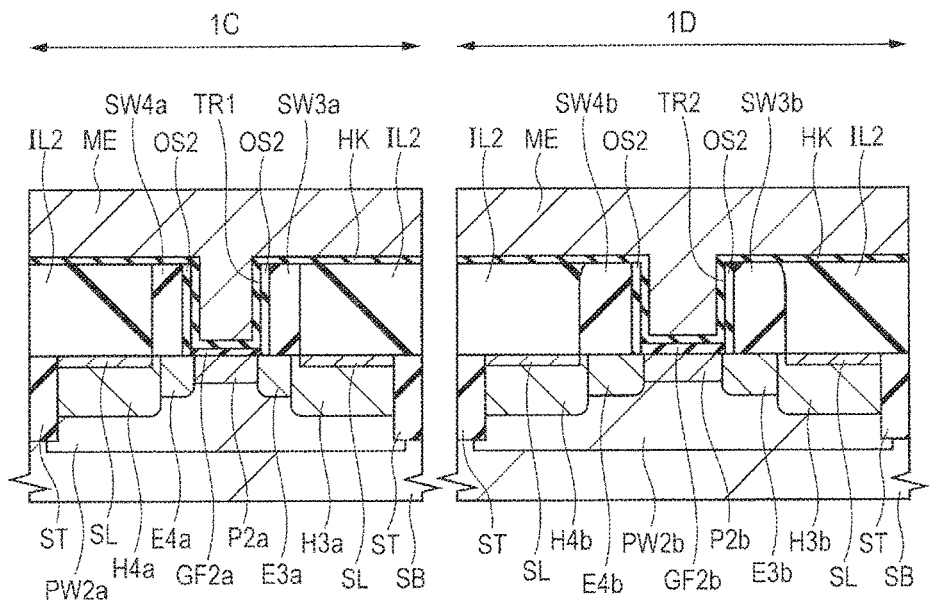
FIG. 56 is a main-portion cross-sectional view of the semiconductor device during the manufacturing process thereof, which is similar to FIG. 55.

Next, as shown in FIGS. 55 and 56, over the semiconductor substrate SB, i.e., over the insulating films IL2 and IL4 including the inner surfaces (bottom and side surfaces) of the trenches TR1 and TR2, the insulating film HK is formed as an insulating film for a high-dielectric-constant gate insulating film. The insulating film HK is made of a high-dielectric-constant insulating film. Then, over the semiconductor substrate SB, i.e., over the insulating film HK, a metal film ME is formed as a conductive film for the metal gate electrodes using a sputtering method or the like so as to be embedded in the trenches TR1 and TR2.

As the metal film ME, e.g., a titanium nitride (TiN) film, a tantalum nitride (TaN) film, a tungsten nitride (WN) film, a titanium carbide (TiC) film, a tantalum carbide (TaC) film, a tungsten carbide (WC) film, a tantalum carbonitride (TaCN) film, a titanium (Ti) film, a tantalum (Ta) film, a titanium aluminum (TiAl) film, an aluminum (Al) film, or the like can be used. The metal film ME is a conductive film showing metal conduction and is not limited to a pure metal film or an alloy film. The metal film ME may also be a metal compound film showing metal conduction. The metal film ME can also be a multi-layer film but, in that case, the lowermost layer of the multi-layer film is made of a metal film (conductive film showing metal conduction). The multi-layer film can also be a multi-layer film including a plurality of metal films.

Figure 57:
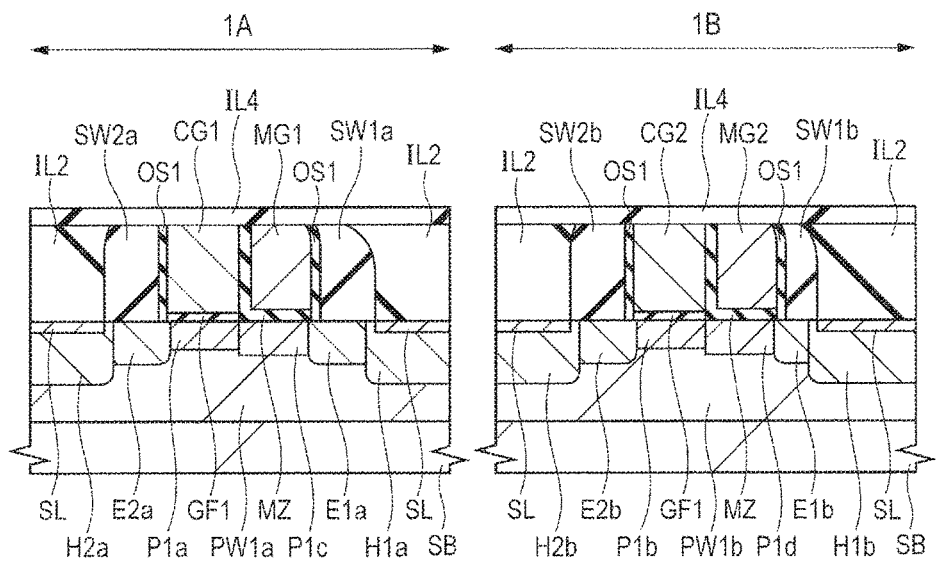
FIG. 57 is a main-portion cross-sectional view of the semiconductor device during the manufacturing process thereof, which is subsequent to FIG. 55.
Figure 58:
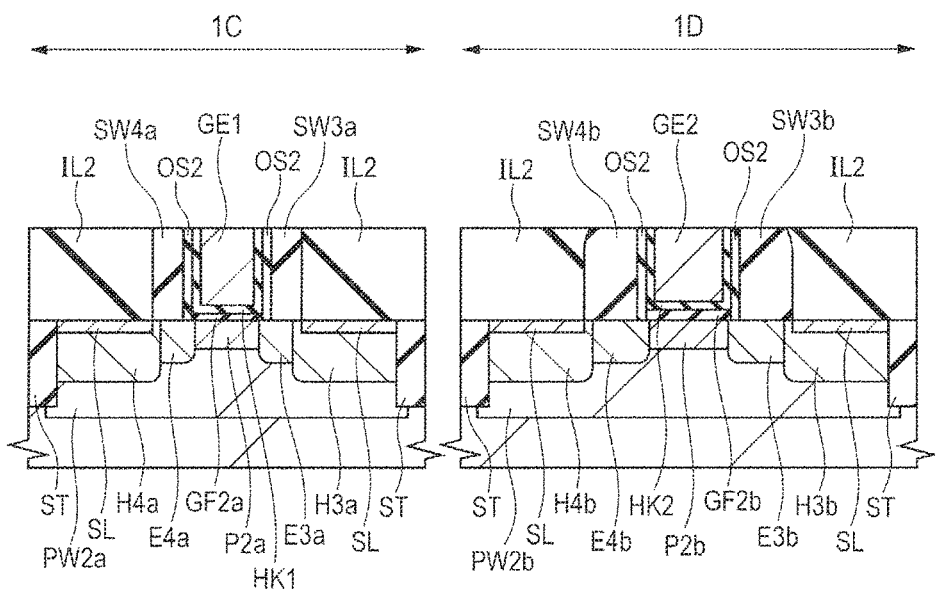
FIG. 58 is a main-portion cross-sectional view of the semiconductor device during the manufacturing process thereof, which is similar to FIG. 57.

Next, as shown in FIGS. 57 and 58, the unneeded metal film ME and the unneeded insulating film HK which are located outside the trenches TR1 and TR2 are removed by a CMP method or the like such that the insulating film HK and the metal film ME are embedded in the trenches TR1 and TR2. That is, the metal film ME and the insulating film HK which are located outside the trenches TR1 and TR2 are removed, while the insulating film HK and the metal film ME are left in the trenches TR1 and TR2. As a result, the metal film ME is embedded in each of the trenches TR1 and TR2 via the insulating film HK.

Thus, in the trench TR1 as the region from which the dummy gate electrode DG1 is removed, the gate electrode GE1 as the metal gate electrode is formed via the insulating film HK as the high-dielectric-constant insulating film. Also, in the trench TR2 as the region from which the dummy gate electrode DG1 is removed, the gate electrode GE2 as the metal gate electrode is formed via the insulating film HK as the high-dielectric-constant insulating film. The metal film ME embedded in the trench TR1 serves as the gate electrode GE1 of the lower-breakdown-voltage MISFET, and the insulating film HK embedded in the trench TR1 serves as the foregoing insulating film HK. On the other hand, the metal film ME embedded in the trench TR2 serves as the gate electrode GE2 of the higher-breakdown-voltage MISFET, and the insulating film HK embedded in the trench TR2 serves as the foregoing insulating film HK2.

Figure 59:
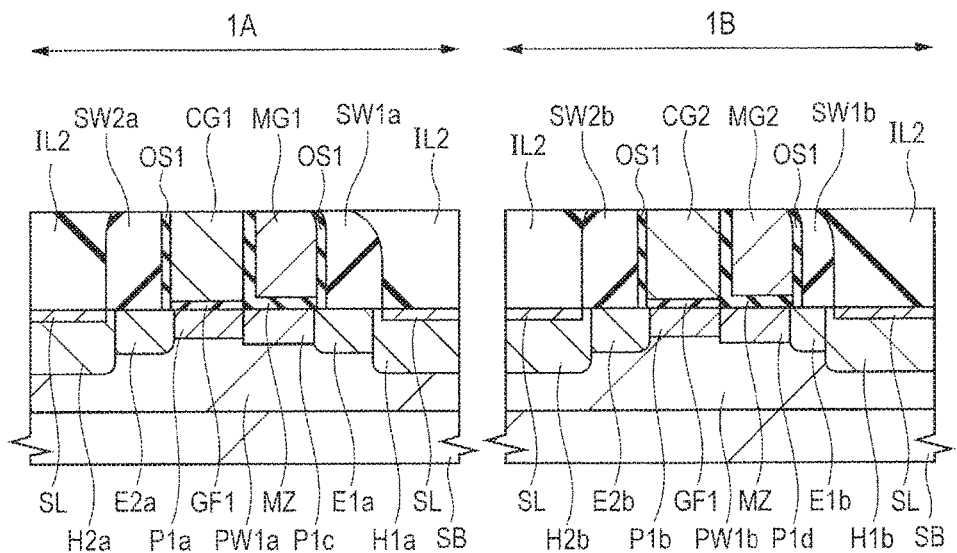
FIG. 59 is a main-portion cross-sectional view of the semiconductor device during the manufacturing process thereof, which is subsequent to FIG. 57.
Figure 60:
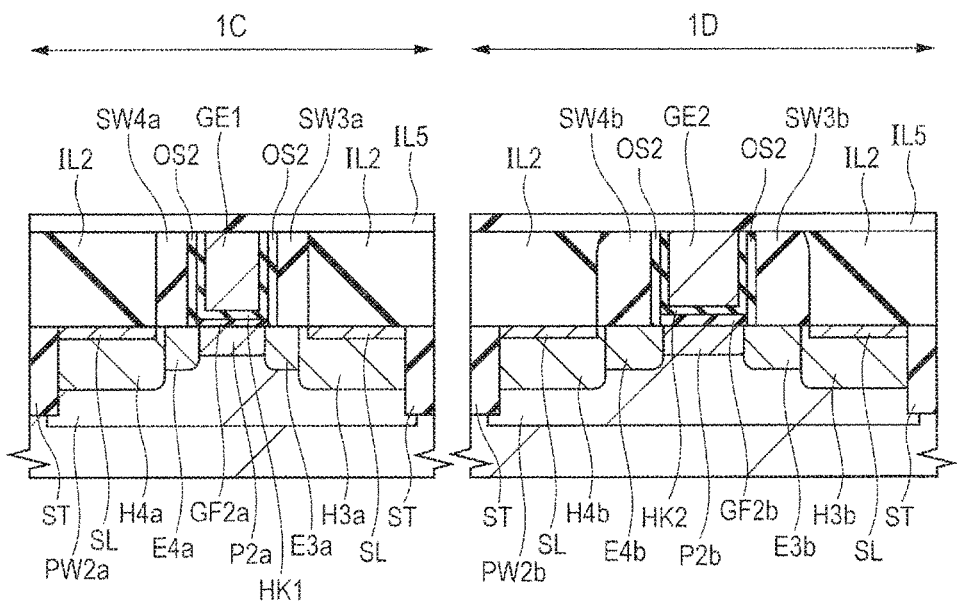
FIG. 60 is a main-portion cross-sectional view of the semiconductor device during the manufacturing process thereof, which is similar to FIG. 59.

Next, as shown in FIGS. 59 and 60, the insulating film IL4 is removed. Then, over the insulating film IL2, an insulating film IL5 is formed to cover the lower-breakdown-voltage MIS region 1C and the higher-breakdown-voltage MIS region 1D and expose the memory cell regions 1A and 1B. The insulating film IL5 can be formed by film deposition using a CVD method and by patterning using a photolithographic method and an etching method. As a result of forming the insulating film IL5, the gate electrodes GE1 and GE2 are covered with the insulating film IL5 and are not exposed, while the respective upper surfaces of the control gate electrodes CG1 and CG2 and the memory gate electrodes MG1 and MG2 are uncovered with the insulating film IL5 and exposed.

Figure 61:
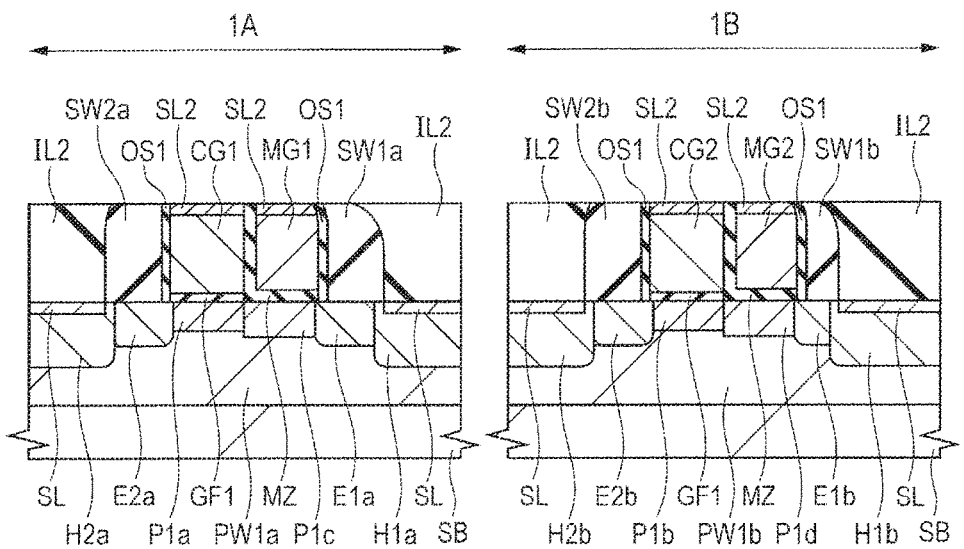
FIG. 61 is a main-portion cross-sectional view of the semiconductor device during the manufacturing process thereof, which is subsequent to FIG. 59.
Figure 62:
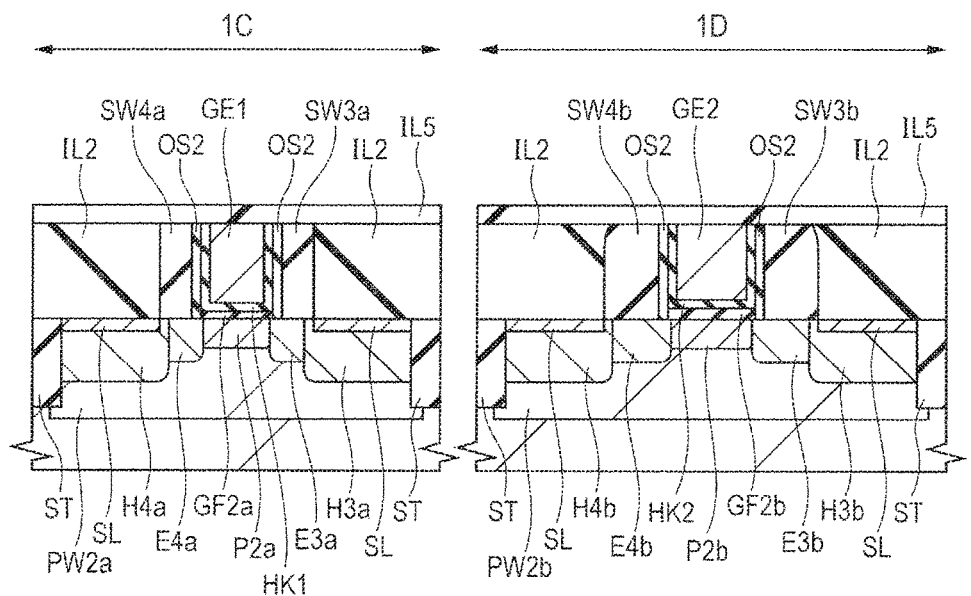
FIG. 62 is a main-portion cross-sectional view of the semiconductor device during the manufacturing process thereof, which is similar to FIG. 61.

Next, as shown in FIGS. 61 and 62, in the respective upper portions of the control gate electrodes CG1 and CG2 and the memory gate electrodes MG1 and MG2, the metal silicide layers SL2 are formed using a salicide technique.

Specifically, the metal silicide layers SL2 can be formed as follows. That is, over the insulating films IL2 and IL5 including the respective upper surfaces of the control gate electrodes CG1 and CG2 and the memory gate electrodes MG1 and MG2, a metal film for forming the metal silicide layers SL2 is formed. The metal film is made of, e.g., a cobalt (Co) film, a nickel (Ni) film, a nickel-platinum alloy film, or the like. Then, heat treatment is performed on the semiconductor substrate SB to cause the respective upper portions of the control gate electrodes CG1 and CG2 and the memory gate electrodes MG1 and MG2 to react with the foregoing metal film and thus form the metal silicide layers SL2. Subsequently, the unreacted metal film is removed. FIGS. 61 and 62 show cross-sectional views at this process stage. In Embodiment 1, the description has been given of the case where the metal silicide layers SL2 are formed in the respective upper surfaces of the control gate electrodes CG1 and CG2 and the memory gate electrodes MG1 and MG2. However, in another form, there may also be a case where the metal silicide layers SL2 are not formed.

Figure 63:
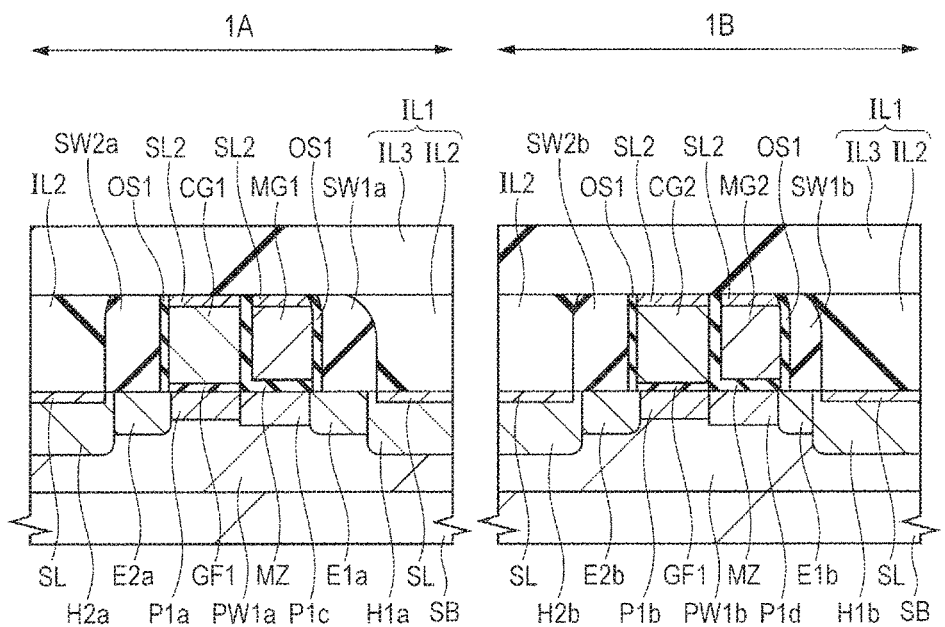
FIG. 63 is a main-portion cross-sectional view of the semiconductor device during the manufacturing process thereof, which is subsequent to FIG. 61.
Figure 64:
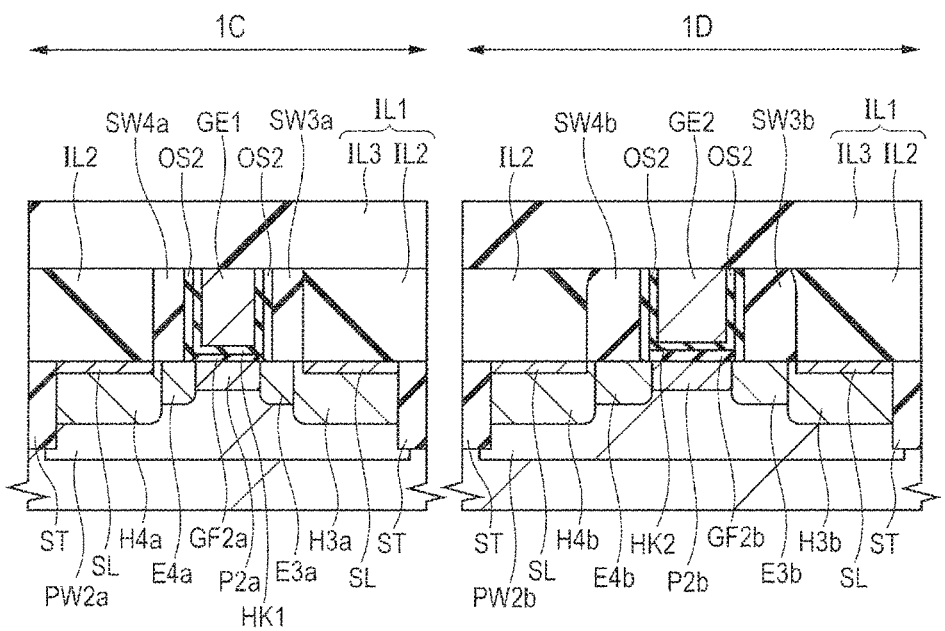
FIG. 64 is a main-portion cross-sectional view of the semiconductor device during the manufacturing process thereof, which is similar to FIG. 63.

Next, as shown in FIGS. 63 and 64, over the entire main surface of the semiconductor substrate SB, the insulating film (interlayer insulating film) IL3 is formed.

FIGS. 63 and 64 show the case where, after the insulating film IL5 is removed by etching or the like, the insulating film IL3 is formed over the insulating film IL2. However, in another form, the insulating film IL3 can also be formed without removing the insulating film IL5. As the insulating film IL3, e.g., an insulating film containing silicon dioxide as a main component can be used. After the formation of the insulating film IL3, it is also possible to enhance the planarity of the upper surface of the insulating film IL3 by performing the polishing of the upper surface of the insulating film IL3 using a CMP method or the like. The insulating films IL2 and IL3 are included in the interlayer insulating film IL1.

Figure 65:
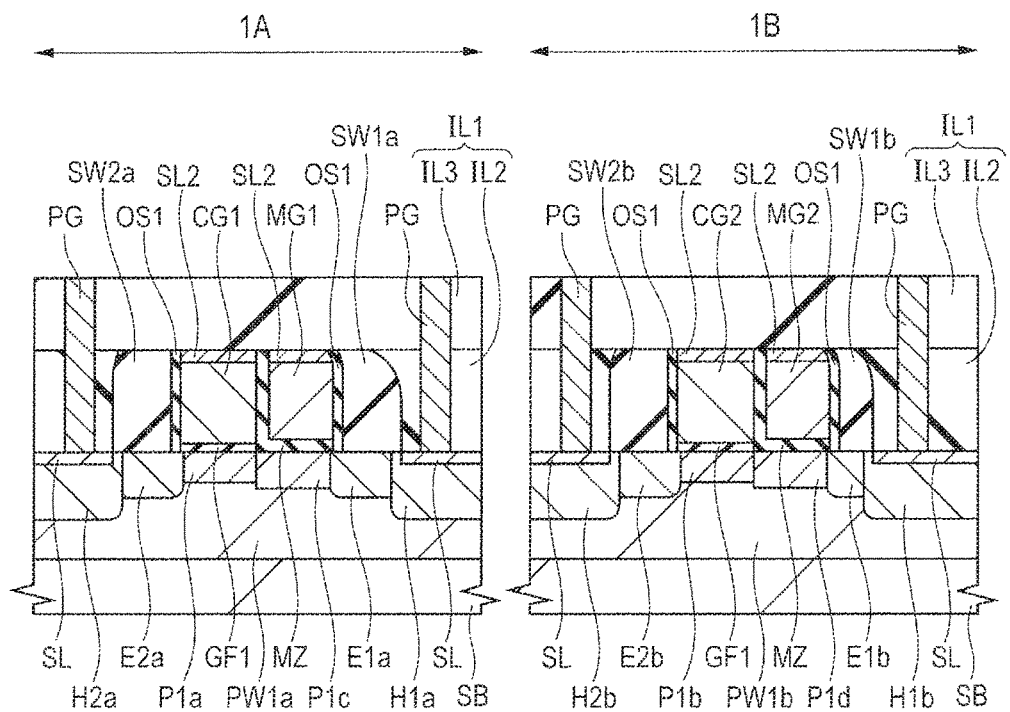
FIG. 65 is a main-portion cross-sectional view of the semiconductor device during the manufacturing process thereof, which is subsequent to FIG. 63.
Figure 66:
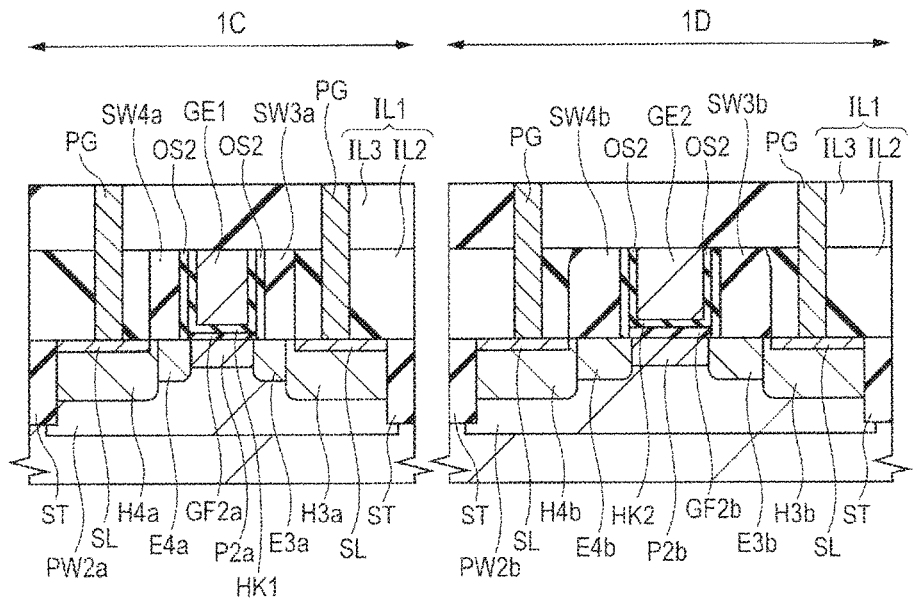
FIG. 66 is a main-portion cross-sectional view of the semiconductor device during the manufacturing process thereof, which is similar to FIG. 65.

Next, using a photolithographic method using a photoresist pattern (not shown) formed over the interlayer insulating film IL1 as an etching mask, the interlayer insulating film IL1 is dry-etched to be formed with the contact holes. Then, in the contact holes, as shown in FIGS. 65 and 66, the conductive plugs PG made of tungsten (W) or the like are formed as coupling conductor portions. The plugs PG can be formed by, e.g., successively forming a barrier conductor film and a tungsten film over the interlayer insulating film IL1 including the interiors of the contact holes and then removing the unneeded main conductor film and the unneeded barrier conductor film which are located outside the contact holes using a CMP method, an etch-back method, or the like.

Figure 67:
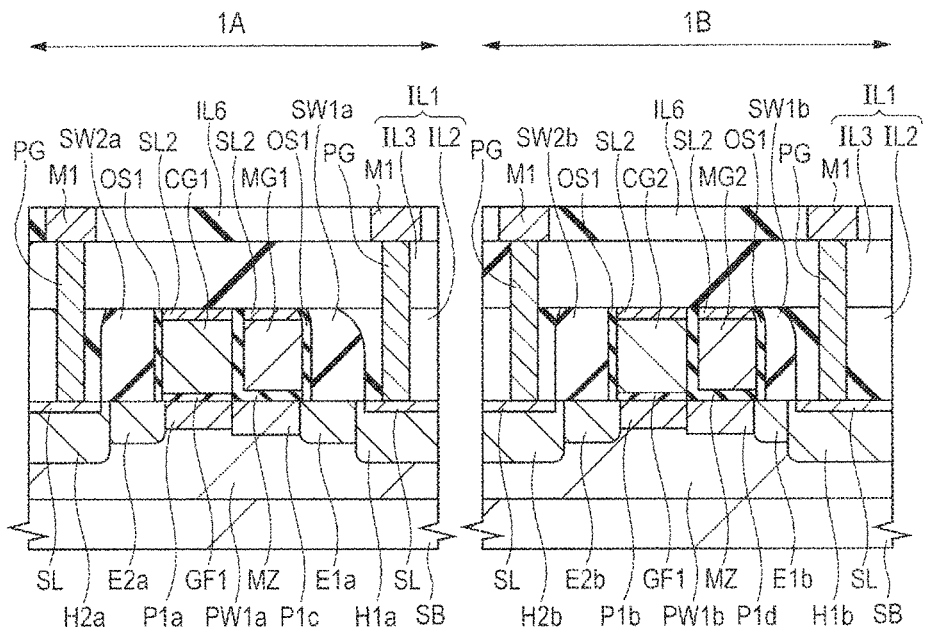
FIG. 67 is a main-portion cross-sectional view of the semiconductor device during the manufacturing process thereof, which is subsequent to FIG. 65.

Next, as shown in FIGS. 67 and 68, over the interlayer insulating film IL1 in which the plugs PG are embedded, the insulating film IL6 is formed. Subsequently, in the predetermined regions of the insulating film IL6, wire trenches are formed, and then the wires M1 are embedded in the wire trenches using a single damascene technique. The wires M1 are, e.g., copper wires (embedded copper wires) containing copper as a main component. The wires M1 are electrically coupled to the $n^+$-type semiconductor regions H1$a$, H2$a$, H1$b$, H2$b$, H3$a$, H4$a$, H3$b$, and H4$b$, the control gate electrodes CG1 and CG2, the memory gate electrodes MG1 and MG2, the gate electrodes GE1 and GE2, and the like.

Then, wires in the second and subsequent layers are formed using a dual damascene method or the like, but the illustration and description thereof is omitted herein. The wires M1 and the wires in the layers located thereabove are not limited to damascene wires and can also be formed by patterning a conductor film for wires. The wires M1 and the wires in the layers located thereabove can also be, e.g., tungsten wires, aluminum wires, or the like.

In this manner, the semiconductor device in Embodiment 1 is manufactured.

In Embodiment 1, the description has been given of the case where, over the control gate electrodes CG1 and CG2 and the dummy gate electrodes DG1 and DG2, the cap insulating films CP1, CP2, CP3, and CP4 are formed. However, in another form, the formation of the cap insulating films CP1, CP2, CP3, and CP4 can also be omitted.

Also, in Embodiment 1, the description has been given of the case where the dummy gate electrodes DG1 and DG2 are replaced with the gate electrodes GE1 and GE2 as the metal gate electrodes. However, in another form, it is also possible to use the dummy gate electrodes DG1 and DG2 as the gate electrodes of the MISFETs without replacing the dummy gate electrodes DG1 and DG2 with the metal gate electrodes. In this case, the lower-breakdown-voltage MISFET and the higher-breakdown-voltage MISFET have the configurations shown in FIG. 48 described above. The dummy gate electrode DG1 functions as the gate electrode (polysilicon gate electrode) of the lower-breakdown-voltage MISFET, and the dummy gate electrode DG2 functions as the gate electrode (polysilicon gate electrode) of the higherbreakdown-voltage MISFET. In this case, after the structures shown in FIGS. 47 and 48 described above are obtained, the foregoing insulating film IL2 is formed, and then the upper surface of the insulating film IL2 is planarized using a CMP method or the like. The polishing of the insulating film IL2 is ended before the multi-layer bodies LM1, LM2, and LM3 are exposed. Then, in the insulating film IL2, the contact holes are formed, and then the foregoing plugs PG are formed in the contact holes. Subsequently, over the insulating film IL2, the foregoing insulating film IL6 is formed. Then, in the insulating film IL6, the wire trenches are formed and, in the wire trenches, the foregoing wires M1 may be formed appropriately. In this case, a structure is obtained in which the cap insulating films CP1, CP2, CP3, and CP4 are formed over the control gate electrodes CG1 and CG2 and the dummy gate electrodes DG1 and DG2. However, the formation of the cap insulating films CP1, CP2, CP3, and CP4 may also be omitted.

<About Background to Study>

The present inventors have studied an example in which, in a semiconductor device including a non-volatile memory, memory cells in which memory transistors in a neutral state have different threshold voltages are placed in mixed relation.

In the semiconductor device in Embodiment 1, the memory cell MC1 shown in FIG. 3 and the memory cell MC2 shown in FIG. 4 are formed in the same semiconductor substrate SB, and a threshold voltage Vth1 of the memory transistor of the memory cell MC1 in the neutral state is different from a threshold voltage Vth2 of the memory transistor of the memory cell MC2 in the neutral state. Specifically, the threshold voltage Vth2 is lower than the threshold voltage Vth1 to satisfy Vth1>Vth2.

Note that the neutral state of a memory transistor corresponds to the state where no charge is injected in the charge storage portion (which is the insulating film MZ2 herein) of the memory transistor. Accordingly, the threshold voltage Vth1 of the memory transistor of the memory cell MC1 in the neutral state corresponds to the threshold voltage of the memory transistor of the memory cell MC1 in the state where no charge is injected in the gate insulating film of the memory transistor thereof. Also, the threshold voltage Vth2 of the memory transistor of the memory cell MC2 in the neutral state corresponds to the threshold voltage of the memory transistor of the memory cell MC2 in the state where no charge is injected in the gate insulating film of the memory transistor thereof.

Figure 69:
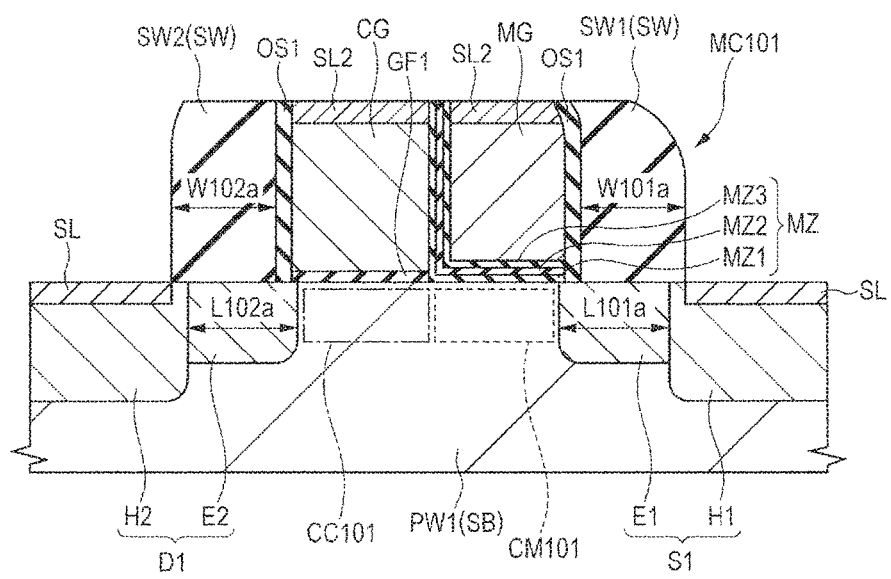
FIG. 69 is a main-portion cross-sectional view of a semiconductor device in a studied example.
Figure 70:
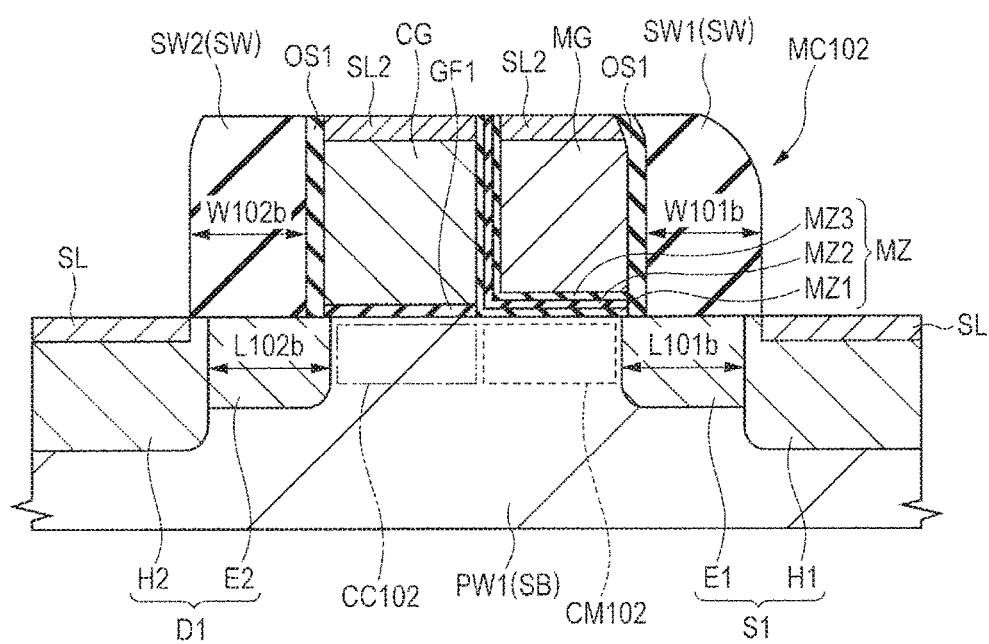
FIG. 70 is a main-portion cross-sectional view of the semiconductor device in the studied example.

FIGS. 69 and 70 are main-portion cross-sectional views of a semiconductor device in the studied example studied by the present inventors and correspond to FIGS. 3 and 4 described above in Embodiment 1.

In the semiconductor device in the studied example, a memory cell MC101 as shown in FIG. 69 and a memory cell MC102 as shown in FIG. 70 are formed in the same semiconductor substrate SB. A threshold voltage Vth101 of the memory transistor of the memory cell MC101 shown in FIG. 69 in the neutral state is different from a threshold Vth102 of the memory transistor of the memory cell MC102 shown in FIG. 70 in the neutral state. Specifically, the threshold voltage Vth102 is lower than the threshold voltage Vth101 (Vth101>Vth102).

The memory cell (MC1 or MC101) in which the memory transistor in the neutral state has a high threshold voltage (Vth1 or Vth101) is suited for a use application in which a high-speed operation is desired, but the number of times rewriting is performed is small, e.g., for storing program data. On the other hand, the memory cell (MC102 or MC2) in which the memory transistor in the neutral state has a low threshold voltage (Vth102 or Vth2) is suited for a use application in which a high-speed operation is not required, though the number of times rewriting is performed is large, e.g., for storing processed data.

That is, when the number of times rewiring is performed is large, the threshold voltage of the memory transistor in the neutral state is preferably set rather low to reduce the possibility of degradation due to rewriting (especially an erase operation). On the other hand, when the number of times rewriting is performed is small, there is no need to care about degradation due to repeated rewriting. Accordingly, the threshold voltage of the memory transistor in the neutral state is preferably set high to be able to increase an injection speed and the operation speed. Therefore, by forming memory cells in which memory transistors in the neutral state have different threshold voltages in the different memory regions of the same semiconductor substrate and selectively using the memory regions in accordance with use purpose, the performance of the semiconductor device can be improved.

In the case of the studied example, unlike in Embodiment 1, the widths of the sidewall spacers SW are equal in each of the memory cell MC101 in FIG. 69 and the memory cell MC102 in FIG. 70. That is, a width W101a of the sidewall spacer SW1 and a width W102a of the sidewall spacer SW2 in the memory cell MC101 shown in FIG. 69 are equal to a width W101b of the sidewall spacer SW1 and a width W102b of the sidewall spacer SW2 shown in FIG. 70 to satisfy W101a=W102a=W101b=W102b. Reflecting W101a=W102a=W101b=W102b, a dimension L101a of the n⁻-type semiconductor region E1 and a dimension L102a of the n⁻-type semiconductor region E2 of the memory cell MC101 shown in FIG. 69 are equal to a dimension L101b of the n⁻-type semiconductor region E1 and a dimension L102b of the n⁻-type semiconductor region E2 of the memory cell MC102 shown in FIG. 70 to satisfy L101a=L102a=L101b=L102b.

As a method for controlling the threshold voltage of a memory transistor, it is effective to adjust the impurity concentration of the channel formation region of the memory transistor. In the case of the studied example, the effective p-type impurity concentration in a channel formation region CM102 of the memory transistor of the memory cell MC102 in FIG. 70 is set lower than the effective p-type impurity concentration in a channel formation region CM101 of the memory transistor of the memory cell MC101 in FIG. 69. This allows the threshold voltage Vth102 of the memory transistor of the memory cell MC102 in FIG. 70 to be lower than the threshold voltage Vth101 of the memory transistor of the memory cell MC101 in FIG. 69 (Vth101>Vth102).

The impurity concentration of the channel formation region of a memory transistor can be adjusted by channel doping ion implantation performed in the step shown in FIG. 17 described above. In the case of the studied example, it is assumed that the memory cell MC101 in FIG. 69 is formed in the foregoing memory cell region 1A, and the memory cell MC102 in FIG. 70 is formed in the foregoing memory cell region 1B. The effective p-type impurity concentration in the channel formation region CM101 in FIG. 69 is mainly defined by the effective p-type impurity concentration in the foregoing p-type semiconductor region P1c. The effective p-type impurity concentration in the channel formation region CM102 in FIG. 70 is mainly defined by the effective p-type impurity concentration in the foregoing p-type semiconductor region P1d.

Accordingly, in the case of the studied example, in the step shown in FIG. 17 described above, channel doping ion implantation for the foregoing memory cell region 1A and channel doping ion implantation for the foregoing memory cell region 1B are individually performed, and the dose of the n-type impurity in the channel doping ion implantation for the foregoing memory cell region 1B is set higher than the dose of the n-type impurity in the channel doping ion implantation for the foregoing memory cell region 1A. As a result, the effective p-type impurity concentration in the p-type semiconductor region P1$d$ of the foregoing memory cell region 1B is lower than the effective p-type impurity concentration in the p-type semiconductor region P1$c$ of the foregoing memory cell region 1A. This allows the effective p-type impurity concentration in the channel formation region CM102 in FIG. 70 to be lower than the effective p-type impurity concentration in the channel formation region CM101 in FIG. 69. Therefore, the threshold voltage Vth102 of the memory transistor of the memory cell MC102 in FIG. 70 can be set lower than the threshold voltage Vth101 of the memory transistor of the memory cell MC101 in FIG. 69 (Vth101>Vth102).

However, the present inventors have found that, in the case of the studied example, the following problems to be solved arise.

That is, in the case of the studied example, in the step shown in FIG. 17 described above, it is necessary to individually perform channel doping ion implantation for the foregoing memory cell region 1A and channel doping ion implantation for the foregoing memory cell region 1B. This increases the number of the manufacturing process steps and the manufacturing cost of the semiconductor device. In addition, an extra photomask is needed to also increase the manufacturing cost of the semiconductor device. This is the first problem to be solved.

The impurity concentration in the channel formation region of a control transistor can be adjusted by the channel doping ion implantation performed in the step shown in FIG. 11 described above. The effective p-type impurity concentration in a channel formation region CC101 of the control transistor of the memory cell MG101 is mainly defined by the effective p-type impurity concentration in the foregoing p-type semiconductor region P1$a$. The effective p-type impurity concentration in a channel formation region CC102 of the control transistor of the memory cell MG102 is mainly defined by the effective p-type impurity concentration in the foregoing p-type semiconductor region P1$b$. In the step shown in FIG. 11 described above, if the channel doping ion implantation for the foregoing memory cell region 1A and the channel doping ion implantation for the foregoing memory cell region 1B are performed by the same ion implantation step, in the structure shown in FIG. 11 described above, the p-type impurity concentration in the p-type semiconductor region P1$c$ is substantially equal to the p-type impurity concentration in the p-type semiconductor region P1$d$. In this case, the effective p-type impurity concentration in the channel formation region CC101 in FIG. 69 is substantially equal to the effective p-type impurity concentration in the channel formation region CC102 in FIG. 70, and the threshold voltage of the control transistor of the memory cell MC101 should be equal to the threshold voltage of the control transistor of the memory cell MC102.

However, in an actual situation, the n-type impurity implanted by the channel doping ion implantation for the memory transistor (ion implantation for forming the foregoing p-type semiconductor region P1$c$ or P1$d$) is diffused also in a lateral direction in activation anneal or the like to be more or less introduced even into the channel formation region (CC101 or CC102) of the control transistor. The amount of the introduced n-type impurity is larger as the dose in the channel doping ion implantation for the memory transistor is higher. That is, increasing the dose of the n-type impurity in the channel doping ion implantation for the memory transistor functions not only to reduce the effective p-type impurity concentration in the channel formation region of the memory transistor, but also to reduce the effective p-type impurity concentration in the channel formation region of the control transistor.

In the case of the studied example, to set the effective p-type impurity in the channel formation region CM102 lower than the effective p-type impurity concentration in the channel formation region CM101, it is necessary to set the dose of the n-type impurity in the channel doping ion implantation for forming the foregoing p-type semiconductor region P1$d$ higher than the dose of the n-type impurity in the channel doping ion implantation for forming the foregoing p-type semiconductor region P1$c$. However, this functions to reduce the effective p-type impurity concentration in the channel formation region CC102 for the control transistor of the memory cell MC102 to a level lower than the effective p-type impurity concentration in the channel formation region CC101 for the control transistor of the memory cell MC101. As a result, even the respective threshold voltages of the control transistors of the memory cells MC101 and MC102 differ from each other. Specifically, the threshold voltage of the control transistor of the memory cell MC102 is lower than the threshold voltage of the control transistor of the memory cell MC101. This is the second problem to be solved.

In the memory cells MC101 and MC102, the memory transistors in the neutral state have different threshold voltages. However, when consideration is given to an operation to each of the memory cells, a circuit which supplies the operation voltage thereto, and the like, it is desirable that the threshold voltage of the control transistor of the memory cell MC101 is equal to the threshold voltage of the control transistor of the memory cell MC102.

However, in the case of the studied example, when the threshold voltage Vth102 of the memory transistor of the memory cell MC102 is set lower than the threshold voltage Vth101 of the memory transistor of the memory cell MC101, the threshold voltage of the control transistor of the memory cell MC102 is also lower than the threshold voltage of the control transistor of the memory cell MC101.

Accordingly, in the case of the studied example, to set the threshold voltage of the control transistor of the memory cell MC101 equal to the threshold voltage of the control transistor of the memory cell MC102, it can be considered to increase the gate length of each of the control gate electrodes CG of the memory cells MC101 and MC102. When the gate length of each of the control gate electrodes CG of the memory cells MC101 and MC102 is increased, even if the dose of the n-type impurity in the channel doping ion implantation for the memory transistor is increased, the channel formation region of the control transistor is less likely to be affected thereby. This allows the threshold voltage of the control transistor of the memory cell MC101 to be substantially equal to the threshold voltage of the control transistor of the memory cell MC102. However, increasing the gate length of each of the control gate electrodes CG of the memory cells MC101 and MC102 undesirably results in an increase in the two-dimensional size of the semiconductor device.

Also, in the case of the studied example, to set the threshold voltage of the control transistor of the memory cell MC101 equal to the threshold voltage of the control transistor of the memory cell MC102, it can be considered to increase the concentration of the p-type halo region surrounding the n⁻-type semiconductor region E2 of the memory cell MC102 to a level higher than the concentration of the p-type halo region surrounding the n⁻-type semiconductor region E2 of the memory cell MC101. However, to achieve this, it is necessary to form the p-type halo region surrounding the n⁻-type semiconductor region E2 of the memory cell MC102 and the p-type halo region surrounding the n⁻-type semiconductor region E2 of the memory cell MC101 in different ion implantation steps, resulting in an increase in the manufacturing cost of the semiconductor device.

<About Main Characteristic Features and Effects>

One of the main characteristic features of Embodiment 1 is that the memory cells MC1 and MC2 in which the memory transistors in the neutral state have different threshold voltages are formed in the same semiconductor substrate SB. That is, the threshold voltage Vth1 of the memory transistor of the memory cell MC1 in the neutral state which is formed in the memory cell region 1A of the semiconductor substrate SB is different from the threshold voltage Vth2 of the memory transistor of the memory cell MC2 in the neutral state which is formed in the memory cell region 1B of the semiconductor substrate SB. Specifically, the threshold voltage Vth2 of the memory transistor of the memory cell MC2 in the neutral state is lower than the threshold voltage Vth1 of the memory transistor of the memory cell MC1 in the neutral state (Vth1>Vth2).

Another one of the main characteristic features of Embodiment 1 is that the width W1b of the sidewall spacer SW1b in the memory cell MC2 is smaller than the width W1a of the sidewall spacer SW1a in the memory cell MC1 (W1a>W1b).

In Embodiment 1, by adjusting the widths (W1a and W1b) of the sidewall spacers SW1, the threshold voltages (Vth1 and Vth2) of the memory transistors of the memory cells (MC1 and MC2) in the neutral state are controlled. That is, by setting the width W1b of the sidewall spacer SW1b in the memory cell MC2 smaller than the width W1a of the sidewall spacer SW1a in the memory cell MC1 (W1a>W1b), the threshold voltage Vth2 of the memory cell transistor of the memory cell MC2 in the neutral state is controlled to be lower than the threshold voltage Vth1 of the memory transistor of the memory cell MC1 in the neutral state (Vth1>Vth2).

Figure 71:
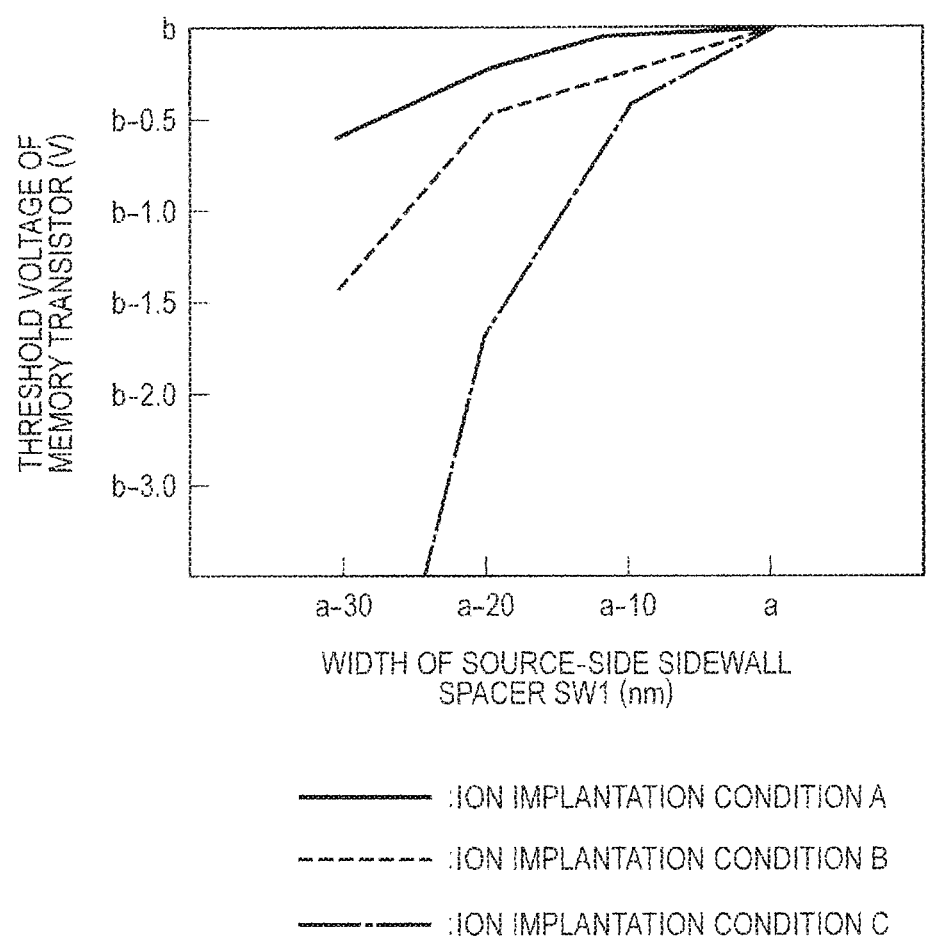
FIG. 71 is a graph showing the correlation between the width of a source-side sidewall spacer and the threshold voltage of a memory transistor in a neutral state.

A description will be given of the reason that the threshold voltages of the memory transistors of the memory cells in the neutral state can be controlled by adjusting the widths of the sidewall spacers SW1 with reference to the graph of FIG. 71. FIG. 71 is the graph showing the correlation between the width of the source-side sidewall spacer SW1 and the threshold voltage of the memory transistor in the neutral state. FIG. 71 shows the result of selecting among three conditions, i.e., "Ion Implantation Condition A", "Ion Implantation Condition B", and "Ion Implantation Condition C" as an ion implantation condition for forming the n⁺-type semiconductor region H1 and performing simulation under each of the ion implantation conditions. Note that the dose of the n-type impurity is highest under the "Ion Implantation Condition C" and lowest under the "Ion Implantation Condition A".

As can be seen also from the graph of FIG. 71, as the width of the source-side sidewall spacer SW1 is smaller, the threshold voltage of the memory transistor in the neutral state is lower and, as the dose of the n-type impurity in the ion implantation for forming the n⁺-type semiconductor region H1 is higher, the threshold voltage of the memory transistor in the neutral state is lower. This indicates that the effective p-type impurity concentration in each of the channel formation regions (CM1 and CM2) of the memory transistors is affected by the n-type impurity implanted by the ion implantation for forming the n⁺-type semiconductor region H1, and the influence received by the effective p-type impurity concentration is larger as the width of the sidewall spacer SW1 is smaller and as the dose of the n-type impurity in the ion implantation for forming the n⁺-type semiconductor region H1 is higher. This is because the n-type impurity implanted by the ion implantation for forming the n⁺-type semiconductor region H1 is diffused also in a lateral direction by activation anneal or the like to be more or less introduced into each of the channel formation regions (CM1 and CM2) of the memory transistors, and the amount of the introduced n-type impurity is larger as the width of the sidewall spacer SW1 is smaller and as the dose in the ion implantation for forming the n⁺-type semiconductor region H1 is higher.

That is, when the width of the sidewall spacer SW1 is reduced, the space (distance) between the n⁺-type semiconductor region H1 and the channel formation region of the memory transistor is reduced. As a result, the n-type impurity implanted for the n⁺-type semiconductor region H1 is more likely to be introduced also into the channel formation region of the memory transistor so that the effective p-type impurity concentration in the channel formation region of the memory transistor is reduced. Also, when the dose in the ion implantation for forming the n⁺-type semiconductor region H1 is increased, the amount of the n-type impurity implanted for the n⁺-type semiconductor region H1 and introduced into the channel formation region of the memory transistor is also increased to reduce the effective p-type impurity concentration in the channel formation region of the memory transistor. Thus, reducing the width of the sidewall spacer SW1 functions to reduce the effective p-type impurity concentration in the channel formation region of the memory transistor and therefore functions to reduce the threshold voltage of the memory transistor in the neutral state.

Accordingly, in Embodiment 1, the width W1b of the sidewall spacer SW1b of the memory cell MC2 is set smaller than the width W1a of the sidewall spacer SW1a of the memory cell MC1 (W1a>W1b). As a result, the space (space in the gate length direction of the memory gate electrode MG2) between the memory gate electrode MG2 (side surface thereof) and the n⁺-type semiconductor region H1b in the memory cell MC2 is smaller than the space (space in the gate length direction of the memory gate electrode MG1) between the memory gate electrode MG1 and the n⁺-type semiconductor region H1a in the memory cell MC1. That is, the space between the n⁺-type semiconductor region H1b and the channel formation region CM2 of the memory transistor in the memory cell MC2 can be reduced to be smaller than the space between the n⁺-type semiconductor region H1a and the channel formation region CM1 of the memory transistor in the memory cell MC1. This allows the amount of the n-type impurity implanted for the n⁺-type semiconductor region H1b and introduced into the channel formation region CM2 of the memory transistor in the memory cell MC2 to be larger than the amount of the n-type impurity implanted for the n⁺-type semiconductor region H1a and introduced into the channel formation region CM1 of the memory transistor in the memory cell MC1. Thus, it is possible to set the effective p-type impurity concentration in the channel formation region CM2 of the memory transistor of the memory cell MC2 lower than the effective p-type impurity concentration in the channel formation region of the memory transistor of the memory cell MC1. Therefore, the threshold voltage Vth2 of the memory cell MC2 can be set lower than the threshold voltage Vth1 of the memory cell MC1 (Vth1>Vth2).

For example, a case is assumed where the threshold voltage Vth2 of the memory cell MC2 is set lower than the threshold voltage Vth1 of the memory cell MC1 by 0.5 V. FIG. 71 indicates that, when the "Ion Implantation Condition B" is to be used as the ion implantation condition for the n$^+$-type semiconductor regions H1a and H1b, to ensure a 0.5 V difference between the threshold voltages Vth2 and Vth1 of the memory cells MC2 and MC1, it is sufficient to ensure a difference of about 20 nm between the widths W1b and W1a of the sidewall spacers SW1b and SW1a. There is also a case where the width W1a of the sidewall spacer SW1a is determined by limitations on the higher-breakdown-voltage MISFET and the width W1b of the sidewall spacer SW1b is determined by limitations on the lower-breakdown-voltage MISFET. In such a case, by appropriately selecting the ion implantation condition for the n$^+$-type semiconductor regions H1a and H1b on the basis of the difference between the widths W1b and W1a of the sidewall spacers SW1b and SW1a, it is possible to ensure a 0.5 V difference between the threshold voltages Vth2 and Vth1 of the memory cells MC2 and MC1.

Thus, in Embodiment 1, by adjusting the width of the sidewall spacer SW1, the threshold voltage of the memory transistor of the memory cell in the neutral state is controlled. That is, by forming the sidewall spacers SW1a and SW1b so as to satisfy W1a>W1b, the relationship given by Vth1>Vth2 is established. Consequently, in the case of Embodiment 1, the channel doping ion implantation for the memory cell region 1A (ion implantation for forming the p-type semiconductor region P1c) and the channel doping ion implantation for the memory cell region 1B (ion implantation for forming the p-type semiconductor region P1d) can be performed by the same ion implantation step shown in FIG. 17 described above. That is, the p-type semiconductor region P1c in the memory cell region 1A and the p-type semiconductor region P1d in the memory cell region 1B can be formed in the same ion implantation step. This can reduce the number of steps in the manufacturing process of the semiconductor device and reduce (suppress) the manufacturing cost of the semiconductor device.

In Embodiment 1, the ion implantation for forming the p-type semiconductor region P1c and the ion implantation for forming the p-type semiconductor region P1d can be performed by the same ion implantation step. Accordingly, the dose of the n-type impurity implanted into the p-type semiconductor region P1c can be set substantially equal to the dose of the n-type impurity implanted into the p-type semiconductor region P1d. This allows the ion implantation for forming the p-type semiconductor region P1d to exert the same influence on each of the channel formation region CC1 of the control transistor of the memory cell MC1 and the channel formation region CC2 of the control transistor of the memory cell MC2. That is, it is possible to allow the channel formation region CC1 of the control transistor of the memory cell MC1 and the channel formation region CC2 of the control transistor of the memory cell MC2 to have substantially equal impurity distributions (impurity profiles). In other words, it is possible to allow the channel formation region CC1 of the control transistor of the memory cell MC1 and the channel formation region CC2 of the control transistor of the memory cell MC2 to have substantially equal effective p-type impurity concentrations. This allows the threshold voltage of the control transistor of the memory cell MC1 to be substantially equal to the threshold voltage of the control transistor of the memory cell MC2.

That is, in Embodiment 1, by forming the sidewall spacers SW1a and SW1b so as to satisfy W1a>W1b, it is possible to establish the relationship given by Vth1>Vth2 between the threshold voltages of the memory transistors of the memory cells MC1 and MC2 and allow the respective control transistors of the memory cells MC1 and MC2 to have substantially equal threshold voltages. This can improve the performance of the semiconductor device.

Also, in Embodiment 1, the width W2a of the sidewall spacer SW2a in the memory cell MC1 is substantially equal to the width W2b of the sidewall spacer SW2b in the memory cell MC2 (W2a=W2b). This allows the amount of the n-type impurity implanted for the n$^+$-type semiconductor region H2a and introduced into the channel formation region CC1 of the control transistor of the memory cell MC1 to be substantially equal to the amount of the n-type impurity implanted for the n$^+$-type semiconductor region H2b and introduced into the channel formation region CC2 of the control transistor of the memory cell MC2. This also functions to allow the channel formation region CC1 of the control transistor of the memory cell MC1 and the channel formation region CC2 of the control transistor of the memory cell MC2 to have substantially equal impurity distributions and substantially equal effective p-type impurity concentrations. Accordingly, by forming the sidewall spacers SW1a, SW1b, SW2a, and SW2b so as to satisfy W1a>W1b and W2a=W2b, it is possible to establish the relationship given by Vth1>Vth2 between the respective threshold voltages of the memory transistors of the memory cells MC1 and MC2 and reliably and appropriately allow the respective control transistors of the memory cells MC1 and MC2 to have substantially equal threshold voltages.

In Embodiment 1, the channel doping ion implantation for the control transistor of the memory cell MC1 (ion implantation for forming the p-type semiconductor region P1a) and the channel doping ion implantation for the control transistor of the memory cell MC2 (ion implantation for forming the p-type semiconductor region P1b) can be performed by the same ion implantation step. Also, in Embodiment 1, the channel doping ion implantation for the memory transistor of the memory cell MC1 (ion implantation for forming the p-type semiconductor region P1c) and the channel doping ion implantation for the memory transistor of the memory cell MC2 (ion implantation for forming the p-type semiconductor region P1d) can be performed by the same ion implantation step. In this case, if the widths of all the sidewall spacers SW in the memory cells MC1 and MC2 are equal unlike in Embodiment 1, in the memory cells MC1 and MC2, the memory transistors in the neutral state have equal threshold voltages and the control transistors also have equal threshold voltages. However, in Embodiment 1, by setting the width W1b of the sidewall spacer SW1b smaller than the width W1a of the sidewall spacer SW1a, the effective p-type impurity concentration in the channel formation region CM2 is reduced to be lower than the effective p-type impurity concentration in the channel formation region CM1 to allow the relationship given by Vth1>Vth2 to be established for the memory transistors in the memory cells MC1 and MC2. By also setting the width W2b of the sidewall spacer SW2b equal to the width W2a of the sidewall spacer SW2a, the effective p-type impurity concentration in the channel formation region CC2 to be substantially equal to the effective p-type impurity in the channel formation region CC1 to allow the respective control transistors of the memory cells MC1 and MC2 to have substantially equal threshold voltages.

Thus, in Embodiment 1, the threshold voltages in the memory cells MC1 and MC2 can be controlled by adjusting, not the channel doping ion implantation, but the widths of the sidewall spacers SW. This allows the performance of the semiconductor device to be enhanced, while reducing (suppressing) the manufacturing cost of the semiconductor device.

Also, in Embodiment 1, not only the memory cells MC1 and MC2, but also the MISFET 2a having the sidewall spacers SW3a and SW4a having the small widths W3a and W4a and the MISFET 2b having the sidewall spacers SW3b and SW4b having the widths W3b and W4b larger than the widths W3a and W4a are formed as the MISFETs for peripheral circuits in the same semiconductor substrate SB. To satisfy W1a>W1b, the width W1a of the sidewall spacer SW1a for the memory cell MC1 is set equal to the width W3b of the sidewall spacer SW3b (W1a=W3b) and the width W1b of the sidewall spacer SW1b for the memory cell MC2 is set equal to the width W3a of the sidewall spacer SW3a (W1b=W3a). That is, the width W1a of the sidewall spacer SW1a for the memory cell MC1 is set in accordance with the width W3b of the sidewall spacer SW3b, and the width W1b of the sidewall spacer SW1b is set in accordance with the width W3a of the sidewall spacer SW3a. In other words, by using the widths W3a and W4a of the sidewall spacers SW3a and SW4a for the lower-breakdown-voltage MISFET which are smaller than the widths W3b and W4b of the sidewall spacers SW3b and SW4b for the higher-breakdown-voltage MISFET, the width W1b of the sidewall spacer SW1b for the memory cell MC2 is reduced to be smaller than the width W1a of the sidewall spacer SW1a for the memory cell MC1. Since it is possible to allow the width W1b of the sidewall spacer SW1b for the memory cell MC2 to be smaller than the width W1a of the sidewall spacer SW1a for the memory cell MC1 without adding an extra process step, the manufacturing cost of the semiconductor device can be reduced (suppressed).

(Embodiment 2)

Figure 72:
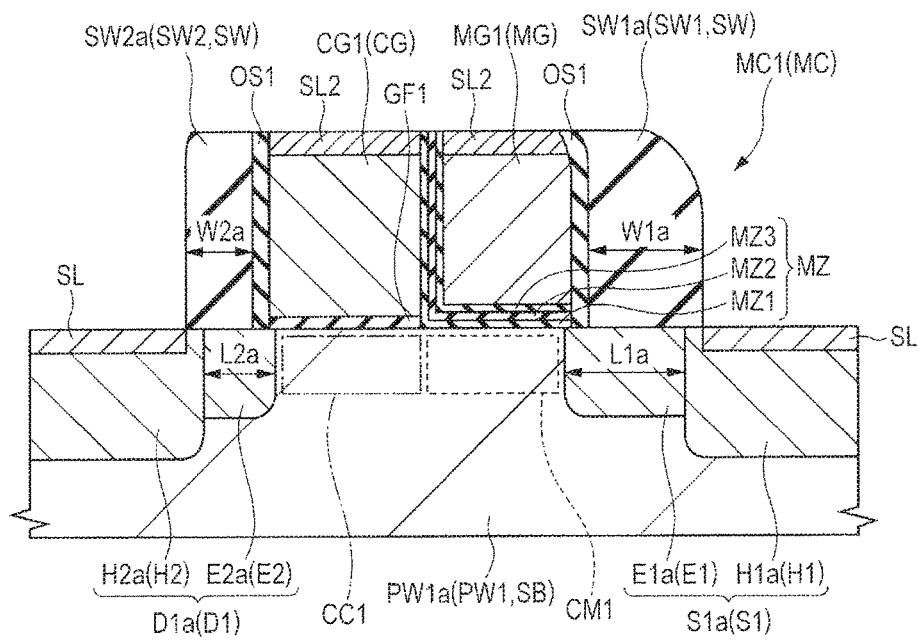
FIG. 72 is a main-portion cross-sectional view of a semiconductor device in another embodiment.
Figure 73:
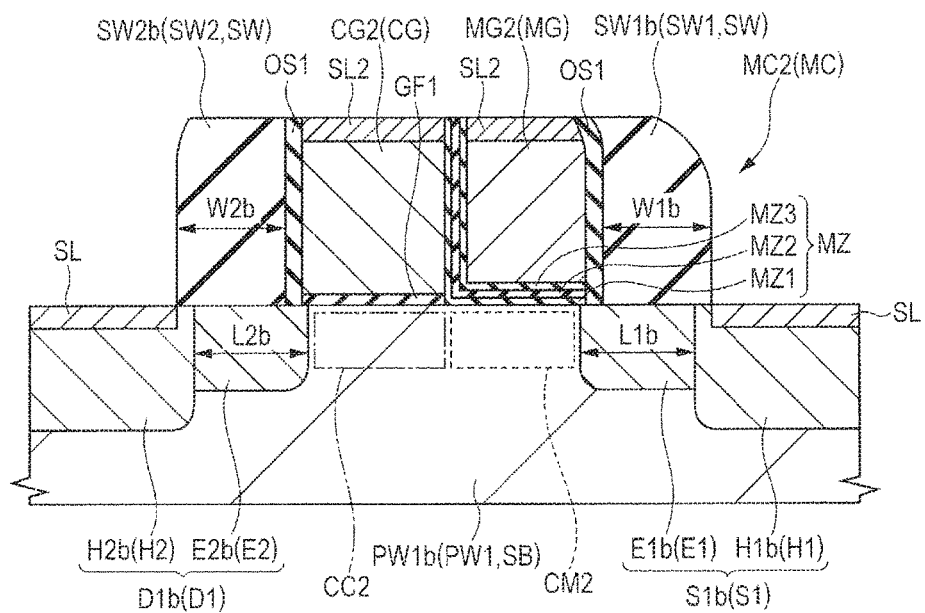
FIG. 73 is a main-portion cross-sectional view of the semiconductor device in the other embodiment.

FIGS. 72 and 73 are main-portion cross-sectional views of a semiconductor device in Embodiment 2, which respectively correspond to FIGS. 3 and 4 described above. That is, FIG. 72 shows the memory cell MC1 formed in the memory region 1A, and FIG. 73 shows the memory cell MC2 formed in the memory cell region 1B. Note that, in the same manner as in FIGS. 3 and 4 described above, in FIGS. 72 and 73 also, the illustration of the insulating films IL2 and IL3 shown in FIGS. 1 and 2 described above is omitted. In Embodiment 2, the structures of the lower-breakdown-voltage MIS region 1C and the higher-breakdown-voltage MIS region 1D are the same as in Embodiment 1 described above (FIGS. 2, 5, and 6) so that the illustration and description thereof is omitted herein.

The following will describe the points in which the semiconductor device in Embodiment 2 is different from the semiconductor device in Embodiment 1 described above.

In Embodiment 2, the width W1a of the sidewall spacer SW1a is set equal to the width W1b of the sidewall spacer SW1b (W1a=W1b), and the width W2a of the sidewall spacer SW2a is set smaller than the width W2b of the sidewall spacer SW2b (W2a<W2b). Reflecting W1a=W1b and W2a<W2b, in Embodiment 2, the dimension L1a of the n⁻-type semiconductor region E1a is substantially equal to the dimension L1b of the n⁻-type semiconductor region E1b (L1a=L1b) and the dimension L2a of the n⁻-type semiconductor region E2a is smaller than the dimension L2b of the n⁻-type semiconductor region E2b (L2a<L2b).

Specifically, in Embodiment 2, the respective widths W1a, W1b, and W2b of the sidewall spacers SW1a, SW1b, and SW2b for the memory cells MC1 and MC2 are set equal to the respective widths W3b and W4b of the sidewall spacers SW3b and SW4b for the higher breakdown-voltage MISFET (W1a=W1b=W2b=W3b=W4b). Also, the width W2a of the sidewall spacer SW2a for the memory cell MC1 is set equal to the respective widths W3a and W4a of the sidewall spacers SW3a and SW4a for the lower-breakdown-voltage MISFET (W2a=W3a=W4a). Embodiment 2 is common to Embodiment 1 described above in that the respective widths W3a and W4a of the sidewall spacers SW3a and SW4a for the lower-breakdown-voltage MISFET are smaller than the respective widths W3b and W4b of the sidewall spacers SW3b and SW4b for the higher-breakdown-voltage MISFET. Accordingly, in Embodiment 2, the width W2a of the sidewall spacer SW2a for the memory cell MC1 can be set smaller than the respective widths W1a, W1b, and W2b of the sidewall spacers SW1a, SW1b, and SW2b for the memory cells MC1 and MC2 (W2a<W1a=W1b=W2b). Reflecting W2a<W1a=W1b=W2b, the dimension L2a of the n⁻-type semiconductor region E2a is smaller than the respective dimensions L1a, L1b, and L2b of the n⁻-type semiconductor regions E1a, E1b, and E2b (L2a<L1a=L1b=L2b).

Also, in Embodiment 2, since W2a<W2b is satisfied, the distance from the side surface of the sidewall spacer SW2a to the control gate electrode CG1 (side surface thereof) in the gate length direction of the control gate electrode CG1 is smaller than the distance from the side surface of the sidewall spacer SW2b to the control gate electrode CG2 (side surface thereof) in the gate length direction of the control gate electrode CG2. Also, since the relationship given by W1a=W1b is established, the distance from the side surface of the sidewall spacer SW1a to the memory gate electrode MG1 (side surface thereof) in the gate length direction of the memory gate electrode MG1 is substantially equal to the distance from the side surface SW1b to the memory gate electrode MG2 (side surface thereof) in the gate length direction of the memory gate electrode MG2. The respective side surfaces of the sidewall spacers SW1a and SW1b correspond to the respective side surfaces of the sidewall spacers SW1a and SW1b opposite to the side surfaces thereof adjacent to the memory gate electrodes (MG1 and MG2). The respective side surfaces of the sidewall spacers SW2an and SW2b correspond to the respective side surfaces of the sidewall spacers SW2an and SW2b opposite to the side surfaces thereof adjacent to the control gate electrodes (CG1 and CG2).

Next, a manufacturing process of the semiconductor device in Embodiment 2 will be described with reference to FIGS. 74 to 79.

After the structure shown in each of FIGS. 31 and 32 described above is obtained by performing the same process steps as in Embodiment 1 described above, in Embodiment 2 also, the sidewall spacers SW are formed over the respective side surfaces of the multi-layer body LM1 and the memory gate electrode MG1, the respective side surfaces of the multi-layer body LM2 and the memory gate electrode MG2, the both side surfaces of the multi-layer body LM3, and the both side surfaces of the multi-layer body LM4.

Figure 74:
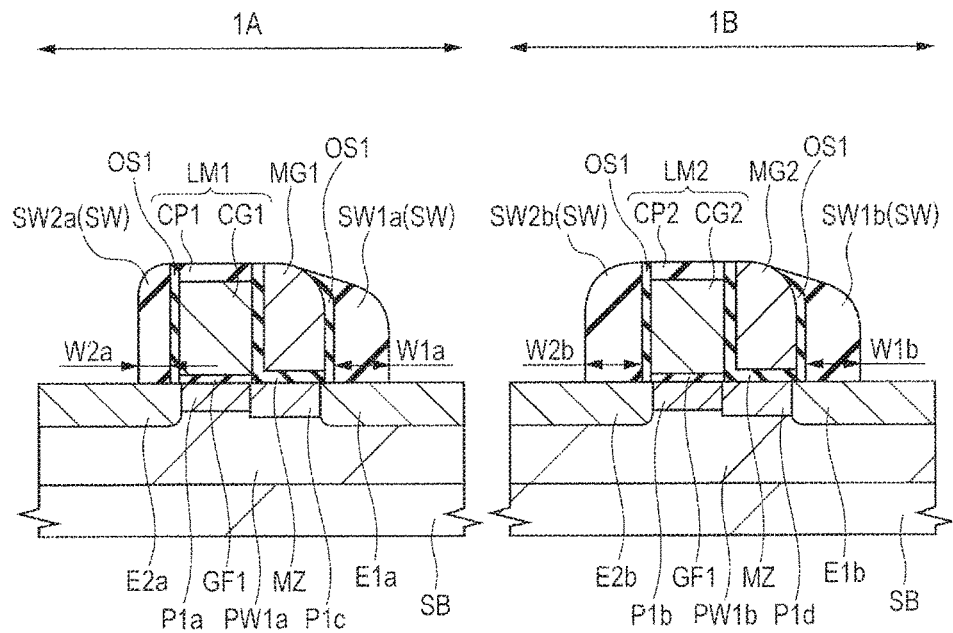
FIG. 74 is a main-portion cross-sectional view of the semiconductor device in the other embodiment during the manufacturing process thereof.
Figure 75:
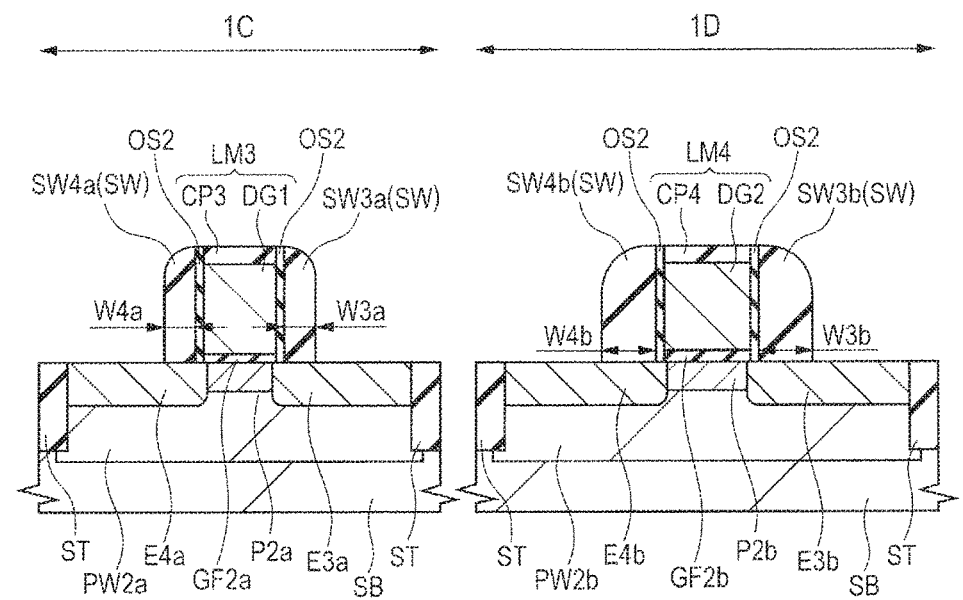
FIG. 75 is a main-portion cross-sectional view of the same semiconductor device during the manufacturing process thereof, which is similar to FIG. 74.

FIGS. 74 and 75 show the state where, in Embodiment 2, the sidewall spacers SW are formed and correspond to FIGS. 33 and 34 described above.

FIGS. 74 and 75 (Embodiment 2) are different from FIGS. 33 and 34 described above (Embodiment 1 described above) in the widths of the sidewall spacers SW. That is, in Embodiment 2, as shown in FIGS. 74 and 75, the respective widths W2$a$, W3$a$, and W4$a$ of the sidewall spacers SW2$a$, SW3$a$, and SW4$a$ are smaller than the respective widths W1$a$, W1$b$, W2$b$, W3$b$, and W4$b$ of the sidewall spacers SW1$a$, SW1$b$, SW2$b$, SW3$b$, and SW4$b$. Note that the respective widths W2$a$, W3$a$, and W4$a$ of the sidewall spacers SW2$a$, SW3$a$, and SW4$a$ are substantially equal to each other. Also, the respective widths W1$a$, W1$b$, W2$b$, W3$b$, and W4$b$ of the sidewall spacers SW1$a$, SW2$b$, SW2$b$, SW3$b$, and SW4$b$ are substantially equal to each other. That is, W2$a$=W3$a$=W4$a$<W1$a$=W1$b$=W2$b$=W3$b$=W4$b$ is satisfied.

The following will describe an example of the steps of forming the sidewall spacers SW with reference to FIGS. 76 to 79.

Figure 76:
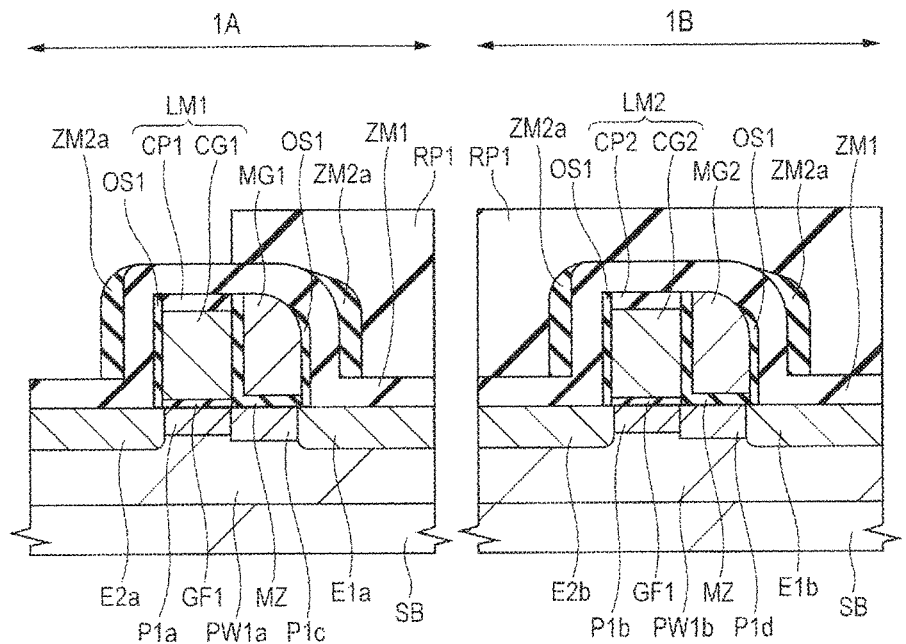
FIG. 76 is a main-portion cross-sectional view of the semiconductor device in the other embodiment during the manufacturing process thereof.
Figure 77:
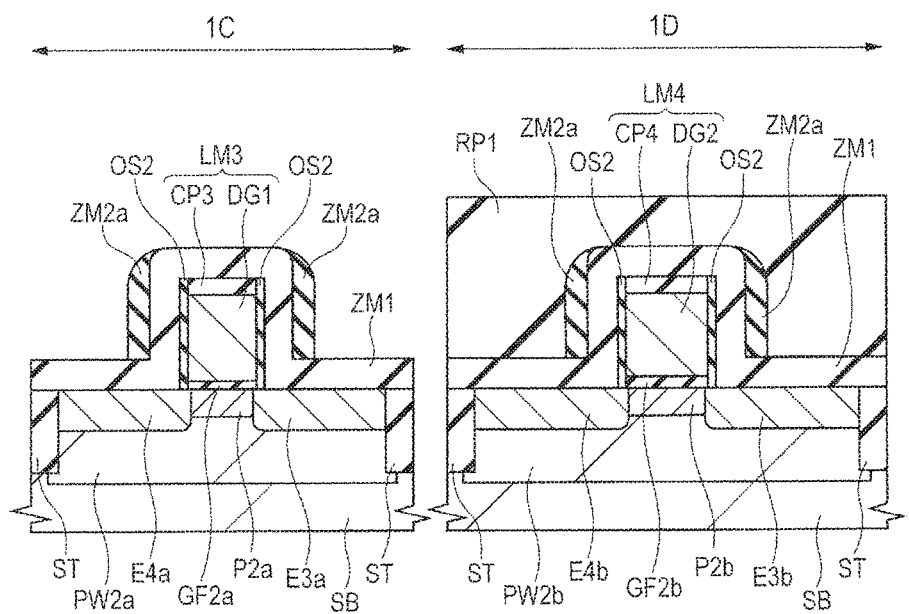
FIG. 77 is a main-portion cross-sectional view of the semiconductor device during the manufacturing process thereof, which is similar to FIG. 76.

After the structure shown in FIGS. 37 and 38 described above is obtained by performing the same process steps as in Embodiment 1 described above, in Embodiment 2 also, the photoresist pattern RP1 is formed using a photolithographic technique, as shown in FIGS. 76 and 77. However, the region where the photoresist pattern RP1 is formed in Embodiment 2 is different from that in Embodiment 1 described above. That is, in Embodiment 2, the photoresist pattern RP1 covers the source- and drain-side side-wall insulating films ZM2$a$ in the memory cell region 1B, covers the source-side side-wall insulating film ZM2$a$ in the memory cell region 1A, and covers the source- and drain-side side-wall insulating films ZM2$a$ in the higher-breakdown-voltage MIS region 1D. In Embodiment 2, the source-side side-wall insulating film ZM2$a$ in the memory cell region 1A and the source- and drain-side side-wall insulating films ZM2$a$ in the lower-breakdown-voltage MIS region 1C are uncovered with the photoresist pattern RP1 and exposed.

Figure 78:
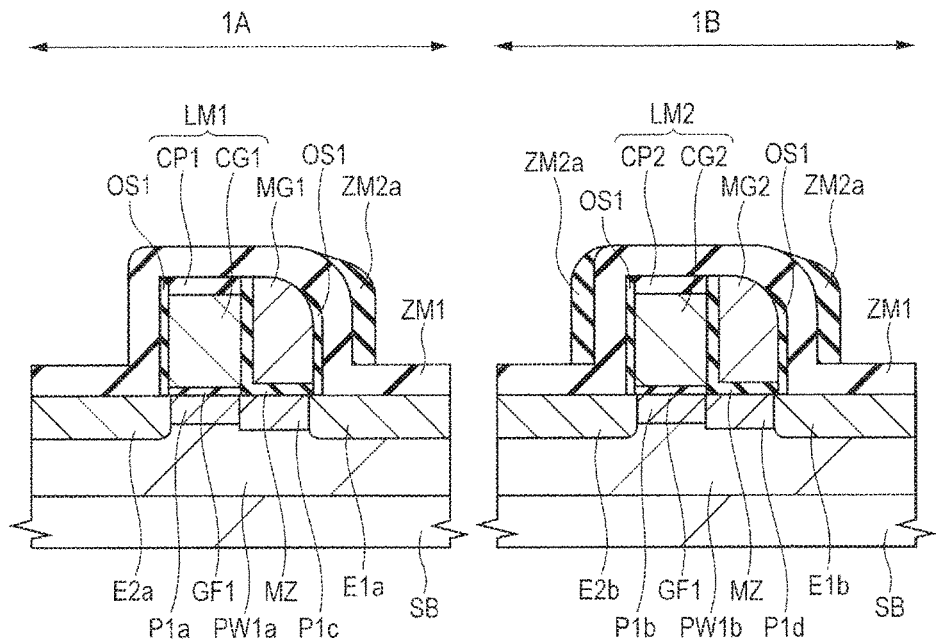
FIG. 78 is a main-portion cross-sectional view of the semiconductor device during the manufacturing process thereof, which is subsequent to FIG. 76.
Figure 79:
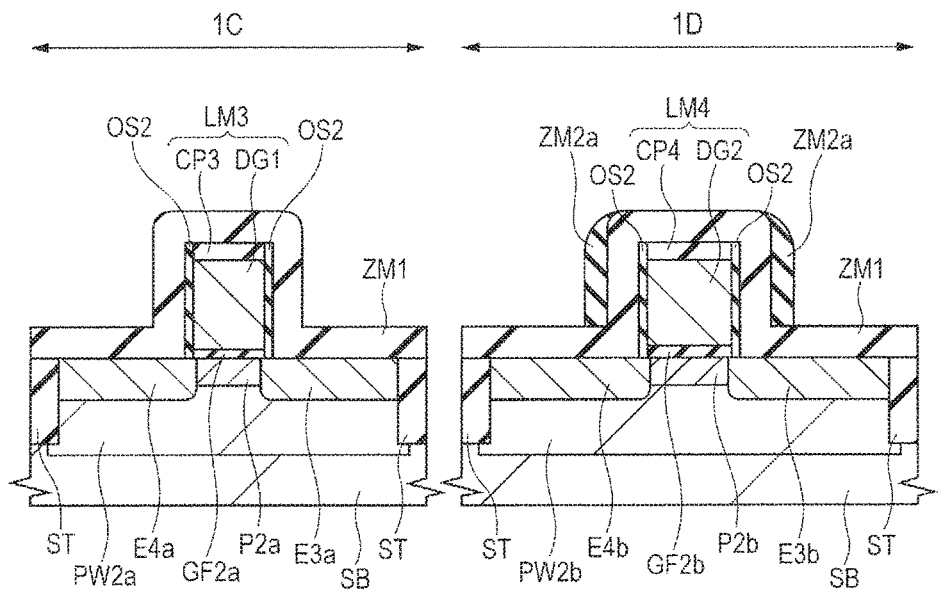
FIG. 79 is a main-portion cross-sectional view of the semiconductor device during the manufacturing process thereof, which is similar to FIG. 78.

The following process steps in Embodiment 2 are basically the same as in Embodiment 1 described above. That is, the side-wall insulating films ZM2$a$ uncovered with the photoresist pattern RP1 and exposed are removed by etching, and then the photoresist pattern RP1 is removed. FIGS. 78 and 79 show this process stage and correspond to FIGS. 41 and 42 described above. As a result, as shown in FIGS. 78 and 79, the drain-side side-wall insulating film ZM2$a$ in the memory cell region 1A and the source- and drain-side side-wall insulating films ZM2$a$ in the lower-breakdown-voltage MIS region 1C are removed. On the other hand, the source-side side-wall insulating film ZM2$a$ in the memory cell region 1A, the source- and drain-side side-wall insulating films ZM2$a$ in the memory cell region 1B, and the source- and drain-side side-wall insulating films ZM2$a$ in the higher-breakdown-voltage MIS region 1D, which are covered with the photoresist pattern RP1, are not removed and remain.

Then, in the same manner as in Embodiment 1 described above, in Embodiment 2 also, the step of etching back the insulating film ZM1 is performed to allow the sidewall spacers SW to be formed. The respective thicknesses of the sidewall spacers SW satisfy the relationship shown in FIGS. 74 and 75 described above, i.e., the relationship given by W2$a$=W3$a$=W4$a$<W1$a$=W1$b$=W2$b$=W3$b$=W4$b$. The process steps after the formation of the sidewall spacers SW in Embodiment 2 are the same as in Embodiment 1 described above so that a repeated description thereof is omitted herein.

In the same manner as in Embodiment 1 described above, in Embodiment 2 also, the threshold voltage Vth1 of the memory transistor of the memory cell MC1 in the neutral state is different from the threshold voltage Vth2 of the memory transistor of the memory cell MC2 in the neutral state. Specifically, the threshold voltage Vth2 is lower than the threshold voltage Vth1 (Vth1>Vth2).

To establish the relationship given by Vth1>Vth2, the effective p-type impurity concentration in the channel formation region CM2 of the memory cell MC2 needs to be set lower than the effective p-type impurity concentration in the channel formation region CM1 of the memory cell MC1, which is the same in both Embodiment 1 described above and Embodiment 2.

However, in Embodiment 2, the width W1$a$ of the sidewall spacer SW1$a$ in the memory cell MC1 is equal to the width W1$b$ of the sidewall spacer SW1$b$ in the memory cell MC2 (W1$a$=W1$b$). Accordingly, in Embodiment 2, such a method (method which adjusts the widths W1$a$ and W1$b$ of the sidewall spacers SW1) as used in Embodiment 1 described above cannot provide a difference between the respective impurity concentrations in the channel formation regions CM1 and CM2 of the memory cells MC1 and MC2. As a result, in Embodiment 2, it is necessary to perform channel doping ion implantation for the memory transistors such that the effective p-type impurity concentration in the channel formation region CM2 of the memory cell MC2 is lower than the effective p-type impurity concentration in the channel formation region CM1 of the memory cell MC1.

Accordingly, in Embodiment 2, a method for providing a difference between the respective threshold voltages of the memory transistors of the memory cells MC1 and MC2 in the neutral state is the same as in the case of the foregoing studied example (FIGS. 69 and 70).

That is, in the case of Embodiment 2, in the step shown in FIG. 17 described above, the channel doping ion implantation for the memory cell region 1A (ion implantation for forming the p-type semiconductor region P1$c$) and the channel doping ion implantation for the memory cell region 1B (ion implantation for forming the p-type semiconductor region P1$d$) are performed by different steps. In addition, the dose of the n-type impurity in the channel doping ion implantation for the memory cell region 1B (ion implantation for forming the p-type semiconductor region P1$d$) is set higher than the dose of the n-type impurity in the channel doping ion implantation for the memory cell region 1A (ion implantation for forming the p-type semiconductor region P1$c$). As a result, the effective p-type impurity concentration in the p-type semiconductor region P1$d$ of the memory cell region 1B is lower than the effective p-type impurity concentration in the p-type semiconductor region P1$c$ of the memory cell region 1A. This allows the effective p-type impurity in the channel formation region CM2 in FIG. 73 to be lower than the effective impurity concentration in the channel formation region CM1 in FIG. 72. Therefore, the threshold voltage Vth2 of the memory transistor of the memory cell MC2 in the neutral state in FIG. 73 can be set lower than the threshold voltage Vth1 of the memory transistor of the memory cell MC1 in the neutral state in FIG. 72 (Vth1>Vth2).

However, as described in the foregoing studied example, setting the dose in the channel doping ion implantation for forming the p-type semiconductor region P1$d$ higher than the dose in the channel doping ion implantation for forming the p-type semiconductor region P1c functions also to reduce the effective p-type impurity concentration in the channel formation region CC2 of the control transistor of the memory cell MC2. As a result, unless some appropriate measures are taken, the threshold voltage of the control transistor of the memory cell MC2 becomes lower than the threshold voltage of the control transistor of the memory cell MC1 to cause the foregoing second problem, as in the case of the foregoing studied example.

Accordingly, in Embodiment 2, the width W1a of the sidewall spacer SW1a of the memory cell MC1 is equal to the width W1b of the sidewall spacer SW1b of the memory cell MC2 (W1a=W1b), but the width W2a of the sidewall spacer SW2a of the memory cell MC1 is set smaller than the width W2b of the sidewall spacer SW2b of the memory cell MC2 (W2a<W2b).

In Embodiment 2, by adjusting the widths (W2a and W2b) of the sidewall spacers SW2, the threshold voltages of the control transistors of the memory cells (MC1 and MC2) are controlled. A description will be given of the reason that such control is possible with reference to the graph of FIG. 80.

FIG. 80 is a graph showing the correlation between the width of the drain-side sidewall spacer SW2 and the threshold voltage of the control transistor. FIG. 80 shows the result of selecting among three conditions, i.e., "Ion Implantation Condition A", "Ion Implantation Condition B", and "Ion Implantation Condition C" as an ion implantation condition for forming the $n^+$-type semiconductor region H2 and performing simulation under each of the ion implantation conditions. Note that the dose of the n-type impurity is highest under the "Ion Implantation Condition C" and lowest under the "Ion Implantation Condition A".

As can be seen also from the graph of FIG. 80, as the width of the sidewall spacer SW2 is smaller, the threshold voltage of the control transistor is lower and, as the dose of the n-type impurity in the ion implantation for forming the $n^+$-type semiconductor region H2 is higher, the threshold voltage of the control transistor is lower. This indicates that the effective p-type impurity concentration in each of the channel formation regions (CC1 and CC2) of the control transistors is affected by the n-type impurity implanted by the ion implantation for forming the $n^+$-type semiconductor region H2, and the influence received by the effective p-type impurity concentration is larger as the width of the sidewall spacer SW2 is smaller and as the dose of the n-type impurity in the ion implantation for forming the $n^+$-type semiconductor region H2 is higher. This is because the n-type impurity implanted in the ion implantation for forming the $n^+$-type semiconductor region H2 is diffused also in a lateral direction by activation anneal or the like to be more or less introduced into each of the channel formation regions (CC1 and CC2) of the control transistors, and the amount of the introduced n-type impurity is larger as the width of the sidewall spacer SW2 is smaller and as the dose in the ion implantation for forming the $n^+$-type semiconductor region H2 is higher.

That is, when the width of the drain-side sidewall spacer SW2 is reduced, the space (distance) between the $n^+$-type semiconductor region H2 and the channel formation region of the memory transistor is reduced. As a result, the n-type impurity implanted for the $n^+$-type semiconductor region H2 is likely to be introduced also into the channel formation region of the memory transistor so that the effective p-type impurity concentration in the channel formation region of the memory transistor is reduced. Thus, reducing the width of the drain-side sidewall spacer SW2 functions to reduce the effective p-type impurity concentration in the channel formation region of the control transistor and therefore functions to reduce the threshold voltage of the control transistor.

In Embodiment 2, the width W2a of the sidewall spacer SW2a of the memory cell MC1 is set smaller than the width W2b of the sidewall spacer SW2b of the memory cell MC2 (W2a<W2b). As a result, the space (space in the gate length direction of the control gate electrode CG1) between the control gate electrode CG1 and the $n^+$-type semiconductor region H2a in the memory cell MC1 is smaller than the space (space in the gate length direction of the control gate electrode MG2) between the control gate electrode MG2 and the $n^+$-type semiconductor region H2b in the memory cell MC2. That is, the space between the $n^+$-type semiconductor region H2a and the channel formation region CC1 of the control transistor in the memory cell MC1 can be reduced be smaller than the space between the $n^+$-type semiconductor region H2b and the channel formation region CC2 of the control transistor in the memory cell MC2. This allows the amount of the n-type impurity implanted for the $n^+$-type semiconductor region H2a and introduced into the channel formation region CC1 in the memory cell MC1 to be larger than the amount of the n-type impurity implanted for the $n^+$-type semiconductor region H2b and introduced into the channel formation region CC2 in the memory cell MC2. This can accordingly reduce the threshold voltage of the control transistor of the memory cell MC1.

In Embodiment 2, if the width W2a of the sidewall spacer SW2a in the memory cell MC1 is set equal to the width W2b of the sidewall spacer SW2b in the memory cell MC2 (W2a=W2b), in the same manner as in the case of the foregoing studied example, the threshold voltage of the control transistor of the memory cell MC2 is undesirably lower than the threshold voltage of the control transistor of the memory cell MC1. However, in Embodiment 2, the width W2a of the sidewall spacer SW2a of the memory cell MC1 is set smaller than the width W2b of the sidewall spacer SW2b of the memory cell MC2 (W2a<W2b). This can accordingly reduce the threshold voltage of the control transistor of the memory cell MC1. Therefore, it is possible to reduce the difference between the threshold voltage of the control transistor of the memory cell MC2 and the threshold voltage of the control transistor of the memory cell MC1. Preferably, the threshold voltage of the control transistor of the memory cell MC2 is set substantially equal to the threshold voltage of the control transistor of the memory cell MC1.

That is, in Embodiment 2, to establish the relationship given by Vth1>Vth2 between the threshold voltages of the respective memory transistors of the memory cells MC1 and MC2, the dose in the channel doping ion implantation for forming the foregoing p-type semiconductor region P1d needs to be set higher than the dose in the channel doping ion implantation for forming the foregoing p-type semiconductor region P1c. This undesirably functions also to reduce the effective p-type impurity concentration in the channel formation region CC2 of the control transistor of the memory cell MC2. However, setting the width W2a of the sidewall spacer SW2a in the memory cell MC1 smaller than the width W2b of the sidewall spacer SW2b in the memory cell MC2 (W2a<W2b) functions to reduce the effective p-type impurity concentration in the channel formation region CC1 of the control transistor of the memory cell MC1. This allows the effective p-type impurity concentration in the channel formation region CC1 of the control transistor of the memory cell MC1 to be substantially equal to the effective p-type impurity concentration in the channel formation region CC2 of the control transistor of the memory cell MC2. Therefore, it is possible to allow the threshold voltage of the control transistor of the memory cell MC2 to be substantially equal to the threshold voltage of the control transistor of the memory cell MC1.

For example, a case is assumed where, in the structure of the foregoing studied example, the threshold voltage of the control transistor of the memory cell MC102 is lower than the threshold voltage of the control transistor of the memory cell MC101 by about 0.05 V. FIG. 80 indicates that, when the "Ion Implantation Condition B" is to be used as the ion implantation condition for the n$^+$-type semiconductor regions H2a and H2b, to reduce the threshold voltage of the control transistor of the memory cell MC1 by about 0.05 V, it is sufficient to set the width W2a of the sidewall spacer SW2a smaller by about 20 nm than the width W2b of the sidewall spacer SW2b. There is also a case where the width W2a of the sidewall spacer SW2a is determined by limitations on the lower-breakdown-voltage MISFET and the width W2b of the sidewall spacer SW2b is determined by limitations on the higher-breakdown-voltage MISFET. In such a case, by appropriately selecting the ion implantation condition for the n$^+$-type semiconductor regions H2a and H2b on the basis of the difference between the width W2a of the sidewall spacer SW2a and the width W2b of the sidewall spacer SW2b, it is possible to reduce the threshold voltage of the control transistor of the memory cell MC1 by about 0.05 V and allow the respective control transistors of the memory cells MC1 and MC2 to have equal threshold voltages.

The second problem to be solved described in the foregoing studied example can be solved by both of Embodiment 1 described above and Embodiment 2. However, the first problem to be solved described in the foregoing studied example can be solved by Embodiment 1 described above, but cannot be solved by Embodiment 2. Therefore, Embodiment 1 described above is advantageous over Embodiment 2 in terms of reducing the number of manufacturing process steps and reducing the manufacturing cost of the semiconductor device.

In the case of Embodiment 1 described above, on the basis of the relationship given by W1a>W1b, the two-dimensional size of the memory cell MC2 can be reduced to be smaller than the two-dimensional size of the memory cell MC1. On the other hand, in the case of Embodiment 2, on the basis of the relationship given by W2a<W2b, the two-dimensional size of the memory cell MC1 can be reduced to be smaller than the two-dimensional size of the memory cell MC2. Therefore, when the total number of the memory cells MC2 formed in the semiconductor substrate SB is larger than the total number of the memory cells MC1 formed in the semiconductor substrate SB, Embodiment 1 described above is advantageous over Embodiment 2 in terms of reducing the size (area) of the semiconductor device. On the other hand, when the total number of the memory cells MC1 is larger than the total number of the memory cells MC2, Embodiment 2 is advantageous over Embodiment 1 described above in terms of reducing the size (area) of the semiconductor device.

In Embodiment 2, to satisfy W2a<W2b, the width W2b of the sidewall spacer SW2b for the memory cell MC2 is set equal to the width W4b of the sidewall spacer SW4b (W2b=W4b), and the width W2a of the sidewall spacer SW2a for the memory cell MC1 is set equal to the width W4a of the sidewall spacer SW4a (W2a=W4a). That is, the width W2b of the sidewall spacer SW2b for the memory cell MC2 is set in accordance with the width W4b of the sidewall spacer SW4b, and the width W2a of the sidewall spacer SW2a for the memory cell MC1 is set in accordance with the width W4a of the sidewall spacer SW4a. In other words, by using the widths W3a and W4a of the sidewall spacers SW3a and SW4a for the lower-breakdown-voltage MISFET which are smaller than the widths W3b and W4b of the sidewall spacers SW3b and SW4b for the higher-breakdown-voltage MISFET, the width W2a of the sidewall spacer SW2a for the memory cell MC2 is reduced to be smaller than the width W2b of the sidewall spacer SW2b for the memory cell MC1. Since it is possible to allow the width W2a of the sidewall spacer SW2a for the memory cell MC1 to be smaller than the width W2b of the sidewall spacer SW2b for the memory cell MC2 without adding an extra process step, the manufacturing cost of the semiconductor device can be reduced (suppressed).

While the invention achieved by the present inventors has been specifically described heretofore on the basis of the embodiments thereof, the present invention is not limited to the foregoing embodiments. It will be appreciated that various changes and modifications can be made in the invention within the scope not departing from the gist thereof.

The following is provided as additional description of parts of the content of the description of the foregoing embodiments.

(Note 1)

Provided is a method of manufacturing a semiconductor device including a first memory cell in a nonvolatile memory which is formed in a first region of a semiconductor substrate and a second memory cell in the nonvolatile memory which is formed in a second region of the semiconductor substrate, the first memory cell including first and second semiconductor regions each having a first conductivity type and formed in the semiconductor substrate, first and second gate electrodes formed over the semiconductor substrate located between the first and second semiconductor regions to be adjacent to each other, a first gate insulating film formed between the first gate electrode and the semiconductor substrate, and a second gate insulating film formed between the second gate electrode and the semiconductor substrate and having an internal charge storage portion, the second memory cell including third and fourth semiconductor regions each having the first conductivity type and formed in the semiconductor substrate, third and fourth gate electrodes formed over the semiconductor substrate located between the third and fourth semiconductor regions to be adjacent to each other, a third gate insulating film formed between the third gate electrode and the semiconductor substrate, and a fourth gate insulating film formed between the fourth gate electrode and the semiconductor substrate and having an internal charge storage portion, the first semiconductor region having a first lower-concentration semiconductor region and a first higher-concentration semiconductor region having an impurity concentration higher than that of the first lower-concentration semiconductor region, the second semiconductor region having a second lower-concentration semiconductor region and a second higher-concentration semiconductor region having an impurity concentration higher than that of the second lower-concentration semiconductor region, the third semiconductor region having a third lower-concentration semiconductor region and a third higher-concentration semiconductor region having an impurity concentration higher than that of the third lower-concentration semiconductor region, and the fourth semiconductor region having a fourth lower-concentration semiconductor region and a fourth higher-concentration semiconductor region having an impurity concentration higher than that of the fourth lower-concentration semiconductor region, the method including the steps of:

(a) providing the semiconductor substrate;

(b) forming the first gate electrode over the semiconductor substrate located in the first region via the first gate insulating film and forming the third gate electrode over the semiconductor substrate located in the second region via the third gate insulating film;

(c) after the step (b), forming the second gate electrode over the semiconductor substrate located in the first region via the second gate insulating film and forming the fourth gate electrode over the semiconductor substrate located in the second region via the fourth gate insulating film;

(d) after the step (c), forming the first and second lower-concentration semiconductor regions in the semiconductor substrate located in the first region using an ion implantation method and forming the third and fourth lower-concentration semiconductor regions in the semiconductor substrate located in the second region using the ion implantation method;

(e) after the step (d), forming a first sidewall spacer on a side of the first gate electrode opposite to a side thereof where the first gate electrode is adjacent to the second gate electrode, forming a second sidewall spacer on a side of the second gate electrode opposite to a side thereof where the second gate electrode is adjacent to the first gate electrode, forming a third sidewall spacer on a side of the third gate electrode opposite to a side thereof where the third gate electrode is adjacent to the fourth gate electrode, and forming a fourth sidewall spacer on a side of the fourth gate electrode opposite to a side thereof where the fourth gate electrode is adjacent to the third gate electrode; and (f) after the step (e), forming the first and second higher-concentration semiconductor regions in the semiconductor substrate located in the first region using an ion implantation method and forming the third and fourth higher-concentration semiconductor regions in the semiconductor substrate located in the second region using the ion implantation method, wherein a first width of the second sidewall spacer in a gate length direction of the second gate electrode is equal to a second width of the fourth sidewall spacer in a gate length direction of the fourth gate electrode, wherein a third width of the first sidewall spacer in a gate length direction of the first gate electrode is smaller than a fourth width of the third sidewall spacer in a gate length direction of the third gate electrode, and wherein a first threshold voltage of a first memory transistor which has the second gate electrode and the second gate insulating film and is in a neutral state is different from a second threshold voltage of a second memory transistor which has the fourth gate electrode and the fourth gate insulating film and is in the neutral state.

(Note 2)

In the method of manufacturing the semiconductor device according to Note 1, wherein the second threshold voltage is lower than the first threshold voltage.

(Note 3)

The method of manufacturing the semiconductor device according to Note 2, further including, after the step (a) and before the step (b), the step of:

(a1) performing first channel doping ion implantation for the semiconductor substrate located in the first region and for the semiconductor substrate located in the second region, the method further including, after the step (b) and before the step (c), the step of:

(b1) performing second channel doping ion implantation for the semiconductor substrate located in the first region and performing third channel doping ion implantation for the semiconductor substrate located in the second region, wherein a dose in the second channel doping ion implantation is different from a dose in the third channel doping ion implantation.

(Note 4)

In the method of manufacturing the semiconductor device according to Note 3, wherein a third threshold voltage of a first control transistor including the first gate electrode and the first gate insulating film is equal to a fourth threshold voltage of a second control transistor including the third gate electrode and the third gate insulating film.

What is claimed is:

1. A semiconductor device including first and second memory cells in a nonvolatile memory, comprising:

a semiconductor substrate;

first and second semiconductor regions for the first memory cell each having a first conductivity type and formed in the semiconductor substrate;

a first gate electrode for the first memory cell formed over the semiconductor substrate located between the first and second semiconductor regions via a first gate insulating film;

a second gate electrode for the first memory cell formed over the semiconductor substrate located between the first and second semiconductor regions via a second gate insulating film;

a first sidewall spacer formed on a side of the first gate electrode opposite to a side thereof where the first gate electrode is adjacent to the second gate electrode;

a second sidewall spacer formed on a side of the second gate electrode opposite to a side thereof where the second gate electrode is adjacent to the first gate electrode;

third and fourth semiconductor regions for the second memory cell in the nonvolatile memory each having the first conductivity type and formed in the semiconductor substrate;

a third gate electrode for the second memory cell formed over the semiconductor substrate located between the third and fourth semiconductor regions via a third gate insulating film;

a fourth gate electrode for the second memory cell formed over the semiconductor substrate located between the third and fourth semiconductor regions via a fourth gate insulating film;

a third sidewall spacer formed on a side of the third gate electrode opposite to a side thereof where the third gate electrode is adjacent to the fourth gate electrode; and a fourth sidewall spacer formed on a side of the fourth gate electrode opposite to a side thereof where the fourth gate electrode is adjacent to the third gate electrode, wherein the first gate electrode is disposed closer to the first semiconductor region, while the second gate electrode is disposed closer to the second semiconductor region, wherein the third gate electrode is disposed closer to the third semiconductor region, while the fourth gate electrode is disposed closer to the fourth semiconductor region, wherein each of the second and fourth gate insulating films has a charge storage portion, wherein a second width of the fourth sidewall spacer in a gate length direction of the fourth gate electrode is smaller than a first width of the second sidewall spacer in a gate length direction of the second gate electrode, the gate length direction of the fourth gate electrode and the gate length direction of the second gate electrode being perpendicular to a direction in which the fourth gate electrode and the second gate electrode extend above the semiconductor substrate, wherein a first threshold voltage of a first memory transistor which has the second gate electrode and the second gate insulating film and is in a neutral state is different from a second threshold voltage of a second memory transistor which has the fourth gate electrode and the fourth gate insulating film and is in the neutral state, wherein the semiconductor device further comprises first and second MISFETs, wherein the first MISFET includes:
fifth and sixth semiconductor regions each formed in the semiconductor substrate for a source or drain region;
a fifth gate electrode formed over the semiconductor substrate located between the fifth and sixth semiconductor regions via a fifth gate insulating film;
a fifth sidewall spacer formed on a side of the fifth gate electrode where the fifth semiconductor region is formed; and
a sixth sidewall spacer formed on a side of the fifth gate electrode where the sixth semiconductor region is formed, wherein the second MISFET includes:
seventh and eighth semiconductor regions each formed in the semiconductor substrate for a source or drain region;
a sixth gate electrode formed over the semiconductor substrate located between the seventh and eighth semiconductor regions via a sixth gate insulating film;
a seventh sidewall spacer formed on a side of the sixth gate electrode where the seventh semiconductor region is formed; and
an eighth sidewall spacer formed on a side of the sixth gate electrode where the eighth semiconductor region is formed, wherein the sixth gate insulating film is thicker than the fifth gate insulating film, wherein a fifth width of the fifth sidewall spacer in a gate length direction of the fifth gate electrode is smaller than a sixth width of the seventh sidewall spacer in a gate length direction of the sixth gate electrode, wherein the first width is equal to the sixth width, and wherein the second width is equal to the fifth width.

2. The semiconductor device according to claim 1, wherein the second threshold voltage is lower than the first threshold voltage.

3. The semiconductor device according to claim 2, wherein the first semiconductor region has a first lower-concentration semiconductor region and a first higher-concentration semiconductor region having an impurity concentration higher than that of the first lower-concentration semiconductor region, wherein the second semiconductor region has a second lower-concentration semiconductor region and a second higher-concentration semiconductor region having an impurity concentration higher than that of the second lower-concentration semiconductor region, wherein the third semiconductor region has a third lower-concentration semiconductor region and a third higher-concentration semiconductor region having an impurity concentration higher than that of the third lower-concentration semiconductor region, wherein the fourth semiconductor region has a fourth lower-concentration semiconductor region and a fourth higher-concentration semiconductor region having an impurity concentration higher than that of the fourth lower-concentration semiconductor region, wherein the first lower-concentration semiconductor region is formed under the first sidewall spacer, wherein the second lower-concentration semiconductor region is formed under the second sidewall spacer, wherein the third lower-concentration semiconductor region is formed under the third sidewall spacer, and wherein the fourth lower-concentration semiconductor region is formed under the fourth sidewall spacer.

4. The semiconductor device according to claim 3, wherein a second dimension of the fourth lower-concentration semiconductor region in the gate length direction of the fourth gate electrode is smaller than a first dimension of the second lower-concentration semiconductor region in the gate length direction of the second gate electrode.

5. The semiconductor device according to claim 1, wherein the first and second gate electrodes are adjacent to each other via the second gate insulating film, and wherein the third and fourth gate electrodes are adjacent to each other via the fourth gate insulating film.

6. The semiconductor device according to claim 1, wherein a third width of the first sidewall spacer in a gate length direction of the first gate electrode is equal to a fourth width of the third sidewall spacer in a gate length direction of the third gate electrode.

7. The semiconductor device according to claim 6, wherein a third threshold voltage of a first control transistor including the first gate electrode and the first gate insulating film is equal to a fourth threshold voltage of a second control transistor including the third gate electrode and the third gate insulating film.

8. A semiconductor device including first and second memory cells in a nonvolatile memory, comprising:
a semiconductor substrate;
first and second semiconductor regions for the first memory cell each having a first conductivity type and formed in the semiconductor substrate;
a first gate electrode for the first memory cell formed over the semiconductor substrate located between the first and second semiconductor regions via a first gate insulating film;
a second gate electrode for the first memory cell formed over the semiconductor substrate located between the first and second semiconductor regions via a second gate insulating film;
a first sidewall spacer formed on a side of the first gate electrode opposite to a side thereof where the first gate electrode is adjacent to the second gate electrode;
a second sidewall spacer formed on a side of the second gate electrode opposite to a side thereof where the second gate electrode is adjacent to the first gate electrode;

third and fourth semiconductor regions for the second memory cell in the nonvolatile memory each having the first conductivity type and formed in the semiconductor substrate;
a third gate electrode for the second memory cell formed over the semiconductor substrate located between the third and fourth semiconductor regions via a third gate insulating film;
a fourth gate electrode for the second memory cell formed over the semiconductor substrate located between the third and fourth semiconductor regions via a fourth gate insulating film;
a third sidewall spacer formed on a side of the third gate electrode opposite to a side thereof where the third gate electrode is adjacent to the fourth gate electrode; and
a fourth sidewall spacer formed on a side of the fourth gate electrode opposite to a side thereof where the fourth gate electrode is adjacent to the third gate electrode,
wherein the first gate electrode is disposed closer to the first semiconductor region, while the second gate electrode is disposed closer to the second semiconductor region,
wherein the third gate electrode is disposed closer to the third semiconductor region, while the fourth gate electrode is disposed closer to the fourth semiconductor region,
wherein each of the second and fourth gate insulating films has a charge storage portion,
wherein a first width of the second sidewall spacer in a gate length direction of the second gate electrode is equal to a second width of the fourth sidewall spacer in a gate length direction of the fourth gate electrode,
wherein a first threshold voltage of a first memory transistor which has the second gate electrode and the second gate insulating film and is in a neutral state is different from a second threshold voltage of a second memory transistor which has the fourth gate electrode and the fourth gate insulating film and is in the neutral state, and
wherein a third width of the first sidewall spacer in a gate length direction of the first gate electrode is smaller than a fourth width of the third sidewall spacer in a gate length direction of the third gate electrode, the gate length direction of the first gate electrode and the gate length direction of the third gate electrode being perpendicular to a direction in which the first gate electrode and the third gate electrode extend above the semiconductor substrate,
wherein the semiconductor device further comprises first and second MISFETs,
wherein the first MISFET includes:
fifth and sixth semiconductor regions each formed in the semiconductor substrate for a source or drain region;
a fifth gate electrode formed over the semiconductor substrate located between the fifth and sixth semiconductor regions via a fifth gate insulating film;
a fifth sidewall spacer formed on a side of the fifth gate electrode where the fifth semiconductor region is formed; and
a sixth sidewall spacer formed on a side of the fifth gate electrode where the sixth semiconductor region is formed, wherein the second MISFET includes:
seventh and eighth semiconductor regions each formed in the semiconductor substrate for a source or drain region;
a sixth gate electrode formed over the semiconductor substrate located between the seventh and eighth semiconductor regions via a sixth gate insulating film;
a seventh sidewall spacer formed on a side of the sixth gate electrode where the seventh semiconductor region is formed; and
an eighth sidewall spacer formed on a side of the sixth gate electrode where the eighth semiconductor region is formed,
wherein the sixth gate insulating film is thicker than the fifth gate insulating film,
wherein a fifth width of the fifth sidewall spacer in a gate length direction of the fifth gate electrode is smaller than a sixth width of the seventh sidewall spacer in a gate length direction of the sixth gate electrode,
wherein the first width is equal to the sixth width, and
wherein the second width is equal to the fifth width.

9. The semiconductor device according to claim 8,
wherein the second threshold voltage is lower than the first threshold voltage.

10. The semiconductor device according to claim 9,
wherein the first semiconductor region has a first lower-concentration semiconductor region and a first higher-concentration semiconductor region having an impurity concentration higher than that of the first lower-concentration semiconductor region,
wherein the second semiconductor region has a second lower-concentration semiconductor region and a second higher-concentration semiconductor region having an impurity concentration higher than that of the second lower-concentration semiconductor region,
wherein the third semiconductor region has a third lower-concentration semiconductor region and a third higher-concentration semiconductor region having an impurity concentration higher than that of the third lower-concentration semiconductor region,
wherein the fourth semiconductor region has a fourth lower-concentration semiconductor region and a fourth higher-concentration semiconductor region having an impurity concentration higher than that of the fourth lower-concentration semiconductor region,
wherein the first lower-concentration semiconductor region is formed under the first sidewall spacer,
wherein the second lower-concentration semiconductor region is formed under the second sidewall spacer,
wherein the third lower-concentration semiconductor region is formed under the third sidewall spacer, and
wherein the fourth lower-concentration semiconductor region is formed under the fourth sidewall spacer.

11. The semiconductor device according to claim 10,
wherein a first dimension of the first lower-concentration semiconductor region in the gate length direction of the first gate electrode is smaller than a second dimension of the third lower-concentration semiconductor region in the gate length direction of the third gate electrode.

12. The semiconductor device according to claim 8,
wherein the first and second gate electrodes are adjacent to each other via the second gate insulating film, and
wherein the third and fourth gate electrodes are adjacent to each other via the fourth gate insulating film.

13. The semiconductor device according to claim 8,
wherein a third threshold voltage of a first control transistor including the first gate electrode and the first gate insulating film is equal to a fourth threshold voltage of a second control transistor including the third gate electrode and the third gate insulating film.

\* \* \* \* \*